United States Patent
Yamazaki et al.

(10) Patent No.: US 9,583,516 B2
(45) Date of Patent: Feb. 28, 2017

(54) DISPLAY DEVICE

(71) Applicant: Semiconductor Energy Laboratory Co., Ltd., Kanagawa-ken (JP)

(72) Inventors: Shunpei Yamazaki, Tokyo (JP); Hiroyuki Miyake, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 19 days.

(21) Appl. No.: 14/521,793

(22) Filed: Oct. 23, 2014

(65) Prior Publication Data

US 2015/0115259 A1 Apr. 30, 2015

(30) Foreign Application Priority Data

Oct. 25, 2013 (JP) ................................. 2013-222621
Feb. 28, 2014 (JP) ................................. 2014-038157

(51) Int. Cl.
*H01L 27/12* (2006.01)
*H01L 27/32* (2006.01)

(52) U.S. Cl.
CPC ...... *H01L 27/1255* (2013.01); *H01L 27/1225* (2013.01); *H01L 27/1248* (2013.01); *H01L 27/3265* (2013.01)

(58) Field of Classification Search
CPC .......................... H01L 27/1248; H01L 27/1225
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,100,954 | A | * 8/2000 | Kim ................ G02F 1/133345 257/410 |
| 6,294,274 | B1 | 9/2001 | Kawazoe et al. |
| 6,563,174 | B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Amar Movva
(74) *Attorney, Agent, or Firm* — Husch Blackwell LLP

(57) ABSTRACT

A display device having a high aperture ratio and including a capacitor that can increase capacitance is provided. A pair of electrodes of the capacitor is formed using a light-transmitting conductive film. One of the electrodes of the capacitor is formed using a metal oxide film, and the other of the electrodes of the capacitor is formed using a light-transmitting conductive film. With such a structure, light can be emitted to the capacitor side when an organic insulating film is provided over the capacitor and a pixel electrode of a light-emitting element is formed over the organic insulating film. Thus, the capacitor can transmit light and can overlap the light-emitting element. Consequently, the aperture ratio and capacitance can be increased.

10 Claims, 55 Drawing Sheets

(56) References Cited

U.S. PATENT DOCUMENTS

| | | | |
|---|---|---|---|
| 6,576,967 B1 * | 6/2003 | Schaeffer, III | H01L 29/518 257/411 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 * | 7/2007 | Lai | H01L 27/1225 257/59 |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038929 A1 | 2/2008 | Chang | |
| 2008/0050595 A1 | 2/2008 | Nakagawara et al. | |
| 2008/1003888 | 2/2008 | Takechi et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2014/0034954 A1 | 2/2014 | Yamazaki et al. | |
| 2015/0108474 A1 | 4/2015 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electronic Devices, Jul. 1, 1995, vol. 42, No. 7, pp. 1240-1246.

Prins.M et al., "A Ferroelectric Transparent Thin-Film Transistor",

(56) References Cited

OTHER PUBLICATIONS

Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of The 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layer", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

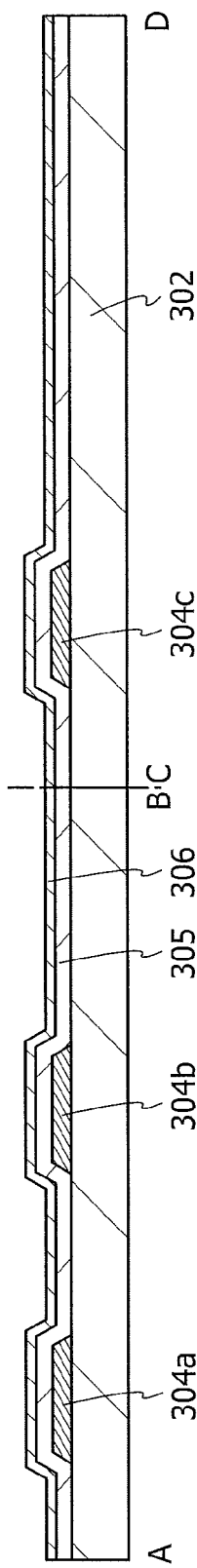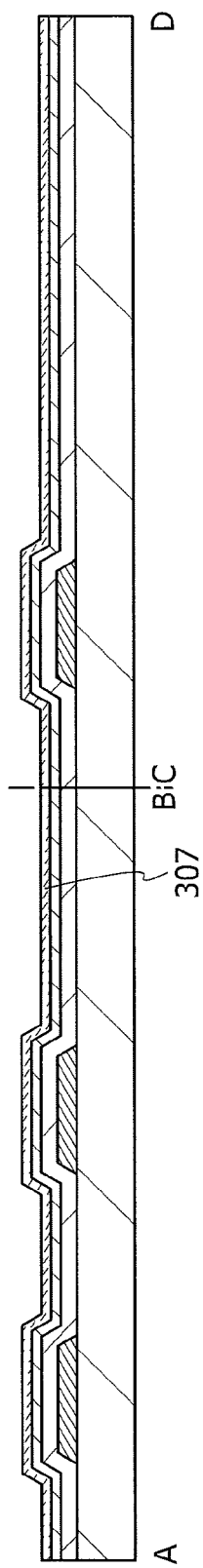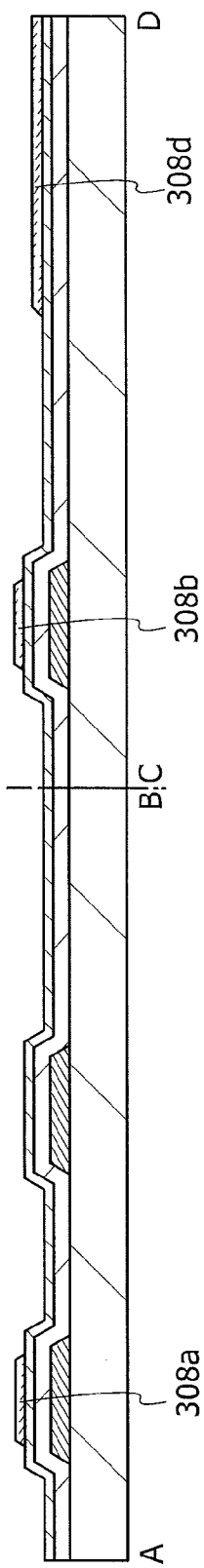

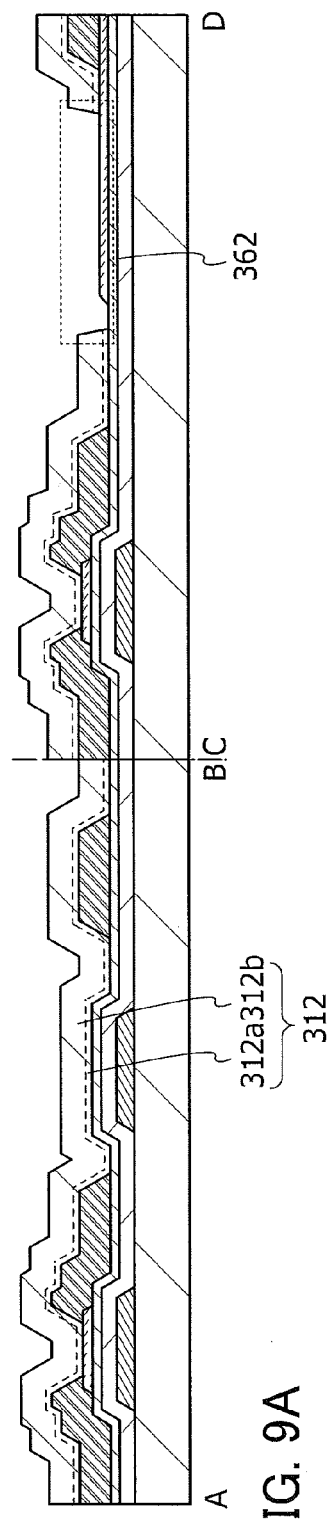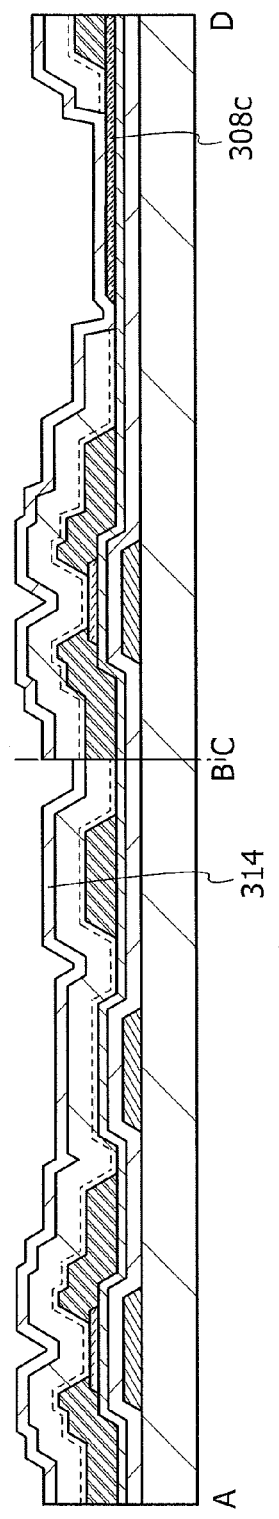
FIG. 9A
FIG. 9B

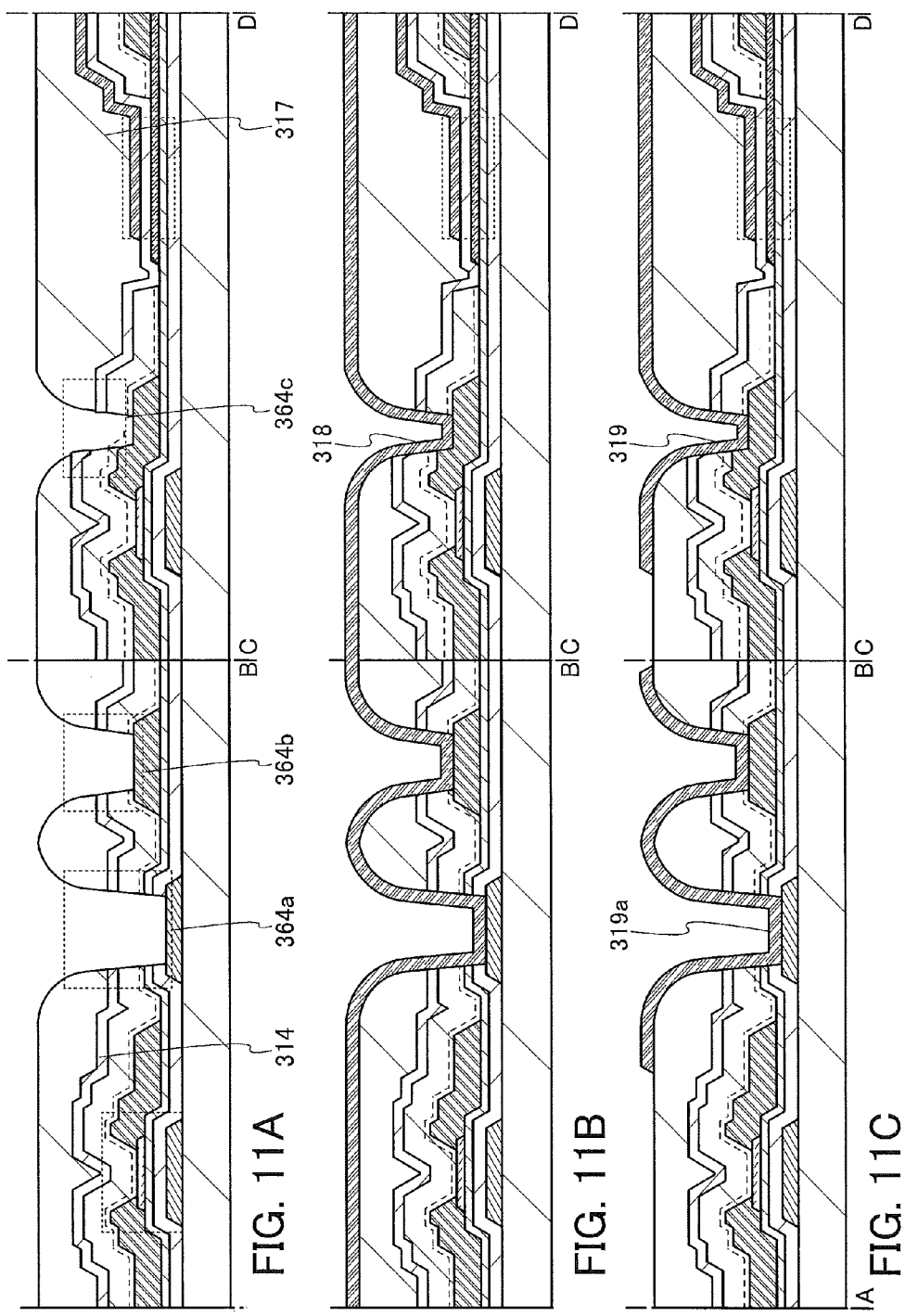

FIG. 20A
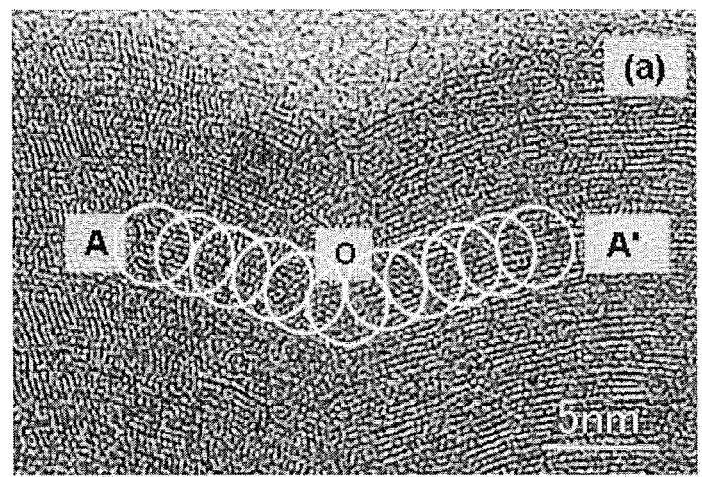
FIG. 20B
FIG. 20C
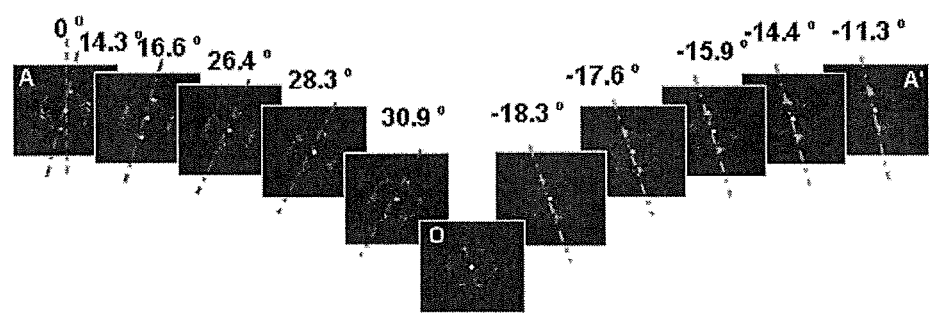

CAAC-OS nc-OS as-sputtered ... after heat treatment at 450°C

☐ proportion of non-CAAC   ☰ proportion of CAAC as-sputtered after heat treatment at 450°C Heated Substrate Heated Substrate InGaZnO$_4$ FIG. 54A
FIG. 54B
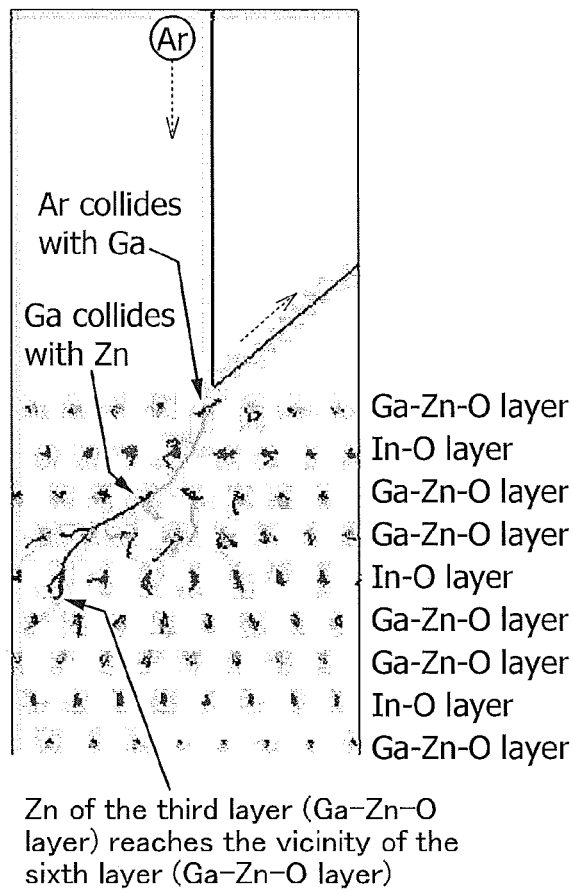
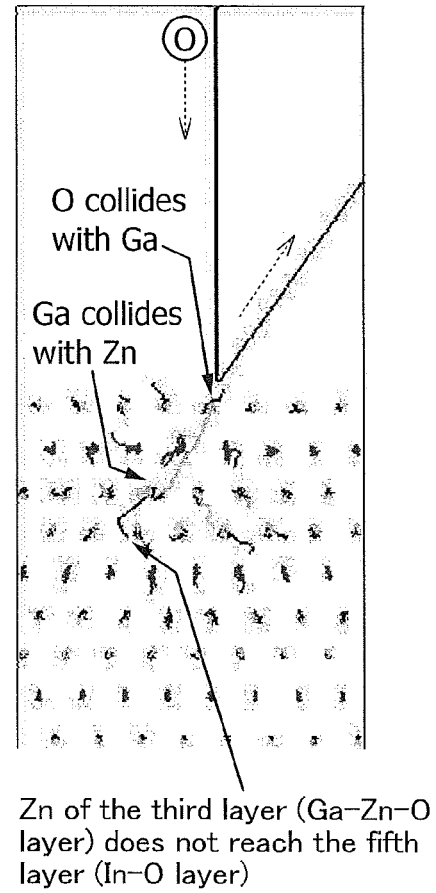

CAAC-OS film    1 nm target    1 nm

DISPLAY DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a storage device, a driving method thereof, or a manufacturing method thereof. Specifically, the present invention relates to a semiconductor device including an oxide semiconductor, a display device including an oxide semiconductor, or a driving method thereof.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Furthermore, transistors formed using such silicon semiconductors are used in integrated circuits (IC) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a technique is disclosed in which a transistor is formed using zinc oxide or an In—Ga—Zn-based oxide as an oxide semiconductor and the transistor is used as a switching element or the like of a pixel of a display device (see Patent Documents 1 and 2).

REFERENCE

Patent Document 1: Japanese Published Patent Application No. 2007-123861

Patent Document 2: Japanese Published Patent Application No. 2007-096055

SUMMARY OF THE INVENTION

To improve the quality of a display device, improvement in quality of display (display quality) and reduction in power consumption are effective.

A transistor including an oxide semiconductor film has problems of variations in electrical characteristics, typically, the threshold voltage due to changes over time or stress tests. In addition, when the transistor has normally-on characteristics, malfunctions occur at the time of operation, which causes various problems, for example, an increase in power consumption at the time of non-operation and a decrease in contrast of a display device. Thus, display quality cannot be improved.

It is effective to improve the aperture ratio in reducing power consumption. For that reason, it is effective to scale an element and increase the area of an opening. However, as the capacitance of a capacitor becomes lower, charge cannot be held sufficiently, so that display quality becomes lower. Thus, there are limitations to improvement in the aperture ratio by lowering capacitance.

According to one embodiment of the present invention, a display device with high display quality is provided. According to one embodiment of the present invention, a display device having a high aperture ratio and including a capacitor that can increase capacitance is provided. According to one embodiment of the present invention, a low-power display device is provided. According to one embodiment of the present invention, a display device including a transistor having excellent electrical characteristics is provided. According to one embodiment of the present invention, a novel display device is provided. According to one embodiment of the present invention, a method for manufacturing a display device having a high aperture ratio and a wide viewing angle in fewer steps is provided. According to one embodiment of the present invention, a novel method for manufacturing a display device is provided.

Note that the description of these objects does not impede the existence of other objects. In one embodiment of the present invention, there is no need to achieve all the objects. Other objects will be apparent from and can be derived from the description of the specification, the drawings, the claims, and the like.

One embodiment of the present invention is a display device that includes a transistor including an oxide semiconductor film; a capacitor including a first electrode and a second electrode; and a light-emitting element that is formed over an inorganic insulating film over the transistor and an organic insulating film on and in contact with the inorganic insulating film. The first electrode is a metal oxide film in contact with the inorganic insulating film. The second electrode is a first light-transmitting conductive film provided over the inorganic insulating film. A pixel electrode of the light-emitting element is a second light-transmitting conductive film and is electrically connected to the transistor through an opening formed in the inorganic insulating film and the organic insulating film.

According to one embodiment of the present invention, a display device with high display quality can be provided. According to one embodiment of the present invention, a display device having a high aperture ratio and including a capacitor that can increase capacitance can be provided. According to one embodiment of the present invention, a low-power display device can be provided. According to one embodiment of the present invention, a display device including a transistor having excellent electrical characteristics can be provided. According to one embodiment of the present invention, a method for manufacturing a display device having a high aperture ratio and a wide viewing angle in fewer steps can be provided. According to one embodiment of the present invention, a novel display device can be provided.

Note that the description of these effects does not disturb the existence of other effects. In one embodiment of the present invention, there is no need to obtain all the effects. Other effects will be apparent from and can be derived from the description of the specification, the drawings, the claims, and the like.

BRIEF DESCRIPTION OF THE DRAWINGS

In the accompanying drawings:

FIGS. 7A to 7C are cross-sectional views illustrating one embodiment of a method for manufacturing a semiconductor device;

FIGS. 9A and 9B are cross-sectional views illustrating one embodiment of a method for manufacturing a semiconductor device;

FIGS. 11A to 11C are cross-sectional views illustrating one embodiment of a method for manufacturing a semiconductor device;

FIGS. 20A to 20C are cross-sectional TEM images and a local Fourier transform image of an oxide semiconductor;

FIGS. 52A and 52B show the structure of $InGaZnO_4$ before collision of an atom, and the like;

FIGS. 53A and 53B show the structure of $InGaZnO_4$ after collision of an atom, and the like;

FIGS. 54A and 54B show trajectories of atoms after collision of an atom; and

DETAILED DESCRIPTION OF THE INVENTION

Figure 1A:
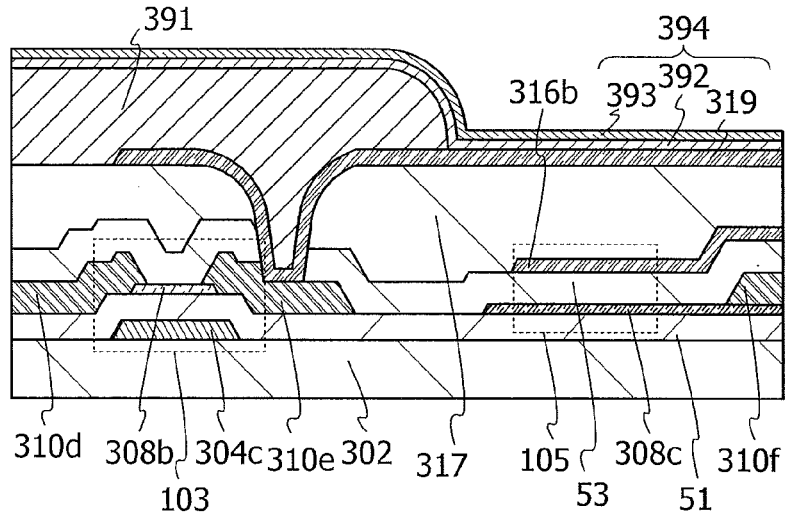
FIGS. 1A to 1C are cross-sectional views illustrating one embodiment of a semiconductor device.

Embodiments will be described below with reference to the drawings. Note that the embodiments can be implemented in various different ways and it will be readily appreciated by those skilled in the art that modes and details of the present invention can be modified in various ways without departing from the spirit and scope of the present invention. The present invention therefore should not be construed as being limited to the following description of the embodiments. Note that in structures of the invention described below, reference numerals denoting the same portions are used in common in different drawings.

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate (a gate terminal or a gate electrode), a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a region that functions as a source or a region that functions as a drain is not referred to as a source or a drain in some cases. In that case, one of the source and the drain might be referred to as a first terminal, and the other of the source and the drain might be referred to as a second terminal.

In this specification, ordinal numbers such as "first," "second," and "third" are used to avoid confusion among components, and thus do not limit the number of the components.

In this specification, the expression "A and B are connected" means the case where "A and B are electrically connected" in addition to the case where "A and B are directly connected." Here, the expression "A and B are electrically connected" means the case where electric signals can be transmitted and received between A and B when an object having any electric action exists between A and B.

In this specification, terms for describing arrangement, such as "over" and "under," are used for convenience for describing the positional relationship between components with reference to drawings. Furthermore, the positional relationship between components is changed as appropriate in accordance with a direction in which each component is described. Thus, there is no limitation on terms used in this specification, and description can be made appropriately depending on the situation.

The positional relationships of circuit blocks in diagrams are specified for description, and even in the case where different circuit blocks have different functions in the diagrams, the different circuit blocks might be provided in an actual circuit or region so that different functions are achieved in the same circuit or region. The functions of circuit blocks in diagrams are specified for description, and even in the case where one circuit block is illustrated, blocks might be provided in an actual circuit or region so that processing performed by one circuit block is performed by a plurality of circuit blocks.

Voltage refers to a difference between a given potential and a reference potential (e.g., a ground potential) in many cases. Thus, voltage, a potential, and a potential difference can also be referred to as a potential, voltage, and a voltage difference, respectively. Note that voltage refers to a difference between potentials of two points, and a potential refers to electrostatic energy (electric potential energy) of a unit charge at a given point in an electrostatic field.

Note that in general, a potential and voltage are relative values. Thus, a ground potential is not always 0 V.

In this specification and the like, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

In this specification and the like, trigonal and rhombohedral crystal systems are included in a hexagonal crystal system.

Embodiment 1

In this embodiment, a semiconductor device that is one embodiment of the present invention is described with reference to drawings.

FIG. 1A is a cross-sectional view of a transistor 103 and a capacitor 105 included in a semiconductor device.

The transistor 103 in FIG. 1A includes a conductive film 304c that is provided over a substrate 302 and functions as a gate electrode; a gate insulating film 51 formed over the substrate 302 and the conductive film 304c; an oxide semiconductor film 308b that overlaps the conductive film 304c with the gate insulating film 51 positioned therebetween; and a pair of conductive films 310d and 310e that is in contact with the oxide semiconductor film 308b and functions as a source electrode and a drain electrode.

A metal oxide film 308c is provided over the gate insulating film 51. Note that the metal oxide film 308c is connected to a conductive film 310f provided in the same layer as the conductive films 310d and 310e. An inorganic insulating film 53 is provided over the transistor 103 and the metal oxide film 308c. A conductive film 316b is provided over the inorganic insulating film 53. The metal oxide film 308c, the inorganic insulating film 53, and the conductive film 316b constitute the capacitor 105.

An organic insulating film 317 is provided over the inorganic insulating film 53 and the conductive film 316b. A conductive film 319 that is connected to the conductive film 310e through an opening formed in the inorganic insulating film 53 and the organic insulating film 317 is provided over the organic insulating film 317. The conductive film 319 functions as a pixel electrode (first electrode) of a light-emitting element 394.

An insulating layer 391 is provided over the organic insulating film 317 and the conductive film 319. Through an opening formed in the insulating layer 391, a light-emitting layer 392 and a conductive film 393 of the light-emitting element 394 is provided over the conductive film 319. The conductive film 393 functions as a common electrode (second electrode) of the light-emitting element 394.

The conductivity of the metal oxide film 308c is increased by adding an impurity such as hydrogen, boron, phosphorus, nitrogen, tin, antimony, a rare gas element, an alkali metal, or an alkaline earth metal to an oxide semiconductor film formed at the same time as the oxide semiconductor film 308b and by forming oxygen vacancies, so that the metal oxide film 308c becomes a conductive film. Since the oxide semiconductor film has light-transmitting properties, the metal oxide film 308c also has light-transmitting properties.

In an oxide semiconductor including oxygen vacancies, hydrogen enters oxygen vacant sites and forms a donor level in the vicinity of the conduction band. As a result, the conductivity of the oxide semiconductor is increased, so that the oxide semiconductor becomes a conductor. The oxide semiconductor that becomes a conductor is referred to as an oxide conductor as well as a metal oxide film. Oxide semiconductors generally transmit visible light because of their large energy gap. An oxide conductor is an oxide semiconductor having a donor level in the vicinity of the conduction band. Thus, the influence of absorption due to the donor level is small, and an oxide conductor has a visible light-transmitting property comparable to that of an oxide semiconductor.

Note that one embodiment of the present invention is not limited thereto. The metal oxide film 308c may be deposited in a step different from that of the oxide semiconductor film 308b and then may be processed. Thus, the metal oxide film 308c may be formed using a material different from that of the oxide semiconductor film 308b. In addition, the metal oxide film 308c can be found using a material other than an oxide. For example, a film including a metal element may be used or a film partly including nitrogen may be used. Furthermore, the metal oxide film 308c may have a function of reflecting light emitted from a light-emitting element.

The conductive films 316b and 319 are formed using light-transmitting conductive films. Thus, the capacitor 105 has light-transmitting properties. Consequently, in a pixel, the area of the capacitor can be increased, and the capacitance of the capacitor and the aperture ratio of the pixel can be increased. Note that in the case where the conductive film 319 is used as an anode of the light-emitting element 394, the conductive film 319 may be formed using a light-transmitting film of indium tin oxide or the like whose work function is higher than that of the light-emitting layer 392.

The inorganic insulating film 53 includes at least an oxide insulating film, and preferably further includes a stack of an oxide insulating film and a nitride insulating film. In the inorganic insulating film 53, when an oxide insulating film is formed in a region in contact with the oxide semiconductor film 308b, the number of defects at an interface between the oxide semiconductor film 308b and the inorganic insulating film 53 can be reduced.

The nitride insulating film functions as a barrier film against water, hydrogen, or the like. When the oxide semiconductor film 308b contains water, hydrogen, or the like, oxygen contained in the oxide semiconductor film 308b reacts with water, hydrogen, or the like, so that oxygen vacancies are formed. The oxygen vacancies generate carriers in the oxide semiconductor film 308b, the threshold voltage of the transistor is shifted in a negative direction, and the transistor is normally on. Thus, when the inorganic insulating film 53 includes a nitride insulating film, the diffusion amount of water, hydrogen, or the like from the outside to the oxide semiconductor film 308b can be reduced, and the number of defects in the oxide semiconductor film 308b can be reduced. Accordingly, in the inorganic insulating film 53, when the oxide insulating film and the nitride insulating film are stacked sequentially from the oxide semiconductor film 308b side, the number of defects at the interface between the oxide semiconductor film 308b and the inorganic insulating film 53 and the number of oxygen vacancies in the oxide semiconductor film 308b can be reduced, so that a normally-off transistor can be formed.

Since the organic insulating film 317 is formed using an organic resin such as an acrylic resin, a polyimide resin, or an epoxy resin, the organic insulating film 317 has high flatness. The thickness of the organic insulating film 317 is 500 to 5000 nm, preferably 1000 to 3000 nm.

The conductive film 319 formed over the organic insulating film 317 is connected to the transistor 103. The conductive film 319 functions as the pixel electrode of the light-emitting element 394 and is connected to the transistor 103 through an opening formed in the inorganic insulating film 53 and the organic insulating film 317. In other words, since the conductive film 319 is apart from the transistor 103, the conductive film 319 is hardly affected by the potential of the conductive film 310d in the transistor 103. As a result, the conductive film 319 can overlap the transistor 103.

The insulating layer 391 has a function of separating the light-emitting elements 394 in adjacent pixels, that is, the insulating layer 391 functions as a partition. The insulating layer 391 has insulating properties and can be formed using an organic insulating film or an inorganic insulating film, for example. As the organic insulating film, for example, a polyimide-based resin, a polyamide-based resin, an acrylic-based resin, a siloxane-based resin, an epoxy-based resin, a phenol-based resin, or the like can be used. As the inorganic insulating material, silicon oxide, silicon oxynitride, or the like can be used. In particular, a photosensitive organic resin material is preferably used because the insulating layer 391 is easily formed.

In the case where the conductive film 393 is used as a cathode of the light-emitting element 394, the conductive film 393 is preferably formed using a material that has a low work function and can inject electrons into the light-emitting element 394. As well as a single layer of a metal having a low work function, a stack in which a metal material such as aluminum, a conductive oxide material such as indium tin oxide, or a semiconductor material is formed over a several-nanometer-thick buffer layer formed using an alkali metal or an alkaline earth metal having a low work function may be used as the conductive film 393. As the buffer layer, an oxide of an alkaline earth metal, a halide, a magnesium-silver alloy, or the like can also be used.

The light-emitting layer 392 of the light-emitting element 394 includes at least a light-emitting layer containing a light-emitting substance. In addition to the light-emitting layer, a functional layer such as a hole-injection layer, a hole-transport layer, an electron-transport layer, an electron-injection layer, or a charge generation layer may be formed. In the light-emitting layer 392, electrons and holes are injected from a pair of electrodes (here, the conductive films 319 and 393), and current flows. Then, the electrons and holes are recombined, so that the light-emitting substance is excited. When the light-emitting substance returns to a ground state from the excited state, light is emitted.

Here the case is described as a comparison example in which in a semiconductor device including the transistor 103 that does not include the organic insulating film 317 over the inorganic insulating film 53, negative voltage is applied to the conductive film 304c functioning as the gate electrode of the transistor 103.

When negative voltage is applied to the conductive film 304c functioning as the gate electrode, an electric field is generated. The electric field is not shielded by the oxide semiconductor film 308b, but affects the inorganic insulating film 53; thus, a surface of the inorganic insulating film 53 is charged with weak positive charge. In addition, when negative voltage is applied to the conductive film 304c functioning as the gate electrode, positive charge particles contained in air are adsorbed to the surface of the inorganic insulating film 53, so that the surface of the inorganic insulating film 53 is charged with weak positive charge.

When the surface of the inorganic insulating film 53 is charged with positive charge, an electric field is generated and affects the interface between the oxide semiconductor film 308b and the inorganic insulating film 53. Thus, substantially positive bias is applied to the interface between the oxide semiconductor film 308b and the inorganic insulating film 53, so that the threshold voltage of the transistor is shifted in a negative direction.

On the other hand, the transistor 103 in FIG. 1A in this embodiment includes the organic insulating film 317 over the inorganic insulating film 53. Since the organic insulating film 317 is thick, the electric field generated by application of negative voltage to the conductive film 304c functioning as the gate electrode does not affect the surface of the organic insulating film 317, and the surface of the organic insulating film 317 is hardly charged with positive charge. In addition, even when positive charge particles contained in air are adsorbed to the surface of the organic insulating film 317, the electric field of the positive charge particles adsorbed to the surface of the organic insulating film 317 hardly affects the interface between the oxide semiconductor film 308b and the inorganic insulating film 53 because the organic insulating film 317 is thick. Thus, substantially positive bias is not applied to the interface between the oxide semiconductor film 308b and the inorganic insulating film 53, so that variations in the threshold voltage of the transistor are small.

Water or the like is easily diffused into the organic insulating film 317; however, when the inorganic insulating film 53 includes a nitride insulating film, the nitride insulating film serves as a water barrier film that prevents water diffused into the organic insulating film 317 from being diffused into the oxide semiconductor film 308b.

Accordingly, when the organic insulating film 317 is provided over the transistor, variations in the electrical characteristics of the transistor can be reduced. In addition, a normally-off transistor having high reliability can be formed. Furthermore, the organic insulating film can be formed by a printing method, a coating method, or the like; thus, manufacturing time can be shortened.

<Oxide Conductor (Metal Oxide Film)>

Figure 45:
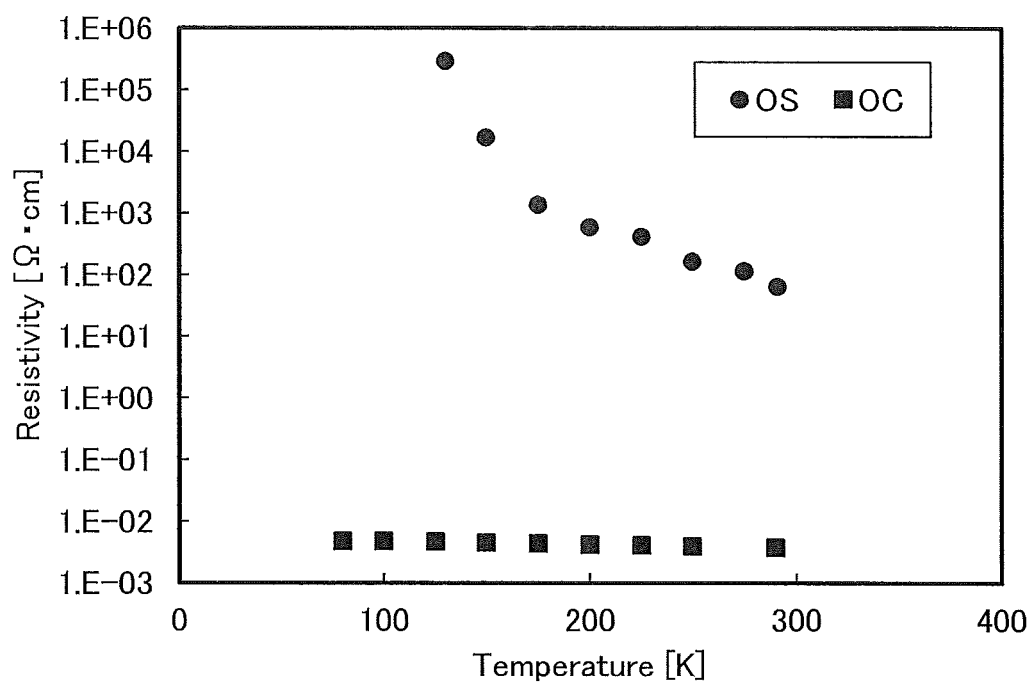
FIG. 45 is a graph showing temperature dependence of resistivity.

Here, the temperature dependence of resistivity of a film formed using an oxide semiconductor (hereinafter referred to as an oxide semiconductor film (OS)) and that of a film formed using an oxide conductor (hereinafter referred to as an oxide conductor film (OC)) are described with reference to FIG. 45. In FIG. 45, the horizontal axis represents measurement temperature, and the vertical axis represents resistivity. Measurement results of the oxide semiconductor film (OS) are plotted as circles, and measurement results of the oxide conductor film (OC) are plotted as squares.

Note that a sample including the oxide semiconductor film (OS) is prepared by forming a 35-nm-thick In—Ga—Zn oxide film over a glass substrate by sputtering using a sputtering target with an atomic ratio of In:Ga:Zn=1:1:1.2, forming a 20-nm-thick In—Ga—Zn oxide film over the 35-nm-thick In—Ga—Zn oxide film by sputtering using a sputtering target with an atomic ratio of In:Ga:Zn=1:4:5, performing heat treatment at 450° C. in a nitrogen atmosphere and then performing heat treatment at 450° C. in the atmosphere of a mixed gas of nitrogen and oxygen, and forming a silicon oxynitride film by plasma-enhanced CVD.

A sample including the oxide conductor film (OC) is prepared by foaming a 100-nm-thick In—Ga—Zn oxide film over a glass substrate by sputtering using a sputtering target with an atomic ratio of In:Ga:Zn=1:1:1, performing heat treatment at 450° C. in a nitrogen atmosphere and then performing heat treatment at 450° C. in the atmosphere of a mixed gas of nitrogen and oxygen, and forming a silicon nitride film by plasma-enhanced CVD.

As can be seen from FIG. 45, the temperature dependence of resistivity of the oxide conductor film (OC) is lower than the temperature dependence of resistivity of the oxide semiconductor film (OS). Typically, variation of the resistivity of the oxide conductor film (OC) at temperatures from 80 to 290 K is more than −20% and less than +20%. Alternatively, the range of variation of resistivity at temperatures from 150 to 250 K is more than −10% and less than +10%. In other words, the oxide conductor is a degenerate semiconductor and it is suggested that the conduction band edge agrees with or substantially agrees with the Fermi level. Thus, the oxide conductor film can be used for a wiring, an electrode, a pixel electrode, or the like.

<Modification Example>1

A modification example of the structure in FIG. 1A is described with reference to FIG. 1B. In a semiconductor device in FIG. 1B, the conductive film 310e of the transistor 103 and the conductive film 316b are connected to each other using the conductive film 319.

When the conductive film 319 is used as a wiring for connecting conductive films as well as a pixel electrode, the capacitor 105 can be connected to the transistor 103 without another wiring or transistor.

<Modification Example>2

A modification example of the structure in FIG. 1A is described with reference to FIG. 1C. In a semiconductor device in FIG. 1C, the conductive film 310e of the transistor 103 and the metal oxide film 308c are directly connected to each other.

When the conductive film 310e and the conductive film 316b are directly connected to each other, the capacitor 105 can be connected to the transistor 103 without another wiring or transistor.

<Modification Example>3

A modification example of the transistor described in this embodiment is described with reference to FIG. 29A. A transistor 103c in this modification example includes an oxide semiconductor film 308e and a pair of conductive films 310f and 310g formed using a multi-tone mask (e.g., a half-tone mask, a gray-tone mask, or a phase difference mask). In addition, the transistor 103c and the capacitor 105 are connected to each other through the conductive film 319 functioning as a pixel electrode.

A resist mask with a plurality of thicknesses can be formed using a multi-tone mask. By exposing the resist mask to oxygen plasma or the like after the oxide semiconductor film 308e is formed using the resist mask, part of the resist mask is removed, and the resist mask is used to form the pair of conductive films. Thus, the number of photolithography steps in a manufacturing process of the oxide semiconductor film 308e and the pair of conductive films 310f and 310g can be reduced.

Note that part of the oxide semiconductor film 308e formed using the multi-tone mask is exposed from the pair of conductive films 310f and 310g in a planar shape.

Figure 29A:
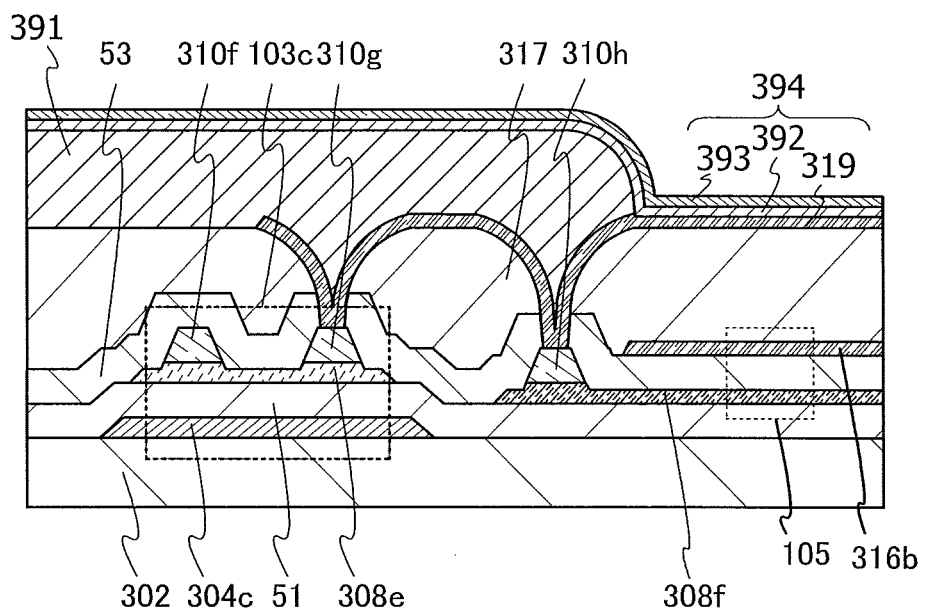
FIGS. 29A and 29B are cross-sectional views illustrating one embodiment of a semiconductor device.

In FIG. 29A, a metal oxide film 308f is formed over the gate insulating film 51. In addition, a conductive film 310h is formed over the metal oxide film 308f at the same time as the conductive films 310f and 310g. The conductive film 319 is connected to the conductive films 310g and 310h. As a result, the transistor 103 and the capacitor 105 are electrically connected to each other.

<Modification Example>4

A modification example of the transistor described in this embodiment is described with reference to FIG. 29B. A transistor 103d in this modification example has a channel protective structure.

The transistor 103d with a channel protective structure has openings in an insulating film 53a, and the oxide semiconductor film 308b is connected to a pair of conductive films 310i and 310j through the openings. This structure can reduce damage to the oxide semiconductor film 308b.

<Modification Example>5

Figure 1B:
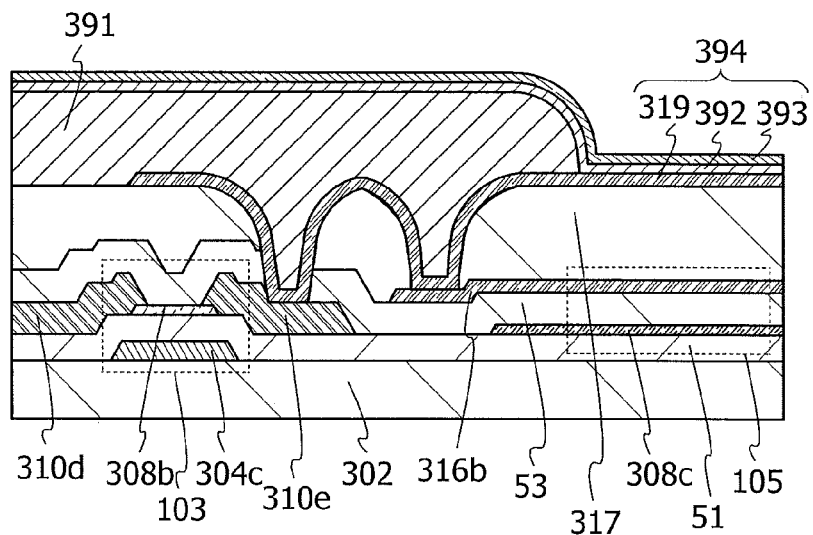
Figure 1C:
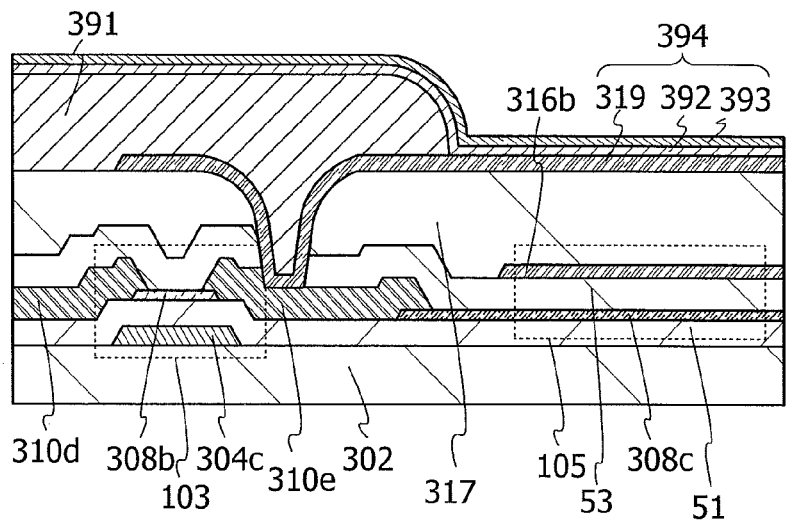
Figure 30A:
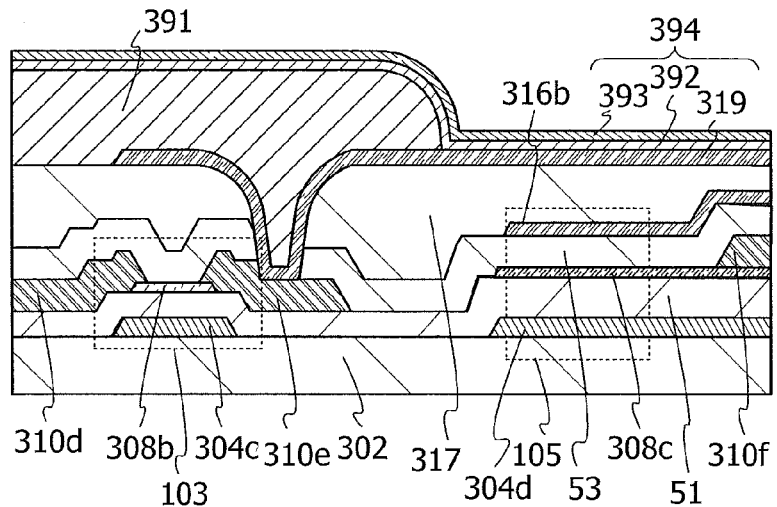
FIGS. 30A to 30C are cross-sectional views illustrating one embodiment of a semiconductor device.
Figure 30B:
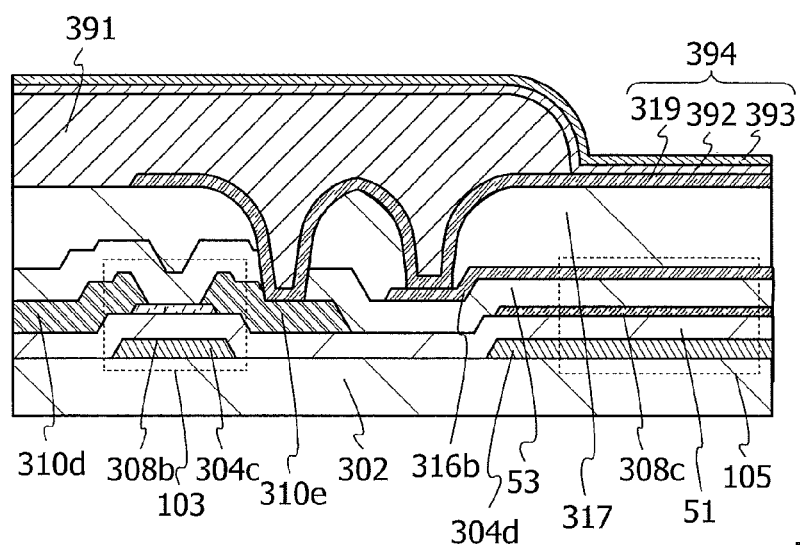
Figure 30C:
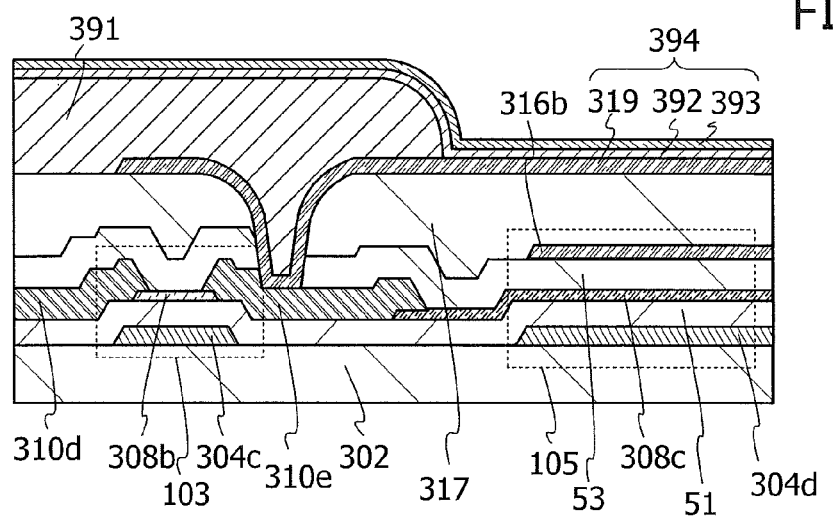

Modification examples of the structures in FIGS. 1A to 1C are described with reference to FIGS. 30A to 30C. In semiconductor devices in FIGS. 30A to 30C, in a region where the capacitor 105 and the light-emitting element 394 overlap each other, a conductive film 304d is formed in the same layer as the conductive film 304c.

When the conductive film 304d overlaps the metal oxide film 308c of the capacitor 105, a capacitor is constituted of the metal oxide film 308c, the gate insulating film 51, and the conductive film 304d, so that the capacitance of the capacitor 105 can be further increased.

<Modification Example>6

Figure 29B:
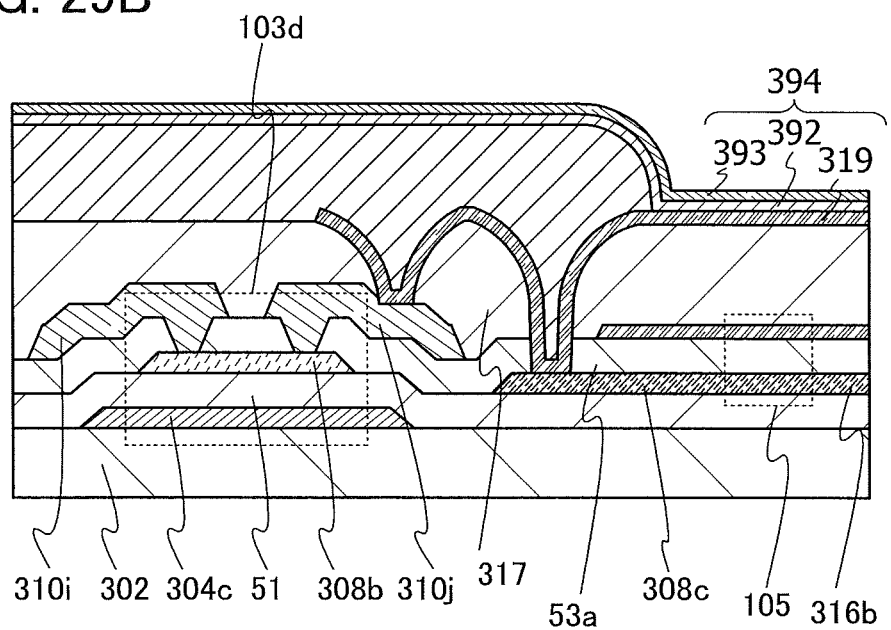
Figure 43A:
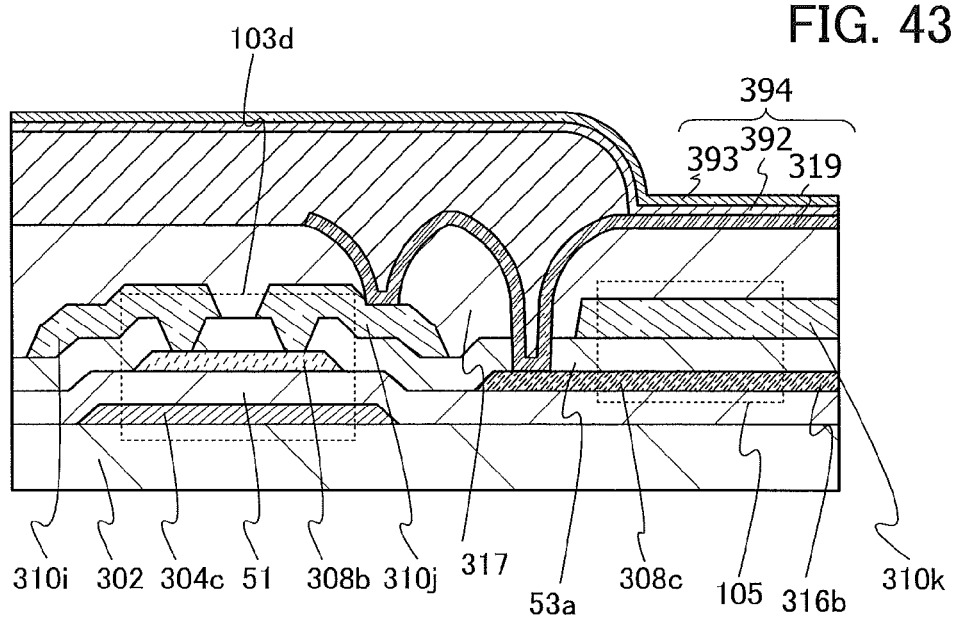
FIGS. 43A and 43B are cross-sectional views illustrating one embodiment of a semiconductor device.

A modification example of the structure in FIG. 29B is described with reference to FIG. 43A. In a semiconductor device in FIG. 43A, the conductive film 316b provided in FIG. 29B is not provided, and a conductive film 310k is formed in the same layer as the conductive films 310j and 310i to form the capacitor 105. For example, the conductive film 310k is fouled and etched at the same time as the conductive films 310j and 310i. Thus, the conductive film 310k includes, for example, the same material as the conductive film 310j.

Figure 43B:
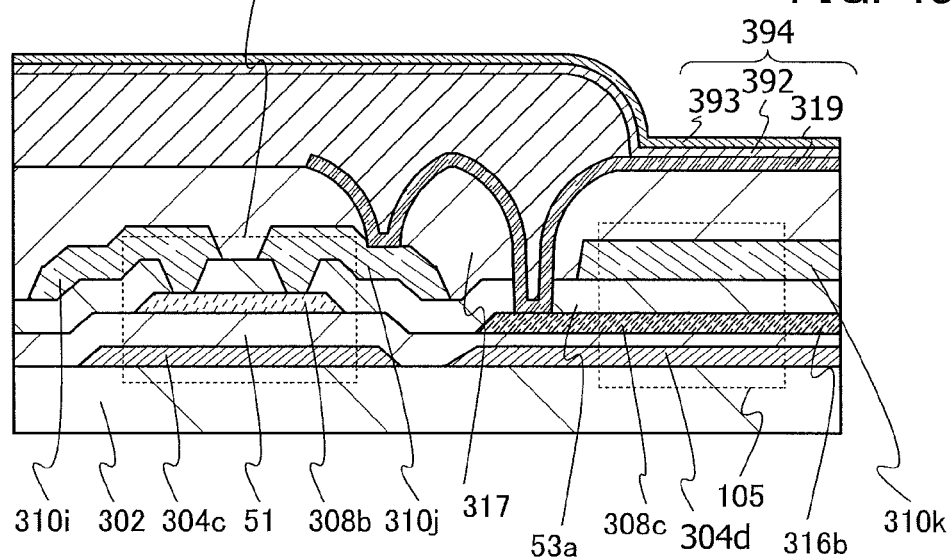

Note that this modification example may be combined with the structure in Modification Example 5. Specifically, as illustrated in FIG. 43B, the conductive layer 304d formed in the same layer as the conductive film 304c can be provided in a region where the capacitor 105 and the light-emitting element 394 overlap each other. For example, the conductive film 304d is formed and etched at the same time as the conductive film 304c. Thus, the conductive film 304d includes, for example, the same material as the conductive film 304c. The conductive film 304d can function as part of the capacitor 105. Thus, the conductive film 304d may be connected to one electrode of the capacitor 105.

<Modification Example>7

A modification example of the structure in FIG. 1A is described with reference to FIG. 31A. In a semiconductor device in FIG. 31A, the oxide semiconductor film 308b is directly connected to the metal oxide film 308c in FIG. 1A. With such a structure, the oxide semiconductor film 308b is formed to have one island shape and can function as the semiconductor layer of the transistor 103 and one electrode of the capacitor 105.

Figure 31A:
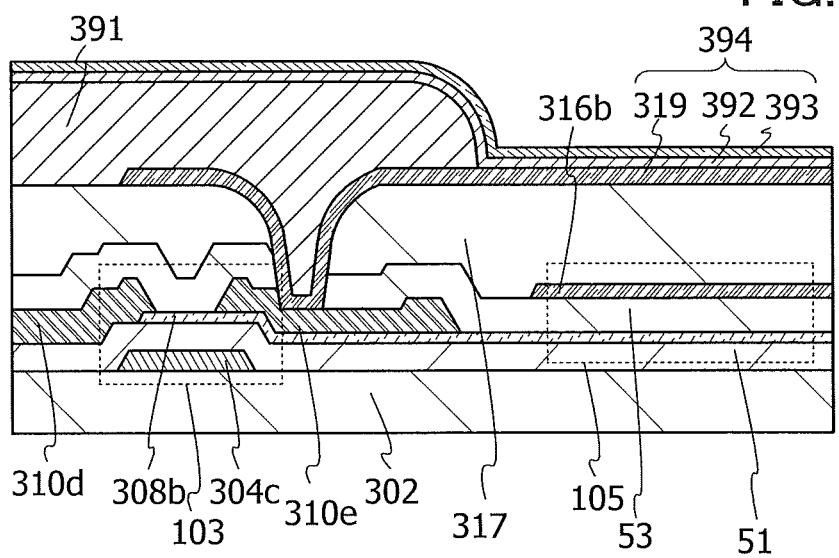
FIGS. 31A and 31B are cross-sectional views illustrating one embodiment of a semiconductor device.

When the structure of FIG. 31A in which the oxide semiconductor film 308b is directly connected to the metal oxide film 308c in FIG. 1A is employed, flatness of the organic insulating film 317 and the inorganic insulating film 53 can be improved, for example, and the manufacturing yield of the semiconductor device can be increased.

Note that this modification example may be combined with the structure in Modification Example 5. Specifically, as illustrated in FIG. 31B, the conductive layer 304d formed in the same layer as the conductive film 304c can be provided in a region where the capacitor 105 and the light-emitting element 394 overlap each other.

Figure 31B:
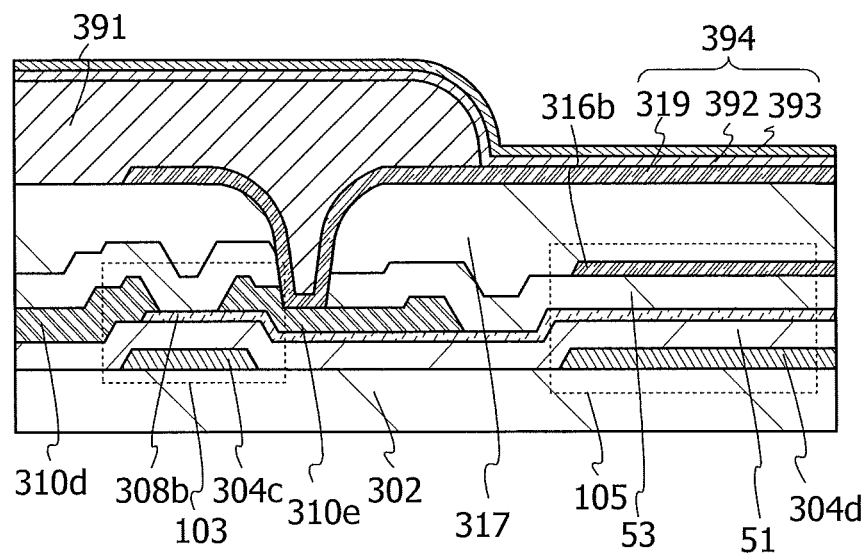
Figure 44A:
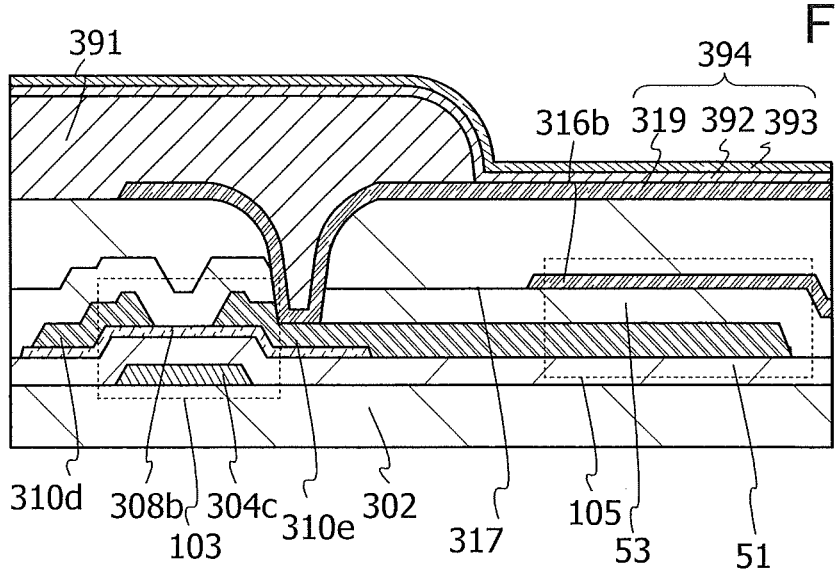
FIGS. 44A and 44B are cross-sectional views illustrating one embodiment of a semiconductor device.
Figure 44B:
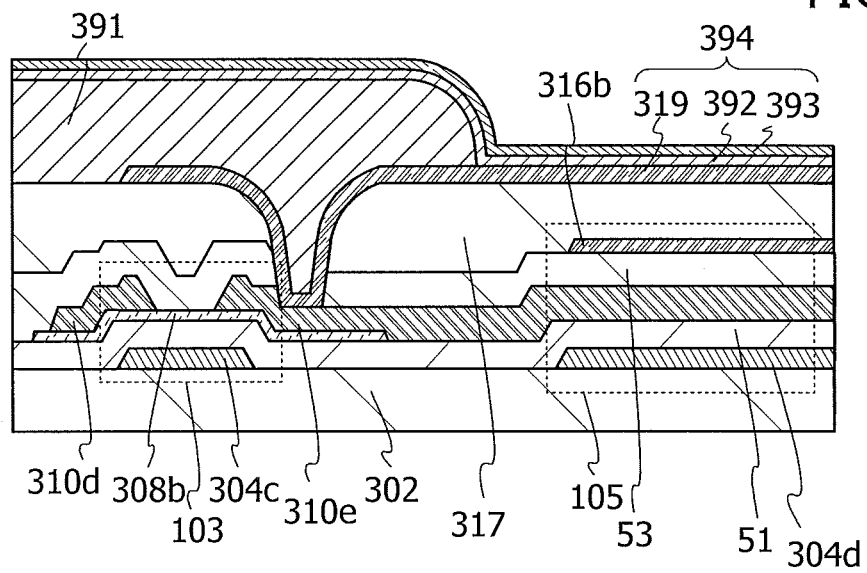

In the structures of FIGS. 31A and 31B, when the oxide semiconductor film 308b and the conductive films 310d and 310e are formed using a multi-tone mask, the oxide semiconductor film 308b is always positioned below the conductive films 310d and 310e. FIGS. 40A and 40B and FIGS. 41A and 41B illustrate such examples, and such a structure can be similarly applied to other modification examples. Note that when a multi-tone mask is not used, there may be a region in which the oxide semiconductor film 308b is not positioned below the conductive films 310d and 310e. For example, cross-sectional views in that case are illustrated in FIGS. 44A and 44B.

Figure 34:
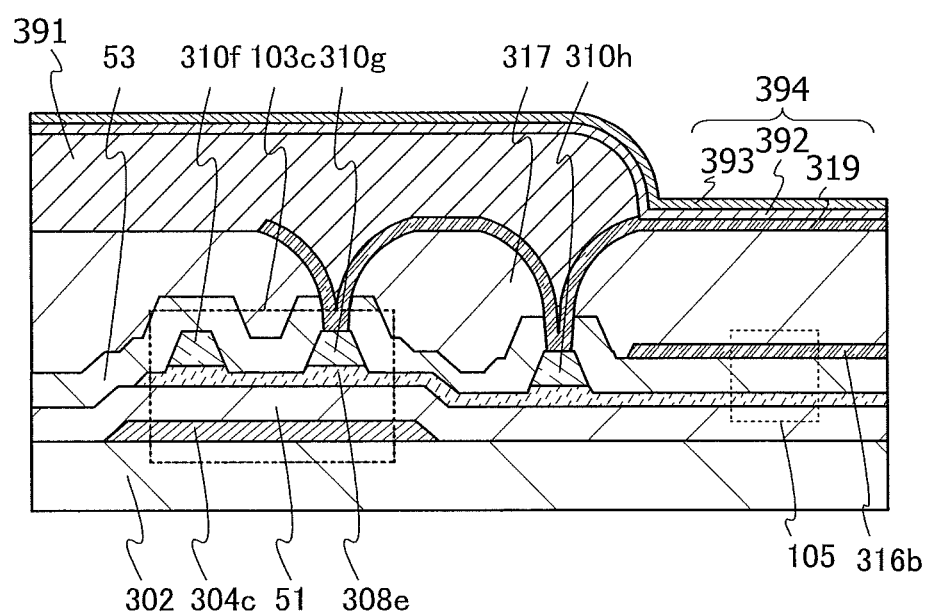
FIG. 34 is a cross-sectional view illustrating one embodiment of a semiconductor device.

This modification example may be combined with the structure in Modification Example 3. Specifically, a structure illustrated in FIG. 34 may be used.

<Modification Example>8

A modification example of the structure in FIG. 1B is described with reference to FIG. 32A. In a semiconductor device in FIG. 32A, the conductive film 316b is connected to the conductive film 310e through an opening formed in the inorganic insulating film 53, and the conductive film 316b is directly connected to the conductive film 319 through an opening formed in the organic insulating film 317.

Figure 32A:
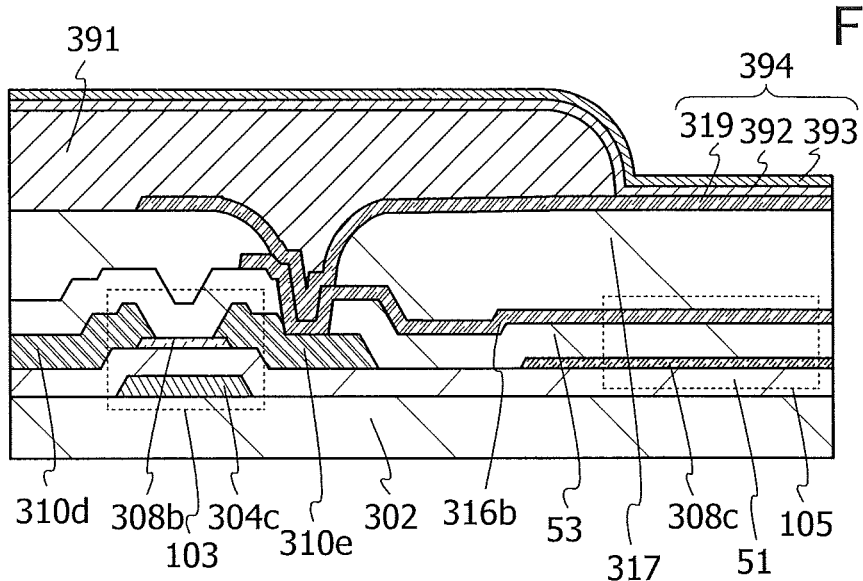
FIGS. 32A and 32B are cross-sectional views illustrating one embodiment of a semiconductor device.

With the structure in FIG. 32A, one photomask can be used to form the openings in the organic insulating film 317 and the inorganic insulating film 53, so that the number of masks can be reduced.

Note that this modification example may be combined with the structure in Modification Example 5. Specifically, as illustrated in FIG. 32B, the conductive layer 304d formed in the same layer as the conductive film 304c can be provided in a region where the capacitor 105 and the light-emitting element 394 overlap each other.

Figure 32B:
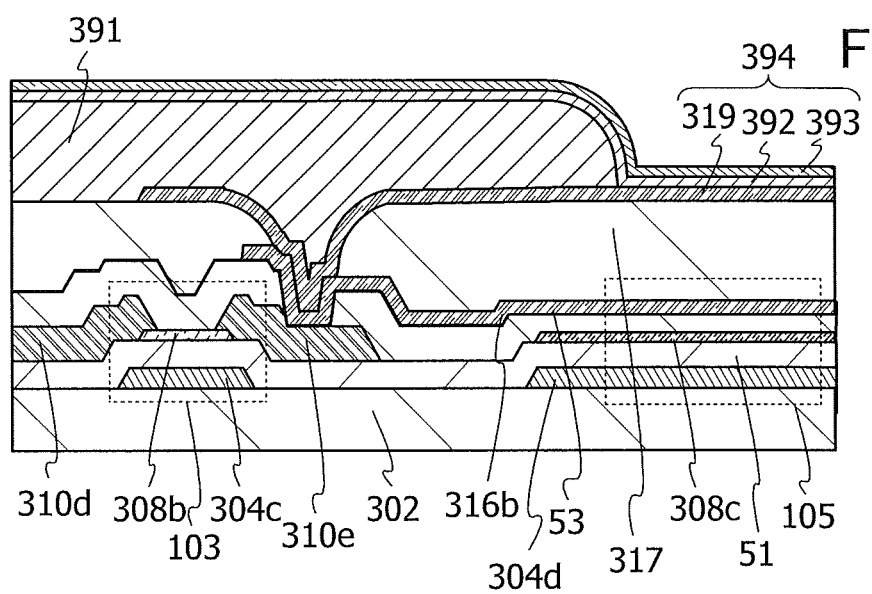
Figure 33A:
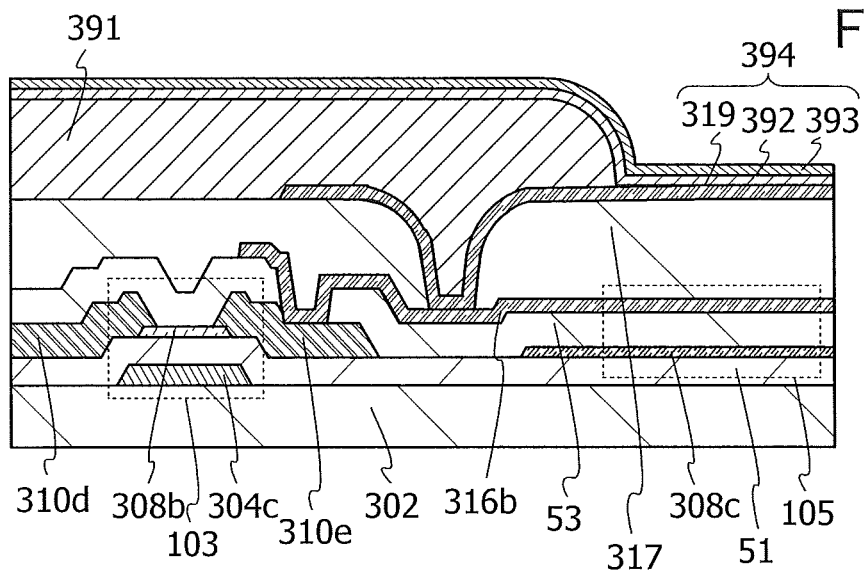
FIGS. 33A and 33B are cross-sectional views illustrating one embodiment of a semiconductor device.
Figure 33B:
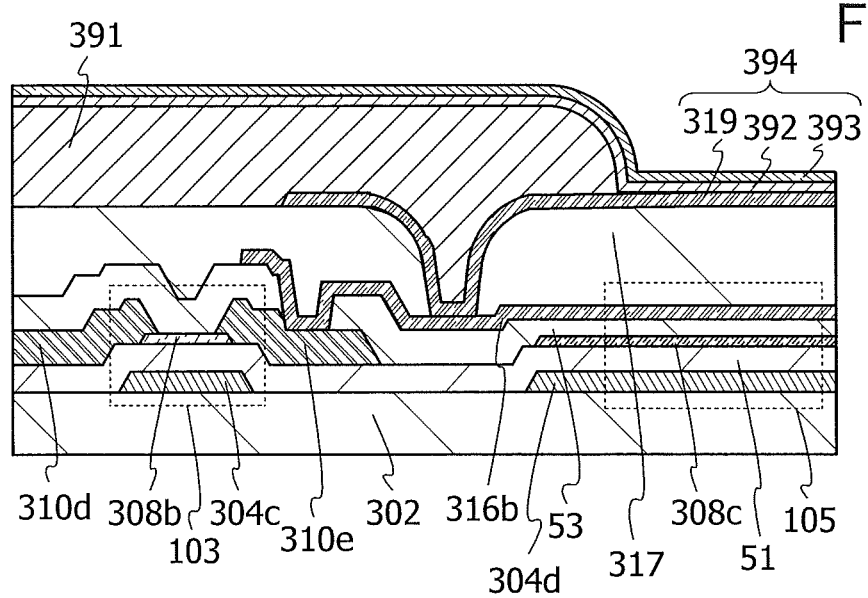

Note that as illustrated in FIGS. 33A and 33B, in the structures illustrated in FIGS. 32A and 32B, the opening in the organic insulating film 317 and the opening in the inorganic insulating film 53 may be formed using different photomasks.

<Modification Example>9

The conductive films described in the modification examples have a function of connecting conductive films to each other through the opening formed in the gate insulating film 51, the organic insulating film 317, or the inorganic insulating film 53. In that case, the conductive films are connected to each other through various conductive films and can function as connection terminals or protection circuits in a pixel region, a driver circuit region, a protection circuit region, a peripheral region, or the like.

Figure 35A:
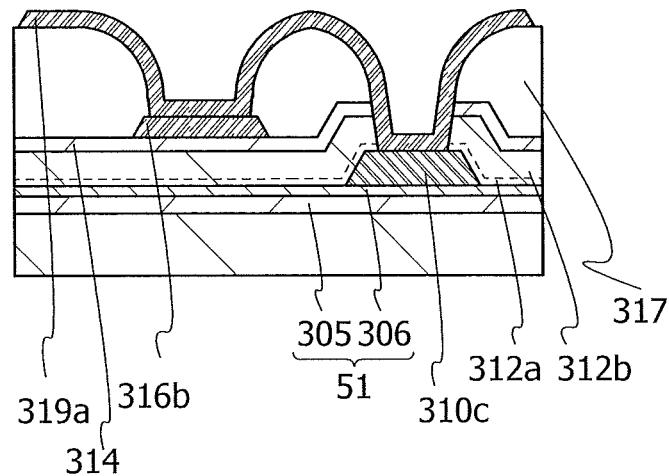
FIGS. 35A and 35B are cross-sectional views illustrating one embodiment of a semiconductor device.
Figure 35B:
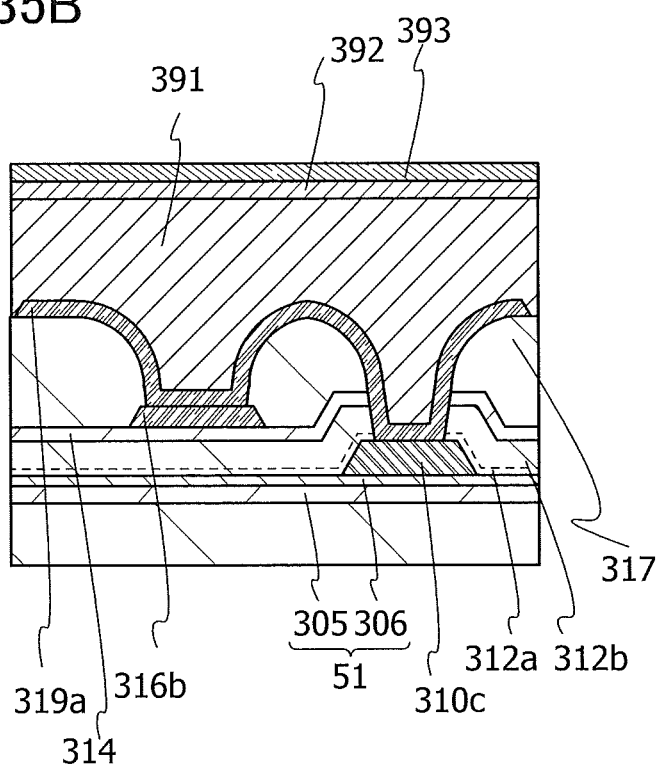

For example, FIGS. 35A and 35B are cross-sectional structure examples in which a conductive film formed in the same layer as a gate electrode is connected to a conductive film that functions as one electrode of the capacitor 105 through a conductive film formed in the same layer as a pixel electrode.

Figure 36A:
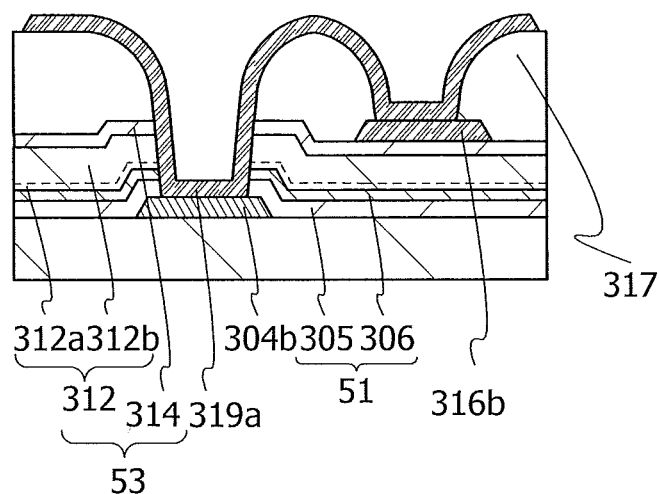
FIGS. 36A and 36B are cross-sectional views illustrating one embodiment of a semiconductor device.
Figure 36B:
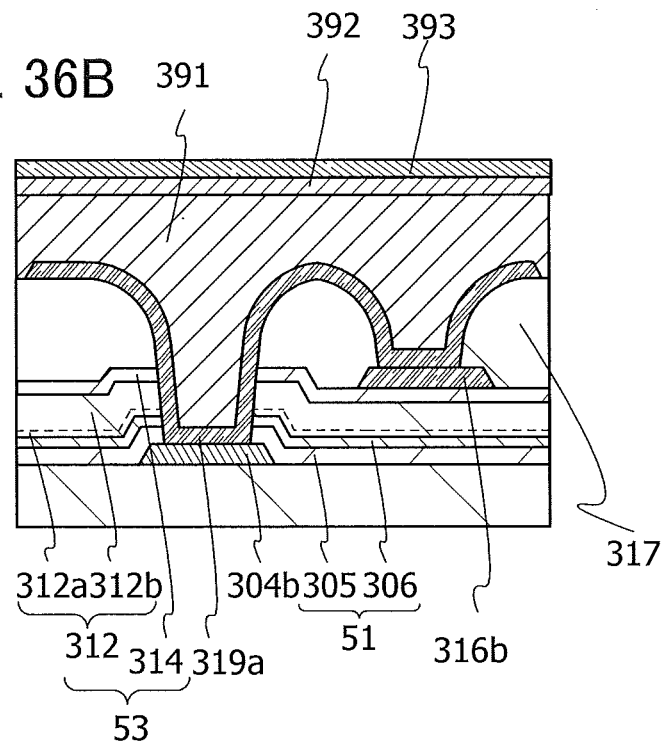

For example, FIGS. 36A and 36B are cross-sectional structure examples in which a conductive film formed in the same layer as a source or drain electrode is connected to a conductive film that functions as one electrode of the capacitor 105 through a conductive film formed in the same layer as a pixel electrode.

Figure 37A:
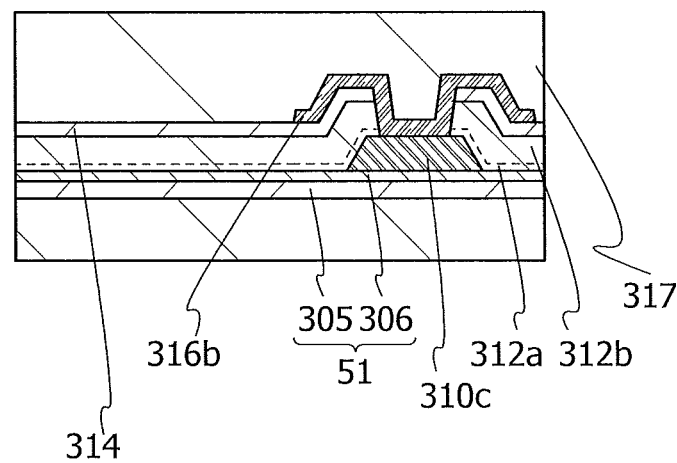
FIGS. 37A and 37B are cross-sectional views illustrating one embodiment of a semiconductor device.
Figure 37B:
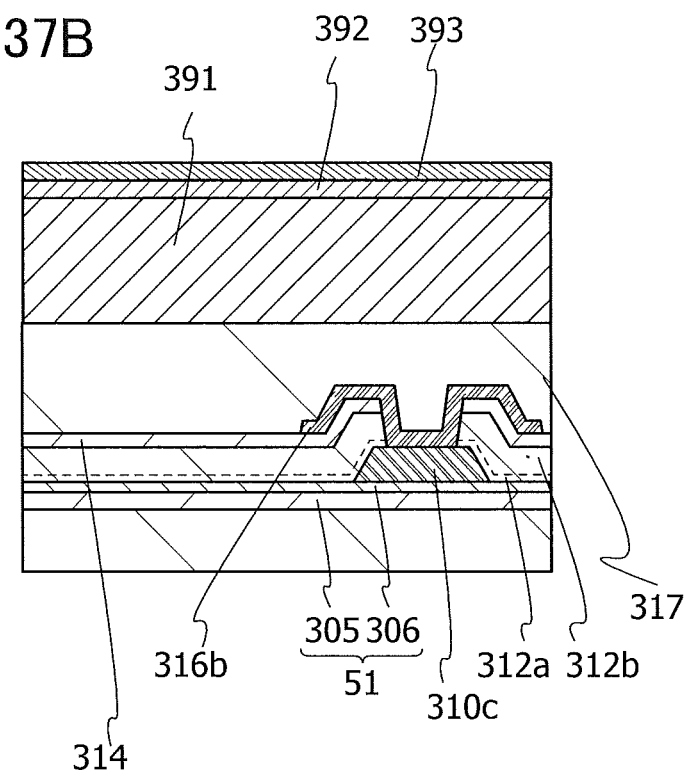

For example, FIGS. 37A and 37B are cross-sectional structure examples in which a conductive film formed in the same layer as a source or drain electrode is directly connected to a conductive film that functions as one electrode of the capacitor 105.

Figure 38A:
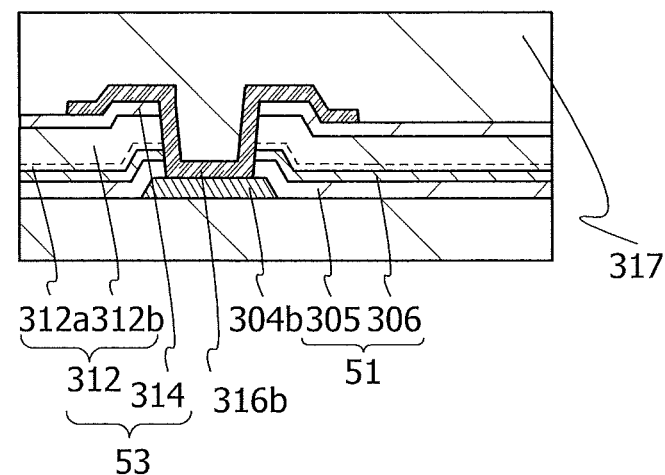
FIGS. 38A and 38B are cross-sectional views illustrating one embodiment of a semiconductor device.
Figure 38B:
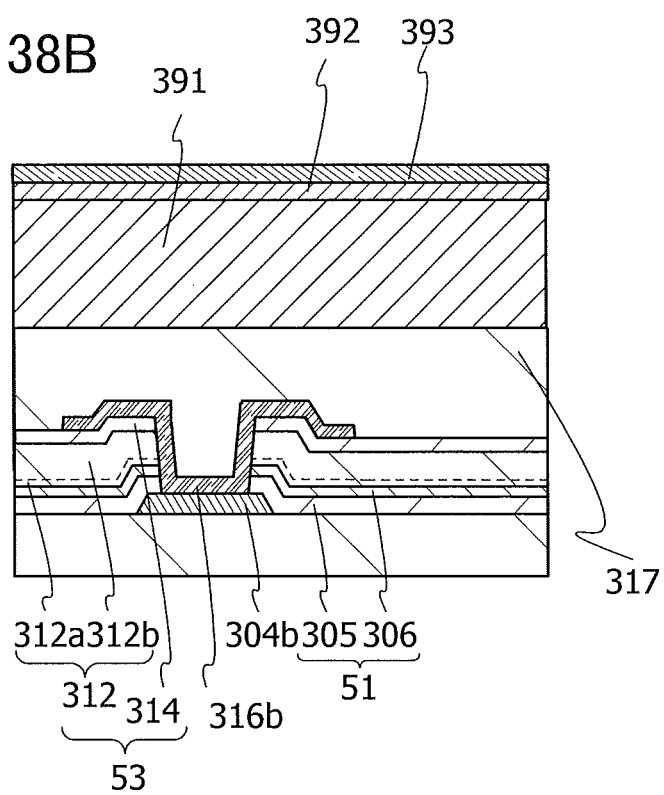

For example, FIGS. 38A and 38B are cross-sectional structure examples in which a conductive film formed in the same layer as a gate electrode is directly connected to a conductive film that functions as one electrode of the capacitor 105.

Figure 39A:
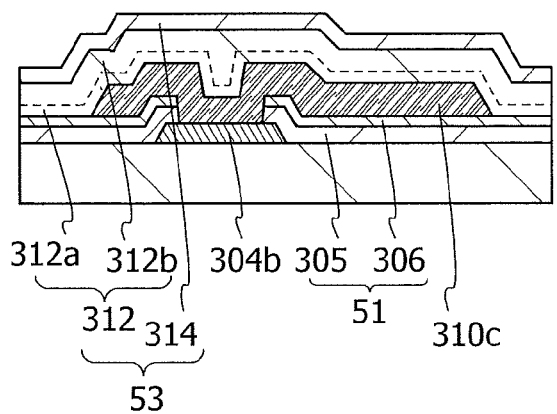
FIGS. 39A to 39C are cross-sectional views illustrating one embodiment of a semiconductor device.
Figure 39B:
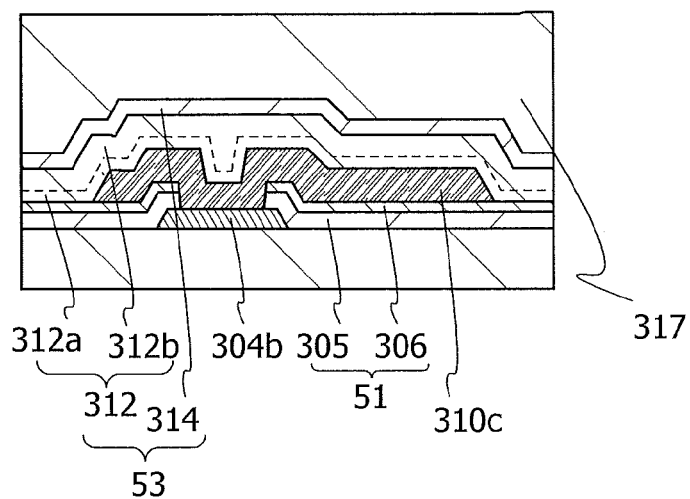
Figure 39C:
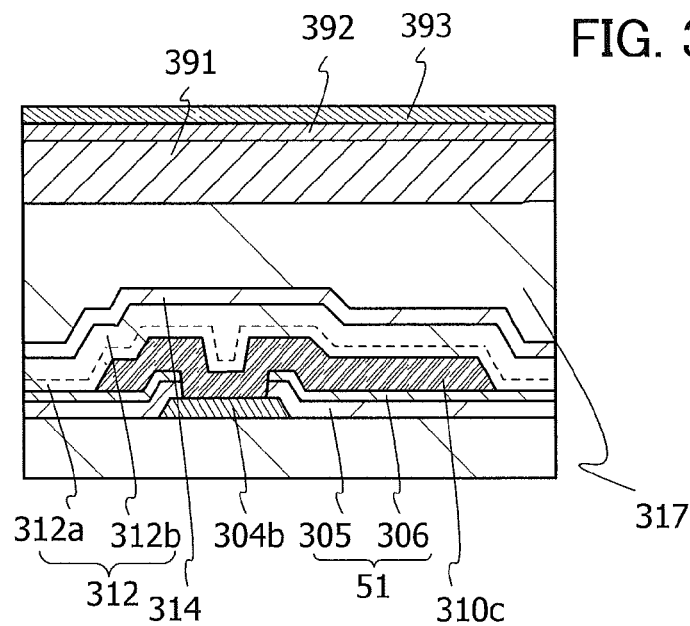
Figure 40A:
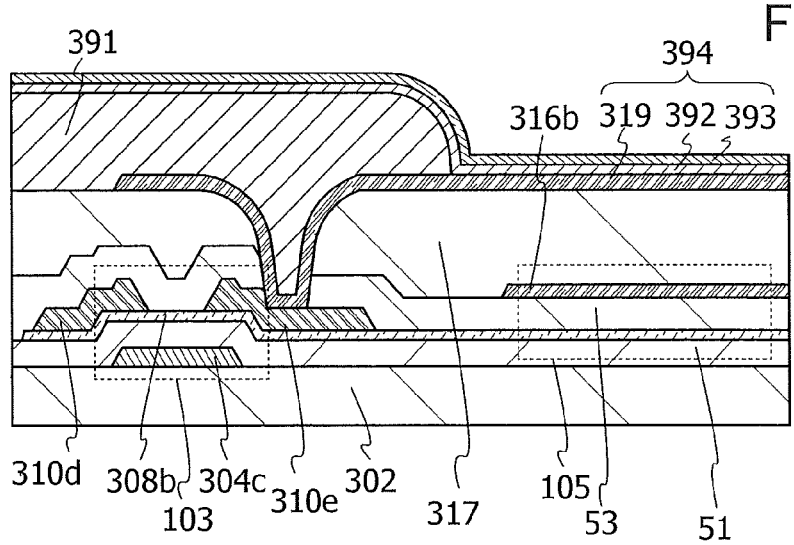
FIGS. 40A and 40B are cross-sectional views illustrating one embodiment of a semiconductor device.
Figure 40B:
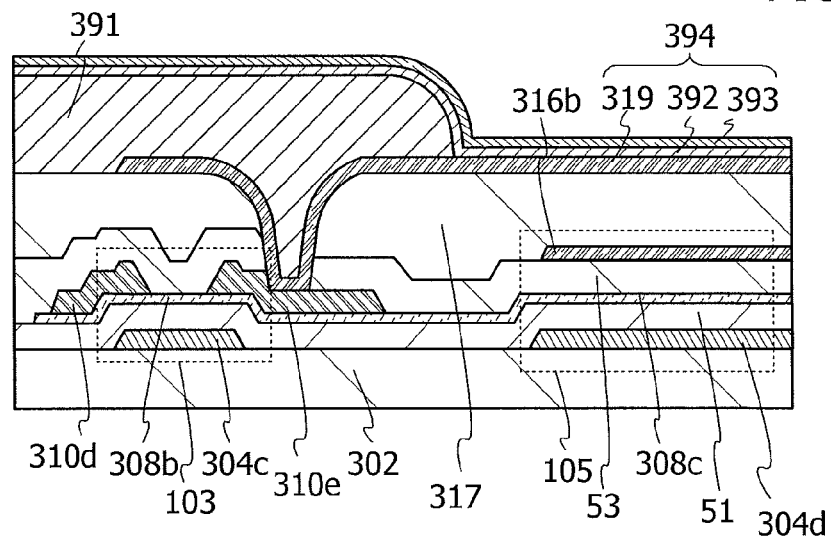
Figure 41A:
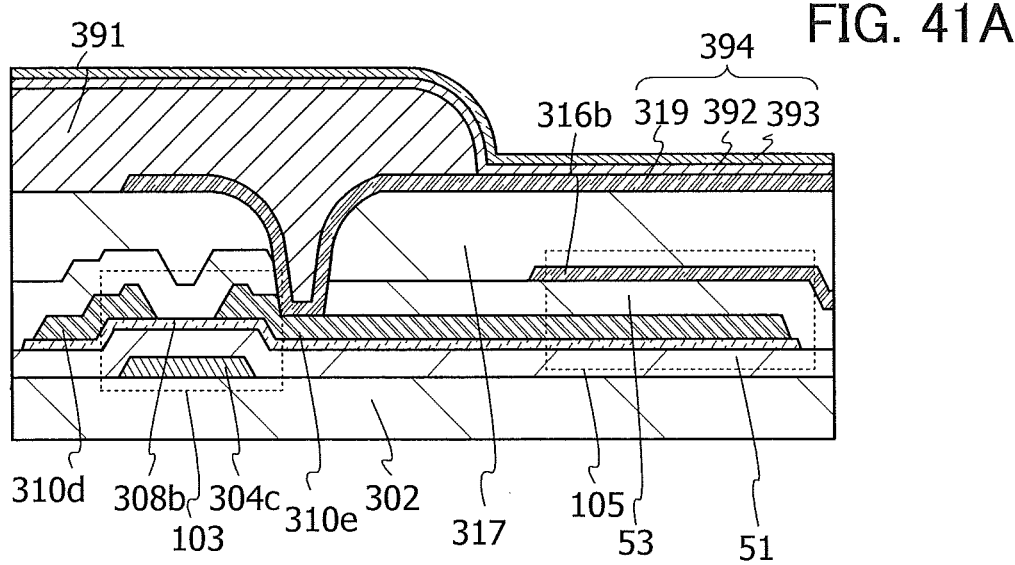
FIGS. 41A and 41B are cross-sectional views illustrating one embodiment of a semiconductor device.
Figure 41B:
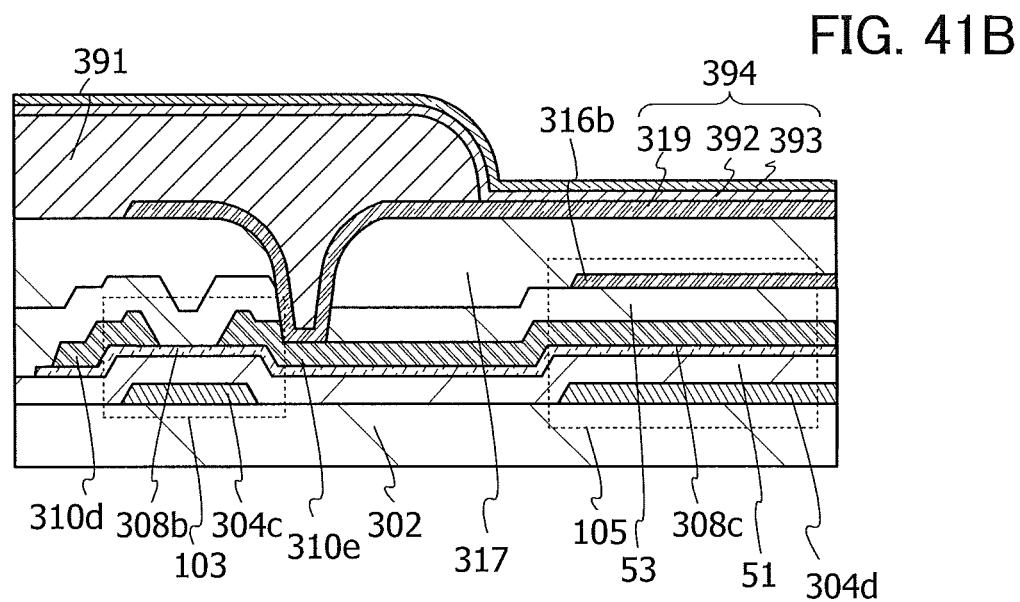

For example, FIGS. 39A and 39B are cross-sectional structure examples in which a conductive film formed in the same layer as a gate electrode is directly connected to a conductive film formed in the same layer as a source or drain electrode.

The cross-sectional structure examples in FIGS. 35A and 35B, FIGS. 36A and 36B, FIGS. 37A and 37B, FIGS. 38A and 38B, and FIGS. 39A to 39C can be used in various positions such as a pixel region, a driver circuit region, a protection circuit region, and a peripheral region. Note that in the cross-sectional views of this modification example, some films (e.g., a conductive film, an insulating film, and a semiconductor film), a substrate, and the like are omitted in some cases.

Note that the structures, methods, and the like described in this embodiment can be combined with any of the structures, methods, and the like described in the other embodiments as appropriate.

Embodiment 2

In this embodiment, a semiconductor device that one embodiment of the present invention and a manufacturing method thereof are described with reference to drawings.

Figure 2A:
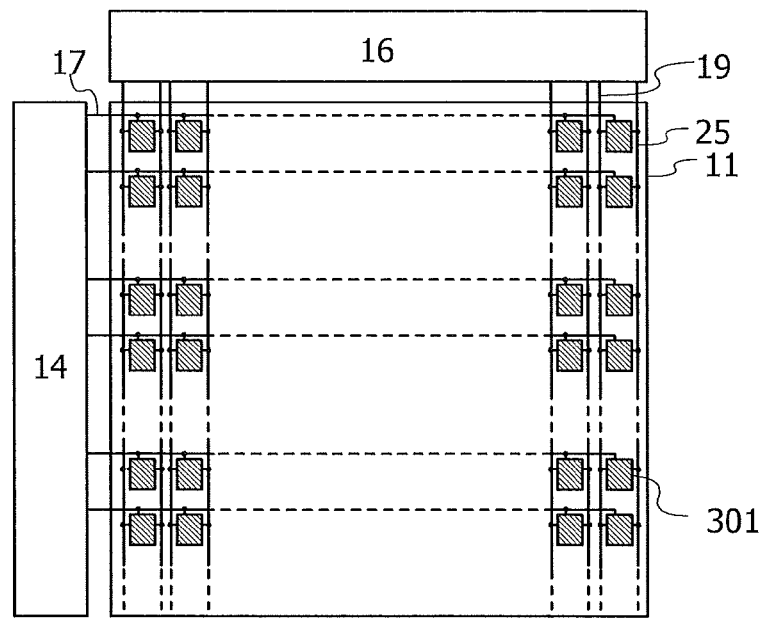
FIGS. 2A to 2C are a block diagram and circuit diagrams illustrating one embodiment of a semiconductor device.

FIG. 2A illustrates a display device as an example of a semiconductor device. The display device in FIG. 2A includes a pixel portion 11; a scan line driver circuit 14; a signal line driver circuit 16; m (m is a natural number) scan lines 17 that are arranged parallel or substantially parallel to each other and whose potentials are controlled by the scan line driver circuit 14; and n (n is a natural number) signal lines 19 that are arranged parallel or substantially parallel to each other and whose potentials are controlled by the signal line driver circuit 16. In addition, the pixel portion 11 includes a plurality of pixels 301 arranged in matrix. Furthermore, capacitor lines 25 arranged parallel or substantially parallel to each other are provided along the signal lines 19. Note that the capacitor lines 25 may be arranged parallel or substantially parallel to each other along the scan lines 17. The scan line driver circuit 14 and the signal line driver circuit 16 are collectively referred to as a driver circuit portion in some cases.

The display device includes a driver circuit for driving a plurality of pixels, and the like. The display device might also be referred to as a display module including a control circuit, a power supply circuit, a signal generation circuit, a backlight module, and the like provided over another substrate.

Figure 2B:
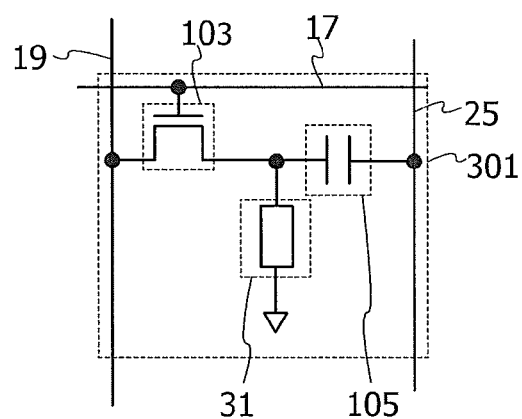
Figure 2C:
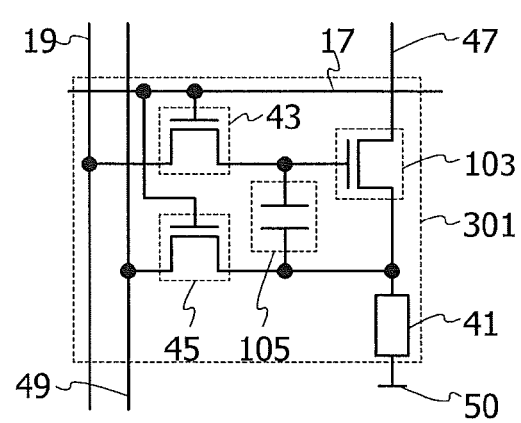

FIGS. 2B and 2C illustrate examples of circuit structures that can be used for the pixels 301 in the display device in FIG. 2A.

The pixel 301 illustrated in FIG. 2B includes a liquid crystal element 31, the transistor 103, and the capacitor 105.

The pixel 301 illustrated in FIG. 2C includes a transistor 43, the transistor 103, a transistor 45, the capacitor 105, and a light-emitting element 41.

Note that although FIGS. 2B and 2C each illustrate an example in which the liquid crystal element 31 or the light-emitting element 41 is used as a display element, one embodiment of the present invention is not limited thereto. Any of a variety of display elements can be used. Examples of display elements include elements including a display medium whose contrast, luminance, reflectance, transmittance, or the like is changed by electromagnetic action, such as an EL (electroluminescent) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD), an electrowetting element, a piezoelectric ceramic display, and a carbon nanotube. Note that examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device using electronic ink or electrophoretic elements include electronic paper.

Figure 3:
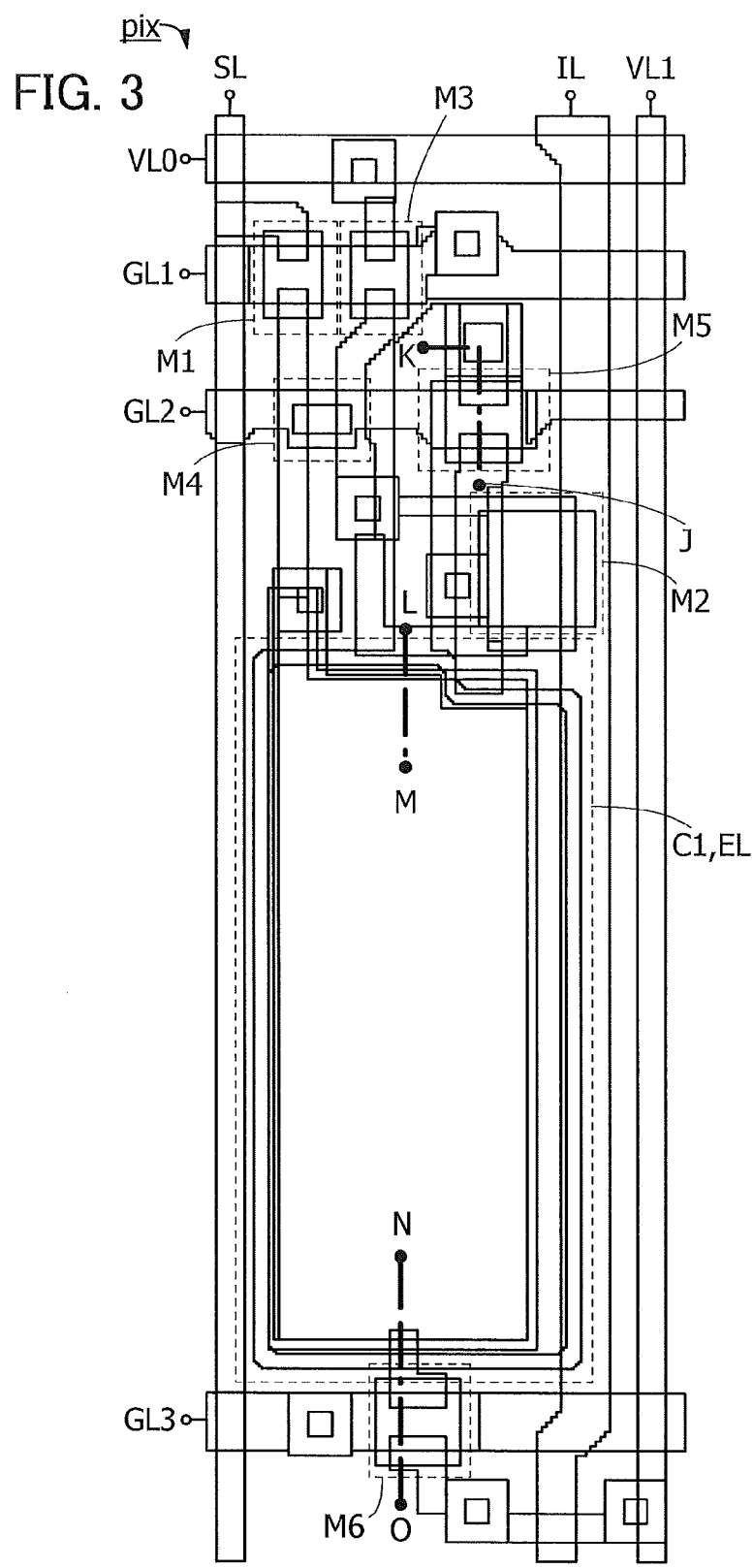
FIG. 3 is a top view illustrating one embodiment of a semiconductor device.
Figure 4A:
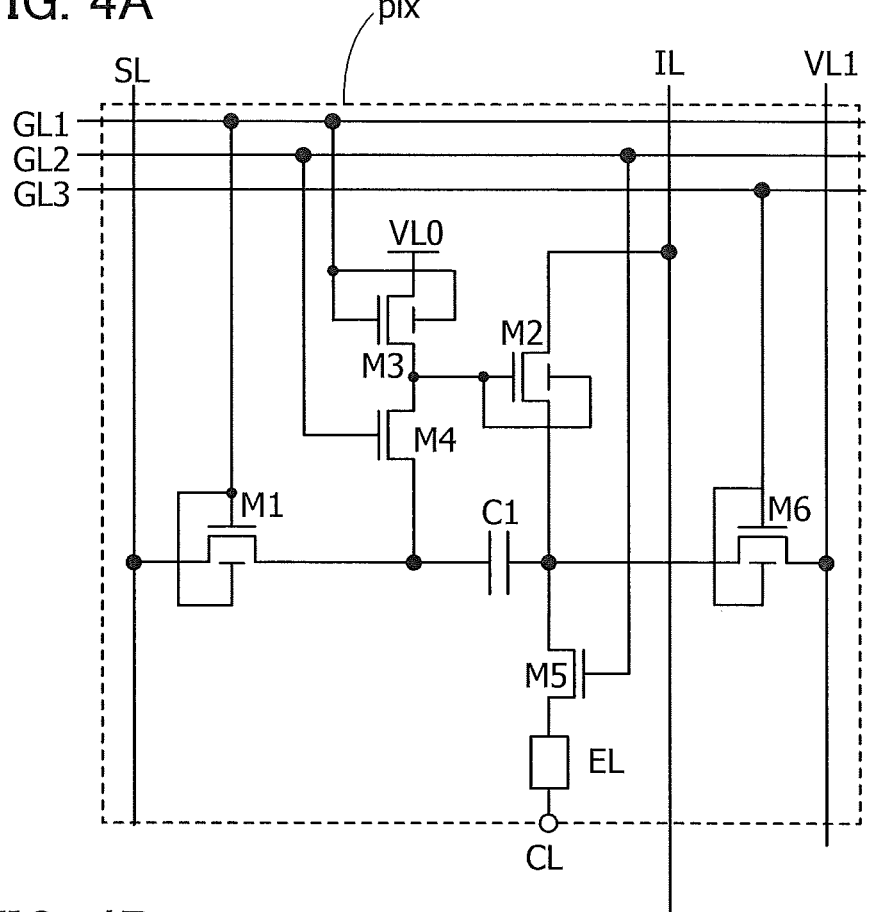
FIGS. 4A and 4B are a circuit diagram and a timing chart illustrating one embodiment of a semiconductor device.
Figure 4B:
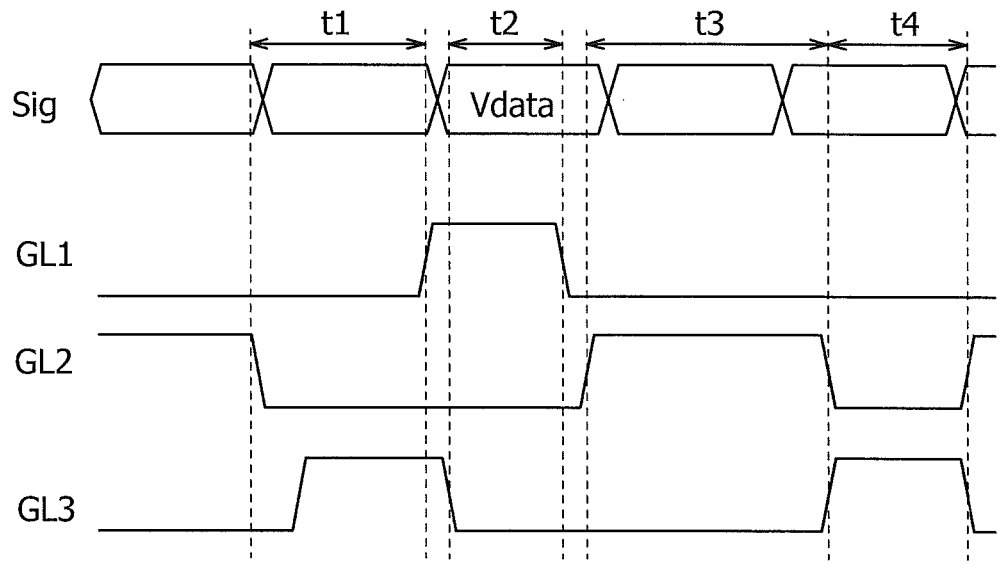
Figure 5:
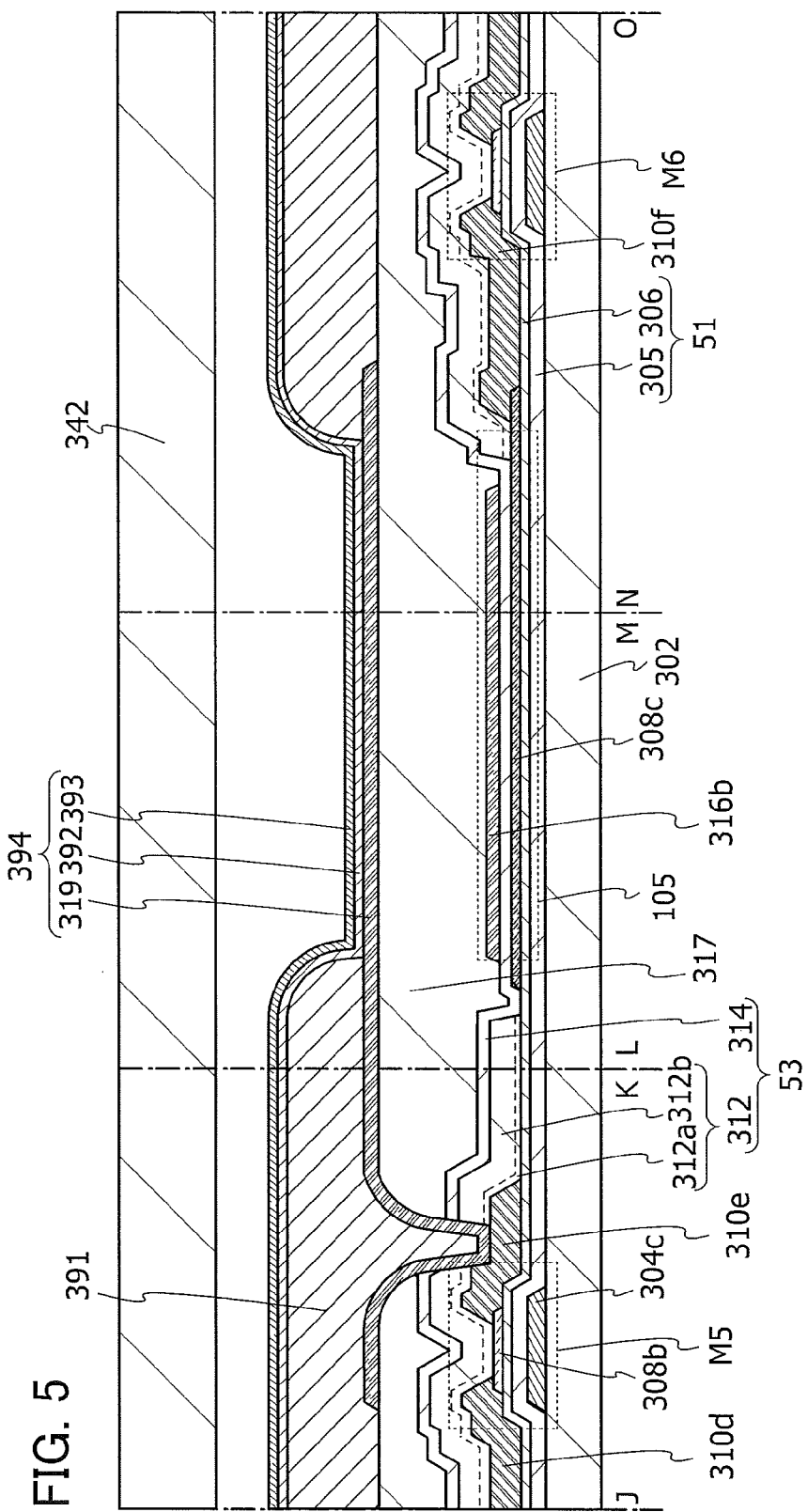
FIG. 5 is a cross-sectional view illustrating one embodiment of a method for manufacturing a semiconductor device.

Next, a specific structure of an element substrate included in the display device is described. Here, a display device that displays images by emission of an EL element is used as the display device, and FIG. 3 is a top view of a pixel pix included in the display device. FIG. 4A illustrates a circuit structure corresponding to the top view, and FIG. 4B illustrates a timing chart of the circuit structure. FIG. 5 is a cross-sectional view taken along dashed-dotted lines J-K, L-M, and N-O in the top view of FIG. 3.

In FIG. 3, the conductive film 304c functioning as a scan line extends substantially perpendicularly to a conductive film functioning as a signal line (in the horizontal direction in the drawing). The conductive film 310d functioning as a signal line extends substantially perpendicularly to a conductive film functioning as a scan line (in the vertical direction in the drawing). Note that the conductive film 304c functioning as a scan line is electrically connected to the scan line driver circuit 14 (see FIG. 2A), and the conductive film 310d functioning as a signal line is electrically connected to the signal line driver circuit 16 (see FIG. 2A).

The top view in FIG. 3 illustrates an arrangement example of transistors M1 to M6, a capacitor C1, and a light-emitting element EL included in the pixel pix. The top view in FIG. 3 also illustrates an arrangement example of wirings GL1 to GL3, SL, VL1, VL0, and IL. The wirings GL1 to GL3, SL, VL1, VL0, and IL are connected to electrodes serving as gates, sources, or drains of the transistors M1 to M6. Note that for connection between the wirings and the transistors, refer to the circuit structure in FIG. 4A.

When a pair of electrodes of the capacitor C1 is formed using a pair of light-transmitting conductive films, the pair of electrodes of the capacitor C1 can overlap the light-emitting element EL. Thus, even when the capacitor C1 is formed widely (in a large area) in the pixel pix, the aperture ratio is not decreased. Accordingly, a display device having capacitance increased while increasing the aperture ratio, typically 50% or more, preferably 60% or more can be provided. For example, in a high-resolution display device such as a liquid crystal display device, the area of a pixel is small and thus the area of a capacitor is also small. For this reason, the amount of charge stored in the capacitor is small in the high-resolution display device. However, since the capacitor C1 in this embodiment transmits light, when the capacitor is provided in a pixel, enough capacitance can be obtained in the pixel and the aperture ratio can be increased. Typically, the capacitor C1 can be favorably used for a high-resolution display device with a pixel density of 100 ppi or more, 200 ppi or more, or 300 ppi or more.

Next, a circuit structure and operation corresponding to the top view of the pixel pix in FIG. 3 are described.

FIG. 4A is a circuit diagram example of the pixel pix. The pixel pix includes the transistors M1 to M6, the capacitor C1, and the light-emitting element EL. Note that the transistor M1 and the transistors M3 to M6 function as switches and thus can be simply replaced with switches.

The potential of a pixel electrode of the light-emitting element EL is controlled by an image signal Sig input to the pixel pix. The luminance of the light-emitting element EL depends on a potential difference between the pixel electrode and a common electrode. For example, in the case where an OLED is used as the light-emitting element EL, one of an anode and a cathode functions as the pixel electrode and the other of the anode and the cathode functions as the common electrode. FIG. 4A illustrates the structure of the pixel pix in which the anode of the light-emitting element EL is used as the pixel electrode and the cathode of the light-emitting element EL is used as the common electrode.

The transistor M1 has a function of controlling conduction between the wiring SL and one of the pair of electrodes of the capacitor C1. The other of the pair of electrodes of the capacitor C1 is connected to one of the source and the drain of the transistor M2. The transistor M3 has a function of controlling conduction between the wiring VL0 and the gate of the transistor M2. The transistor M4 has a function of controlling conduction between one of the pair of electrodes of the capacitor C1 and the gate of the transistor M2. The transistor M5 has a function of controlling conduction between one of the source and the drain of the transistor M2 and the anode of the light-emitting element EL. The transistor M6 has a function of controlling conduction between one of the source and the drain of the transistor M2 and the wiring VL1.

In FIG. 4A, the other of the source and the drain of the transistor M2 is connected to the wiring IL.

The transistor M1 is turned on and off in accordance with the potential of the wiring GL1 connected to the gate of the transistor M1. The transistor M3 is turned on and off in accordance with the potential of the wiring GL1 connected to the gate of the transistor M3. The transistor M4 is turned on and off in accordance with the potential of the wiring GL2 connected to the gate of the transistor M4. The transistor M5 is turned on and off in accordance with the potential of the wiring GL2 connected to the gate of the transistor M5. The transistor M6 is turned on and off in accordance with the potential of the wiring GL3 connected to the gate of the transistor M6.

In the transistors included in the pixel pix, an oxide semiconductor or an amorphous, microcrystalline, polycrystalline, or single crystal semiconductor can be used. As the material of such a semiconductor, silicon, germanium, or the like can be given. When the transistors M1, M3, and M4 include oxide semiconductors in channel formation regions, the off-state current of the transistors M1, M3, and M4 can be extremely low. Furthermore, when the transistors M1, M3, and M4 having the above structure are used in the pixel pix, leakage of charge accumulated in the gate of the transistor M2 can be prevented effectively as compared to the case where transistors including a normal semiconductor such as silicon or germanium are used as the transistors M1, M3, and M4.

Accordingly, for example, in the case where the image signals Sig having the same image information are written to the pixel portion for some consecutive frame periods, like a still image, display of an image can be maintained even when drive frequency is low, that is, the number of operations of writing the image signals Sig to the pixel portion for a certain period is reduced. For example, by using a highly purified oxide semiconductor for semiconductor films of the transistors M1, M3, and M4, the interval between the operations of writing the image signals Sig can be 1 second or longer, preferably 3 seconds or longer, more preferably 10 seconds or longer. As the interval between the operations of writing the image signals Sig increases, power consumption can be further reduced.

In addition, since the potential of the image signal Sig can be held for a longer period, the quality of an image to be displayed can be prevented from being lowered even when the capacitor C1 for holding the potential of the gate of the transistor M2 is not provided in the pixel pix. Thus, it is possible to increase the aperture ratio of the pixel pix by reducing the size of the capacitor C1 or without providing the capacitor C1. Accordingly, the light-emitting element EL with long lifetime can be obtained, so that the reliability of the display device can be increased.

Note that in FIG. 4A, the pixel pix may further include another circuit element such as a transistor, a diode, a resistor, a capacitor, or an inductor as needed.

In FIG. 4A, the transistors each have the gate on at least one side of a semiconductor film; alternatively, the transistors may each have a pair of gates with a semiconductor film positioned therebetween. When one of the pair of gates is regarded as a back gate, potentials at the same level may be applied to a normal gate and the back gate, or a fixed potential such as a ground potential may be applied only to the back gate. By controlling the level of the potential applied to the back gate, the threshold voltage of the transistor can be controlled. By providing the back gate, a channel formation region is enlarged and drain current can be increased. Furthermore, the back gate facilitates formation of a depletion layer in the semiconductor film, which results in lower subthreshold swing. In FIG. 4A, for example, the semiconductor films of the transistors M1, M2, M3, and M6 are sandwiched between upper and lower gate electrodes. Thus, the transistors M1, M2, M3, and M6 are represented by different circuit symbols in FIG. 4A.

The transistors in FIG. 4A are all n-channel transistors. When the transistors in the pixel pix have the same channel type, it is possible to omit some of steps for forming the transistors, for example, a step of adding an impurity element imparting one conductivity type to the semiconductor film. Note that in the display device according to one embodiment of the present invention, not all the transistors in the pixel pix are necessarily n-channel transistors. In the case where the cathode of the light-emitting element EL is connected to a wiring CL, it is preferable that at least the transistor M2 be an n-channel transistor. In the case where the anode of the light-emitting element EL is connected to the wiring CL, it is preferable that at least the transistor M2 be a p-channel transistor.

In FIG. 4A, the transistors in the pixel pix each have a single-gate structure including one gate and one channel formation region; however, one embodiment of the present invention is not limited to this structure. Any or all of the transistors in the pixel pix may have a multi-gate structure including a plurality of gates electrically connected to each other and a plurality of channel formation regions.

FIG. 4B is a timing chart of the potentials of the wirings GL1 to GL3 connected to the pixel pix in FIG. 4A and the potential of the image signal Sig supplied to the wiring SL. Note that in the timing chart in FIG. 4B, all the transistors included in the pixel pix in FIG. 4A are n-channel transistors.

First, in a period t1, an L-level potential is applied to the wiring GL1, an L-level potential is applied to the wiring GL2, and the potential of a signal for switching from an L level to an H level is applied to the wiring GL3. Thus, the transistor M5 is switched from an on state to an off state, the transistors M1, M3, and M4 are turned off, and the transistor M6 is switched from an off state to an on state. The transistor M6 is turned on, so that a potential V0 of the wiring VL1 is applied to one of the source and the drain of the transistor M2 and the other of the pair of electrodes of the capacitor C1.

A potential Vano is applied to the wiring IL, and a potential Vcat is applied to the wiring CL. The potential Vano is preferably higher than the sum of the potential V0 and the threshold voltage Vthe of the light-emitting element EL. The potential V0 is preferably lower than the sum of the potential Vcat and the threshold voltage Vthe of the light-emitting element EL. With the potential V0 set in the above range, current can be prevented from flowing through the light-emitting element EL in the period t1.

Next, in a period t2, an H-level potential is applied to the wiring GL1, an L-level potential is applied to the wiring GL2, and an L-level potential is applied to the wiring GL3. Thus, the transistors M1 and M3 are turned on and the transistors M4 to M6 are turned off.

Note that in transition from the period t1 to the period t2, it is preferable that the potential applied to the wiring GL1 be changed from the L level to the H level and then the potential applied to the wiring GL3 be changed from the H level to the L level. This operation can prevent a change in the potential of one of the source and the drain of the transistor M2 and the other of the pair of electrodes of the capacitor C1 due to switching of the potential applied to the wiring GL1.

The potential Vano is applied to the wiring IL, and the potential Vcat is applied to the wiring CL. A potential Vdata of the image signal Sig is applied to the wiring SL, and a potential V1 is applied to the wiring VL0. The potential V1 is preferably higher than the sum of the potential Vcat and the threshold voltage Vth of the transistor M2 and lower than the sum of the potential Vano and the threshold voltage Vth of the transistor M2.

Note that in the pixel structure in FIG. 4A, even if the potential V1 is higher than the sum of the potential Vcat and the threshold voltage Vthe of the light-emitting element EL, the light-emitting element EL does not emit light as long as the transistor M5 is off. Thus, the allowable potential V0 range can be expanded and the allowable range of V1-V0 can be increased. As a result of increasing the degree of freedom of values for V1-V0, the threshold voltage of the transistor M2 can be obtained accurately even when time required to obtain the threshold voltage of the transistor M2 is reduced or limited.

By this operation, the potential V1 is input to the gate of the transistor M2, and the transistor M2 is turned on. Thus, charge in the capacitor C1 is discharged through the transistor M2, and the potentials of one of the source and the drain of the transistor M2 and the other of the pair of electrodes of the capacitor C1 each corresponding to the potential V0 start to rise. The potentials of one of the source and the drain of the transistor M2 and the other of the pair of electrodes of the capacitor C1 finally converge to the potential V1-Vth and the gate voltage of the transistor M2 converges to the threshold voltage Vth; then, the transistor M2 is turned off.

The potential Vdata of the image signal Sig applied to the wiring SL is applied to one of the pair of electrodes of the capacitor C1 through the transistor M1.

Next, in a period t3, an L-level potential is applied to the wiring GL1, an H-level potential is applied to the wiring GL2, and an L-level potential is applied to the wiring GL3. Thus, the transistors M4 and M5 are turned on and the transistors M1, M3, and M6 are turned off.

Note that in transition from the period t2 to the period t3, it is preferable that the potential applied to the wiring GL1 be changed from the H level to the L level and then the potential applied to the wiring GL2 be changed from the L level to the H level. This operation can prevent a change in the potential of one of the source and the drain of the transistor M2 and the other of the pair of electrodes of the capacitor C1 due to switching of the potential applied to the wiring GL1.

The potential Vano is applied to the wiring IL, and the potential Vcat is applied to the wiring CL.

The potential Vdata is applied to the gate of the transistor M2 by the above operation; thus, the gate voltage of the transistor M2 becomes Vdata-V1+Vth. Accordingly, the gate voltage of the transistor M2 can have the value to which the threshold voltage Vth is added. With this structure, variation in the threshold voltage Vth of the transistor M2 can be reduced. Thus, variation in the value of current supplied to the light-emitting element EL can be reduced, so that unevenness in luminance of the display device can be decreased.

When the potential applied to the wiring GL2 is varied greatly, the influence of variation in the threshold voltage of the transistor M5 on the value of current supplied to the light-emitting element EL can be prevented. In other words, the H-level potential applied to the wiring GL2 is much higher than the threshold voltage of the transistor M5, and the L-level potential applied to the wiring GL2 is much lower than the threshold voltage of the transistor M5 to secure switching of the transistor M5, so that the influence of variation in the threshold voltage of the transistor M5 on the value of current supplied to the light-emitting element EL can be prevented.

Next, in a period t4, an L-level potential is applied to the wiring GL1, an L-level potential is applied to the wiring GL2, and an H-level potential is applied to the wiring GL3. Thus, the transistor M6 is turned on and the transistors M1, M3, M4, and M5 are turned off.

In addition, the potential Vano is applied to the wiring IL and a monitor circuit is connected to the wiring IL.

By the above operation, drain current Id of the transistor M2 flows not to the light-emitting element EL but to the wiring VL1 through the transistor M6. The monitor circuit generates a signal including information about the value of the drain current Id by using the drain current Id flowing through the wiring VL1. The magnitude of the drain current Id depends on the mobility or size (channel length and channel width) of the transistor M2. Using the signal, the display device according to one embodiment of the present invention can correct the value of the potential Vdata of the image signal VSig supplied to the pixel pix. That is, the influence of variation in the mobility of the transistor M2 can be reduced.

Note that in the display device including the pixel pix in FIG. 4A, the operation in the period t4 is not necessarily always performed after the operation in the period t3. For example, in the display device, the operation in the period t4 may be performed after the operations in the periods t1 to t3 are repeated more than once. Alternatively, after the operation in the period t4 is performed on the pixels pix in one row, the light-emitting elements EL may be brought into a non-light-emitting state by writing an image signal corresponding to the lowest grayscale level 0 to the pixels pix in the row that have been subjected to the above operation. Then, the operation in the period t4 may be performed on the pixels pix in the next row.

In the display device including the pixel pix in FIG. 4A, the other of the source and the drain of the transistor M2 is electrically isolated from the gate of the transistor M2, so that their potentials can be controlled individually. Accordingly, in the period t2, the potential of the other of the source and the drain of the transistor M2 can be set higher than a potential obtained by adding the threshold voltage Vth to the gate potential of the transistor M2. Thus, when the transistor M2 is normally on, that is, when the threshold voltage Vth is negative, charge can be accumulated in the capacitor C1 until the source potential of the transistor M2 becomes higher than the gate potential V1 of the transistor M2. Accordingly, in the display device according to one embodiment of the present invention, even when the transistor M2 is normally on, the threshold voltage can be obtained in the period t2, and in the period t3, the gate voltage of the transistor M2 can be set to a value obtained by taking the threshold voltage Vth into account.

Next, FIG. 5 illustrates the cross-sectional view taken along the dashed-dotted lines J-K, L-M, and N-O in FIG. 3.

The transistor 103 (corresponding to the transistor M5 in FIG. 3) includes the conductive film 304c functioning as a gate electrode, insulating films 305 and 306 collectively functioning as the gate insulating film 51, the oxide semiconductor film 308b which is formed over the gate insulating film 51 and in which a channel region is formed, and the conductive films 310d and 310e functioning as a source electrode and a drain electrode. Furthermore, insulating films 312 and 314 collectively functioning as the inorganic insulating film 53 are provided as protective films over the conductive films 310d and 310e.

The capacitor 105 (corresponding to the capacitor C1 in FIG. 3) includes the metal oxide film 308c functioning as one electrode, the insulating film 314 functioning as a dielectric film, and the conductive film 316b functioning as the other electrode. The metal oxide film 308c is formed over the gate insulating film 51. The transistor M6 is connected to the metal oxide film 308c through the conductive film 310f functioning as the source electrode and the drain electrode of the transistor M6.

The organic insulating film 317 is formed over the inorganic insulating film 53. In addition, the conductive film 319 functioning as a pixel electrode is formed over the organic insulating film 317. The conductive film 319 is connected to the conductive film 310e through an opening formed in the inorganic insulating film 53 and the organic insulating film 317.

The insulating layer 391 is provided over the organic insulating film 317 and the conductive film 319. Through an opening formed in the insulating layer 391, the light-emitting layer 392 and the conductive film 393 of the light-emitting element 394 is provided over the conductive film 319.

Figure 6:
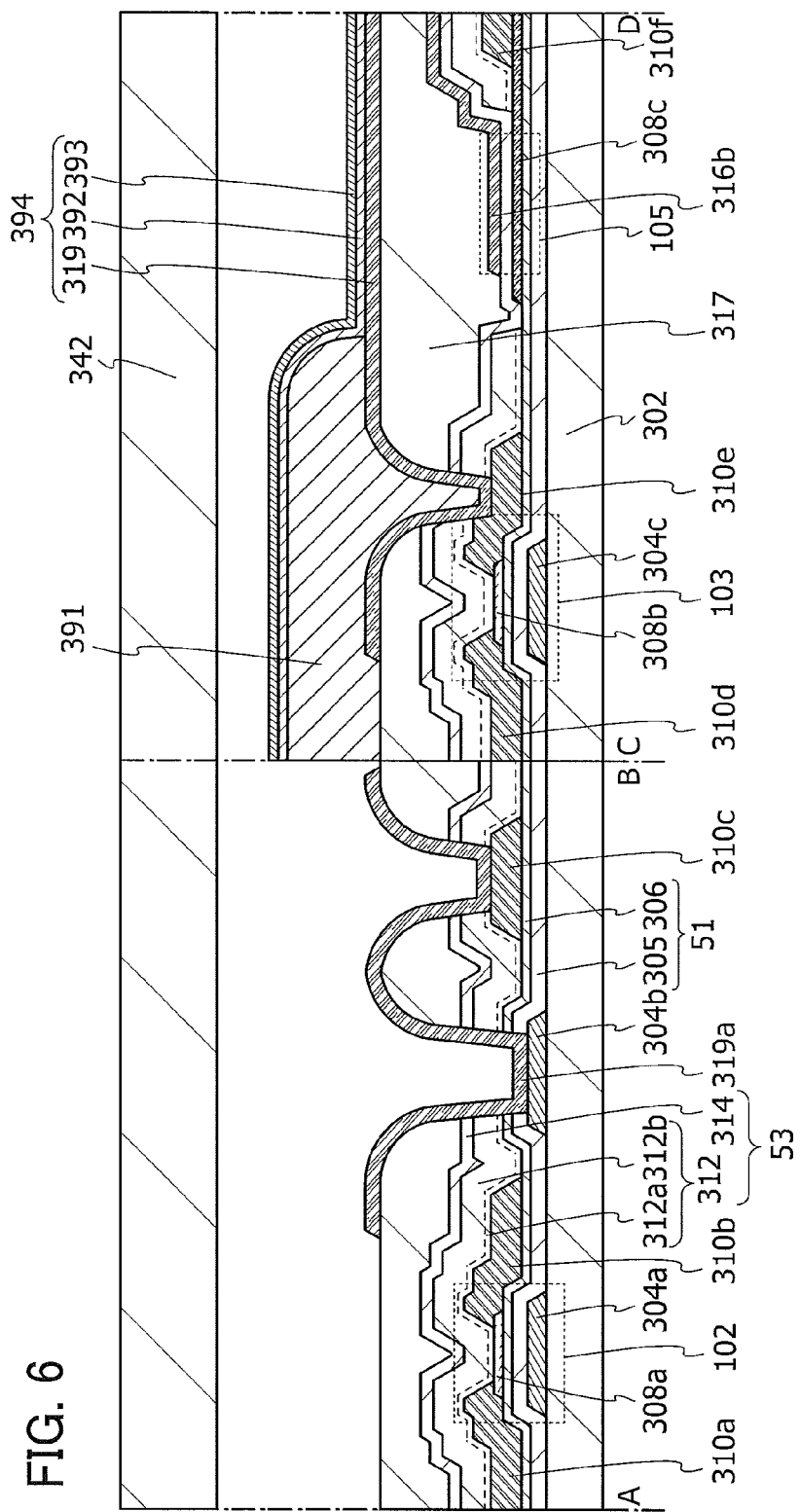
FIG. 6 is a cross-sectional view illustrating one embodiment of a method for manufacturing a semiconductor device.

FIG. 6 illustrates a cross-sectional view (the left part (A-B)) of the driver circuit portion including the scan line driver circuit 14 and the signal line driver circuit 16 in FIG. 2A (its top view is omitted) and a cross-sectional view (the right part (C-D)) of the pixel in FIG. 5.

In the driver circuit portion, a transistor 102 includes a conductive film 304a functioning as a gate electrode, the insulating films 305 and 306 collectively functioning as the gate insulating film 51, an oxide semiconductor film 308a in which a channel region is formed, and conductive films 310a and 310b functioning as a source electrode and a drain electrode. The oxide semiconductor film 308a is formed over the gate insulating film 51. Furthermore, the insulating films 312 and 314 collectively functioning as the inorganic insulating film 53 are provided as protective films over the conductive films 310a and 310b.

In the driver circuit portion, the conductive film 304b formed at the same time as the conductive films 304a and 304c and a conductive film 310c formed at the same time as the conductive films 310a, 310b, 310d, 310e, and 310f are connected to each other through a conductive film 319a formed at the same time as the conductive film 319.

The conductive films 304b and 319a are connected to each other through an opening formed in the gate insulating film 51, the inorganic insulating film 53, and the organic insulating film 317. Furthermore, the conductive films 310c and 319a are connected to each other through an opening formed in the insulating films 312 and 314 and the organic insulating film 317.

Here, components of the display device in FIG. 5 and FIG. 6 are described below.

The conductive films 304a, 304b, and 304c are formed over the substrate 302. The conductive film 304a functions as a gate electrode of the transistor in the driver circuit portion. The conductive film 304b is formed in the driver circuit portion and connected to the conductive film 310c. The conductive film 304c is formed in the pixel portion 11 and functions as a gate electrode of the transistor in the pixel portion.

There is no particular limitation on the material and the like of the substrate 302 as long as the material has heat resistance high enough to withstand at least heat treatment performed later. For example, a glass substrate, a ceramic substrate, a quartz substrate, or a sapphire substrate may be used as the substrate 302. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 302. Alternatively, any of these substrates provided with a semiconductor element may be used as the substrate 302. In the case where a glass substrate is used as the substrate 302, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm); thus, a large display device can be manufactured.

Alternatively, a flexible substrate may be used as the substrate 302, and the transistor may be provided directly on the flexible substrate. Alternatively, a separation layer may be provided between the substrate 302 and the transistor. The separation layer can be used when part or all of an element portion formed over the separation layer is completed, separated from the substrate 302, and then transferred to another substrate. In such a case, the transistor can be transferred to a substrate having low heat resistance or a flexible substrate.

For the conductive films 304a, 304b, and 304c, a metal element selected from aluminum, chromium, copper, tantalum, titanium, molybdenum, or tungsten; an alloy containing any of these metal elements as a component; an alloy containing these metal elements in combination; or the like can be used. Alternatively, one or more metal elements selected from manganese or zirconium may be used. The conductive films 304a, 304b, and 304c may each have a single-layer structure or a layered structure including two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, or a three-layer structure in which a titanium film, an aluminum film, and a titanium film are stacked in that order can be used. Alternatively, an alloy film or a nitride film that contains aluminum and one or more elements selected from titanium, tantalum, tungsten, molybdenum, chromium, neodymium, or scandium may be used.

The conductive films 304a, 304b, and 304c can be foiled using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a layered structure formed using the light-transmitting conductive material and the metal element.

The insulating films 305 and 306 are formed over the substrate 302 and the conductive films 304a, 304b, and 304c. The insulating films 305 and 306 function as the gate insulating film 51 of the transistor in the driver circuit portion and the gate insulating film 51 of the transistor in the pixel portion 11.

The insulating film 305 is preferably formed using a nitride insulating film containing silicon nitride, silicon nitride oxide, aluminum nitride, or aluminum nitride oxide, for example.

The insulating film 306 may be formed to have a single-layer structure or a layered structure using, for example, any of silicon oxide, silicon oxynitride, silicon nitride oxide, silicon nitride, aluminum oxide, hafnium oxide, gallium oxide, and a Ga—Zn-based metal oxide. Alternatively, the insulating film 306 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage of the transistor can be reduced.

The total thickness of the insulating films 305 and 306 is 5 to 400 nm, preferably 10 to 300 nm, more preferably 50 to 250 nm.

The oxide semiconductor films 308a and 308b and the metal oxide film 308c are formed over the insulating film 306. The oxide semiconductor film 308a is formed in a position overlapping the conductive film 304a and functions as a channel region of the transistor in the driver circuit portion. The oxide semiconductor film 308b is formed in a position overlapping the conductive film 304c and functions as a channel region of the transistor in the pixel portion. The metal oxide film 308c is connected to the conductive film 310f and functions as an electrode of the capacitor 105. Note that the conductive film 310f functions as a source electrode and a drain electrode of a transistor different from the transistor 103.

The oxide semiconductor films 308a and 308b and the metal oxide film 308c are each typically an In—Ga oxide film, an In—Zn oxide film, or an In-M-Zn oxide film (M represents Al, Ti, Ga, Y, Zr, La, Ce, Nd, Sn, or Hf). Note that the oxide semiconductor films 308a and 308b and the metal oxide film 308c have light-transmitting properties.

Note that in the case where the oxide semiconductor films 308a and 308b and the metal oxide film 308c are each an In-M-Zn oxide film, when summation of In and M is assumed to be 100 atomic %, the proportions of In and M, not taking Zn and O into consideration, are greater than or equal to 25 atomic % and less than 75 atomic %, respectively, preferably greater than or equal to 34 atomic % and less than 66 atomic %, respectively.

The energy gap of each of the oxide semiconductor films 308a and 308b and the metal oxide film 308c is 2 eV or more, preferably 2.5 eV or more, more preferably 3 eV or more. In this manner, the off-state current of a transistor can be reduced by using an oxide semiconductor having a wide energy gap.

The thickness of each of the oxide semiconductor films 308a and 308b and the metal oxide film 308c is 3 to 200 nm, preferably 3 to 100 nm, more preferably 3 to 50 nm.

For each of the oxide semiconductor films 308a and 308b and the metal oxide film 308c, an In—Ga—Zn oxide with an atomic ratio of In:Ga:Zn=1:1:1, 1:1:1.2, or 3:1:2 can be used. Note that the atomic ratio of each of the oxide semiconductor films 308a and 308b and the metal oxide film 308c varies within a range of ±20% of the above atomic ratio as an error.

The oxide semiconductor films 308a and 308b and the metal oxide film 308c may each have a non-single crystal structure, for example. The non-single crystal structure includes a c-axis aligned crystalline oxide semiconductor (CAAC-OS) described later, a polycrystalline structure, a microcrystalline structure described later, or an amorphous structure, for example. Among the non-single crystal structures, the amorphous structure has the highest density of defect states, whereas CAAC-OS has the lowest density of defect states. Note that the oxide semiconductor films 308a and 308b and the metal oxide film 308c have the same crystallinity.

Note that each of the oxide semiconductor films 308a and 308b and the metal oxide film 308c may be a mixed film including two or more of the following: a region having an amorphous structure, a region having a microcrystalline structure, a region having a polycrystalline structure, a CAAC-OS region, and a region having a single-crystal structure. Furthermore, the mixed film has a layered structure of two or more of a region having an amorphous structure, a region having a microcrystalline structure, a region having a polycrystalline structure, a CAAC-OS region, and a region having a single-crystal structure in some cases.

When silicon or carbon, which is one of elements belonging to Group 14, is contained in the oxide semiconductor films 308a and 308b, oxygen vacancies are increased in the oxide semiconductor films 308a and 308b, and the oxide semiconductor films 308a and 308b become n-type. Thus, the concentration of silicon or carbon (the concentration is measured by SIMS) of each of the oxide semiconductor films 308a and 308b is lower than or equal to $2 \times 10^{18}$ atoms/cm$^3$, preferably lower than or equal to $2 \times 10^{17}$ atoms/cm$^3$.

Furthermore, the concentration of alkali metal or alkaline earth metal of each of the oxide semiconductor films 308a and 308b that is measured by SIMS is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, which may increase the off-state current of the transistor. Thus, it is preferable to reduce the concentration of alkali metal or alkaline earth metal of each of the oxide semiconductor films 308a and 308b.

When nitrogen is contained in the oxide semiconductor films 308a and 308b, electrons serving as carriers are generated and carrier density increases, so that the oxide semiconductor films 308a and 308b easily become n-type. Thus, a transistor including an oxide semiconductor that contains nitrogen is likely to be normally on. For this reason, nitrogen in the oxide semiconductor film is preferably reduced as much as possible; the concentration of nitrogen that is measured by SIMS is preferably, for example, lower than or equal to $5 \times 10^{18}$ atoms/cm$^3$.

An oxide semiconductor film with low carrier density is used as each of the oxide semiconductor films 308a and 308b. For example, an oxide semiconductor film whose carrier density is lower than or equal to $1 \times 10^{17}$/cm$^3$, preferably lower than or equal to $1 \times 10^{15}$/cm$^3$, more preferably lower than or equal to $1 \times 10^{13}$/cm$^3$, much more preferably lower than or equal to $1 \times 10^{11}$/cm$^3$ is used as each of the oxide semiconductor films 308a and 308b.

Note that, without limitation to those described above, a material with an appropriate composition may be used depending on required semiconductor characteristics and electrical characteristics (e.g., field-effect mobility and threshold voltage) of a transistor. Furthermore, to obtain required semiconductor characteristics of a transistor, it is preferable that carrier density, impurity concentration, defect density, the atomic ratio of a metal element to oxygen, interatomic distance, density, and the like of the oxide semiconductor films 308a and 308b be set appropriate.

The oxide semiconductor films 308a and 308b are in contact with films each formed using a material that can improve characteristics of an interface with the oxide semiconductor film, such as the insulating films 306 and 312. Thus, the oxide semiconductor films 308a and 308b function as semiconductors, so that transistors including the oxide semiconductor films 308a and 308b have excellent electrical characteristics.

Note that it is preferable to use, as each of the oxide semiconductor films 308a and 308b, an oxide semiconductor film in which impurity concentration is low and density of defect states is low because the transistor can have excellent electrical characteristics. Here, a state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor has few carrier generation sources, and thus has low carrier density in some cases. Thus, in some cases, a transistor in which a channel region is formed in the oxide semiconductor film rarely has negative threshold voltage (is rarely normally on). A highly purified intrinsic or substantially highly purified intrinsic oxide semiconductor film has low density of defect states, and thus has low density of trap states in some cases. Furthermore, the highly purified intrinsic or substantially highly purified intrinsic oxide semiconductor film has extremely low off-state current. Even when an element has a channel width of $1 \times 10^6$ μm and a channel length of 10 μm, off-state current can be lower than or equal to the measurement limit of a semiconductor parameter analyzer, i.e., lower than or equal to $1 \times 10^{-13}$ A, at a voltage (drain voltage) between a source electrode and a drain electrode of 1 to 10 V. Thus, the transistor whose channel region is formed in the oxide semiconductor film has few variations in electrical characteristics and high reliability in some cases. Charge trapped by the trap states in the oxide semiconductor film takes a long time to be released and may behave like fixed charge. Thus, the transistor whose channel region is formed in the oxide semiconductor film having high density of trap states has unstable electrical characteristics in some cases. Examples of the impurities include hydrogen, nitrogen, alkali metal, and alkaline earth metal.

The metal oxide film 308c is formed by processing an oxide semiconductor film formed at the same time as the oxide semiconductor films 308a and 308b. Thus, the metal oxide film 308c contains a metal element similar to that in each of the oxide semiconductor films 308a and 308b. Furthermore, the metal oxide film 308c has a crystal structure similar to or different from that of each of the oxide semiconductor films 308a and 308b. By adding impurities or oxygen vacancies to the oxide semiconductor film formed at the same time as the oxide semiconductor films 308a and 308b, the oxide semiconductor film has conductivity and thus functions as an electrode of a capacitor. An example of the impurities contained in the oxide semiconductor film is hydrogen. Instead of hydrogen, as the impurity, boron, phosphorus, tin, antimony, a rare gas element, alkali metal, alkaline earth metal, or the like may be contained. Alternatively, the metal oxide film 308c is formed at the same time as the oxide semiconductor films 308a and 308b and has increased conductivity by including oxygen vacancies generated by plasma damage or the like. Alternatively, the metal oxide film 308c is formed at the same time as the oxide semiconductor films 308a and 308b and has increased conductivity by containing an impurity and including oxygen vacancies generated by plasma damage or the like.

The oxide semiconductor films 308a and 308b and the metal oxide film 308c are formed over the insulating film 306 and have different impurity concentrations. Specifically, the metal oxide film 308c has higher impurity concentration than the oxide semiconductor films 308a and 308b. For example, the concentration of hydrogen contained in each of the oxide semiconductor films 308a and 308b is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, much more preferably lower than or equal to $5 \times 10^{17}$ atoms/cm$^3$, still more preferably lower than or equal to $1 \times 10^{16}$ atoms/cm$^3$. The concentration of hydrogen contained in the metal oxide film 308c is higher than or equal to $8 \times 10^{19}$ atoms/cm$^3$, preferably higher than or equal to $1 \times 10^{20}$ atoms/cm$^3$, more preferably higher than or equal to $5 \times 10^{20}$ atoms/cm$^3$. The concentration of hydrogen contained in the metal oxide film 308c is twice or more, preferably 10 times or more that in each of the oxide semiconductor films 308a and 308b.

By exposing the oxide semiconductor film formed at the same time as the oxide semiconductor films 308a and 308b to plasma, the oxide semiconductor film can be damaged, so that oxygen vacancies can be formed. For example, when a film is formed over the oxide semiconductor film by plasma-enhanced CVD or sputtering, the oxide semiconductor film is exposed to plasma and oxygen vacancies are generated. Alternatively, when the oxide semiconductor film is exposed to plasma in etching treatment for formation of the insulating film 312, oxygen vacancies are generated. Alternatively, when the oxide semiconductor film is exposed to plasma of, for example, hydrogen, a rare gas, ammonia, a mixed gas of oxygen and hydrogen, oxygen vacancies are generated. As a result, the conductivity of the oxide semiconductor film is increased, so that the oxide semiconductor film has conductivity and functions as the metal oxide film 308c.

In other words, the metal oxide film 308c is formed using an oxide semiconductor film having high conductivity. It can also be said that the metal oxide film 308c is formed using a metal oxide film having high conductivity.

In the case where a silicon nitride film is used as the insulating film 314, the silicon nitride film contains hydrogen. Thus, when hydrogen in the insulating film 314 is diffused into the oxide semiconductor film formed at the same time as the oxide semiconductor films 308a and 308b, hydrogen is bonded to oxygen and electrons serving as carriers are generated in the oxide semiconductor film. When the silicon nitride film is formed by plasma-enhanced CVD or sputtering, the oxide semiconductor film is exposed to plasma and oxygen vacancies are generated in the oxide semiconductor film. When hydrogen contained in the silicon nitride film enters the oxygen vacancies, electrons serving as carriers are generated. As a result, the conductivity of the oxide semiconductor film is increased, so that the oxide semiconductor film becomes the metal oxide film 308c.

The metal oxide film 308c has lower resistivity than the oxide semiconductor films 308a and 308b. The resistivity of the metal oxide film 308c is preferably greater than or equal to $1\times10^{-8}$ times and less than $1\times10^{-1}$ times the resistivity of each of the oxide semiconductor films 308a and 308b. The resistivity of the metal oxide film 308c is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

Note that one embodiment of the present invention is not limited thereto, and it is possible that the metal oxide film 308c be not in contact with the insulating film 314 depending on circumstances.

Furthermore, one embodiment of the present invention is not limited thereto, and the metal oxide film 308c may be formed by a process different from that of the oxide semiconductor film 308a or 308b depending on circumstances. In that case, the metal oxide film 308c may include a material different from that of the oxide semiconductor film 308a or 308b. For example, the metal oxide film 308c may include indium tin oxide (hereinafter referred to as ITO) or indium zinc oxide.

In the display device in this embodiment, a capacitor has light-transmitting properties. Thus, the capacitor can overlap the light-emitting element 394, so that the aperture ratio of a pixel can be increased while the occupation area of the capacitor is increased.

The conductive films 310a, 310b, 310c, 310d, 310e, and 310f are formed to have a single-layer structure or a layered structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in that order, a three-layer structure in which a molybdenum film or a molybdenum nitride film, an aluminum film or a copper film, and a molybdenum film or a molybdenum nitride film are stacked in that order, or the like can be used. Note that a transparent conductive material containing indium oxide, tin oxide, or zinc oxide may be used.

The insulating films 312 and 314 are formed over the insulating film 306, the oxide semiconductor films 308a and 308b, the metal oxide film 308c, and the conductive films 310a, 310b, 310c, 310d, 310e, and 310f. For the insulating film 312, in a manner similar to that of the insulating film 306, a material that can improve characteristics of the interface with the oxide semiconductor film is preferably used. The insulating film 312 can be formed using an oxide insulating film. Here, the insulating film 312 is formed by stacking insulating films 312a and 312b.

The insulating film 312a is an oxide insulating film through which oxygen is passed. Note that the insulating film 312a also functions as a film that relieves damage to the oxide semiconductor films 308a and 308b and the metal oxide film 308c at the time of forming the insulating film 312b later.

As the insulating film 312a, a silicon oxide film, a silicon oxynitride film, or the like with a thickness of 5 to 150 nm, preferably 5 to 50 nm can be used. In this specification, a silicon oxynitride film means a film that includes more oxygen than nitrogen, and a silicon nitride oxide film means a film that includes more nitrogen than oxygen.

The insulating film 312a is an oxide insulating film. The oxide insulating film preferably contains nitrogen and has a small number of defects.

Typical examples of the oxide insulating film containing nitrogen and having a small number of defects include a silicon oxynitride film and an aluminum oxynitride film.

In an ESR spectrum at 100 K or lower of the oxide insulating film with a small number of defects, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The distance between the first and second signals and the distance between the second and third signals that are obtained by ESR measurement using an X-band are each approximately 5 mT. The spin density at a g-factor in the range from 2.037 or more and 2.039 or less to 1.964 or more and 1.966 or less is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the spin density at a g-factor in the range from 2.037 or more and 2.039 or less to 1.964 or more and 1.966 or less is, the smaller amount of nitrogen oxide the oxide insulating film contains.

When the insulating film 312a contains a small amount of nitrogen oxide as described above, the carrier trap at the interface between the insulating film 312a and the oxide semiconductor film can be inhibited. Thus, a change in the threshold voltage of the transistor included in the display device can be reduced, which leads to a reduced change in the electrical characteristics of the transistor.

The insulating film 312a preferably has a nitrogen concentration measured by secondary ion mass spectrometry (SIMS) of lower than or equal to $6\times10^{20}$ atoms/cm$^3$. In that case, nitrogen oxide is unlikely to be generated in the insulating film 312a, so that the carrier trap at the interface between the insulating film 312a and the oxide semiconductor films 308a and 308b can be inhibited. Furthermore, a change in the threshold voltage of the transistor included in the display device can be reduced, which leads to a reduced change in the electrical characteristics of the transistor.

Note that when the insulating film 312a contains nitrogen oxide and ammonia, nitrogen oxide and ammonia react with each other in heat treatment in a manufacturing step and a nitrogen gas formed by the reaction of nitrogen oxide is released. As a result, the nitrogen concentration and the content of nitrogen oxide in the insulating film 312a can be reduced. Furthermore, the carrier trap at the interface between the insulating film 312a and the oxide semiconductor films 308a and 308b can be inhibited. Furthermore, a change in the threshold voltage of the transistor included in the display device can be reduced, which leads to a reduced change in the electrical characteristics of the transistor.

Note that in the insulating film 312a, all oxygen entering the insulating film 312a from the outside does not move to the outside of the insulating film 312a and some oxygen remains in the insulating film 312a. Furthermore, movement of oxygen occurs in the insulating film 312a in some cases in such a manner that oxygen enters the insulating film 312a and oxygen contained in the insulating film 312a is moved to the outside of the insulating film 312a.

When the oxide insulating film through which oxygen is passed is formed as the insulating film 312a, oxygen released from the insulating film 312b provided over the insulating film 312a can be moved to the oxide semiconductor films 308a and 308b through the insulating film 312a.

The insulating film 312b is in contact with the insulating film 312a. The insulating film 312b is preferably formed using an oxide insulating film that contains oxygen at higher proportion than the stoichiometric composition. Part of oxygen is released by heating from the oxide insulating film containing oxygen at higher proportion than the stoichiometric composition. The oxide insulating film containing oxygen at higher proportion than the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the surface temperature of the film in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness 30 to 500 nm, preferably 50 to 400 nm can be used as the insulating film 312b.

Furthermore, it is preferable that the number of defects in the insulating film 312b be small, typically the spin density of a signal that appears at g=2.001 due to a dangling bond of silicon, be lower than $1.5 \times 10^{18}$ spins/cm$^3$, preferably lower than or equal to $1 \times 10^{18}$ spins/cm$^3$ by ESR measurement. Note that the insulating film 312b is provided more distant from the oxide semiconductor films 308a and 308b than the insulating film 312a is; thus, the insulating film 312b may have higher defect density than the insulating film 312a.

It is possible to prevent outward diffusion of oxygen from the oxide semiconductor films 308a and 308b and the metal oxide film 308c by providing a nitride insulating film having a blocking effect against oxygen, hydrogen, water, alkali metal, alkaline earth metal, and the like as the insulating film 314. The nitride insulating film is formed using silicon nitride, silicon nitride oxide, aluminum nitride, aluminum nitride oxide, or the like.

Note that over the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used. To control the capacitance of the capacitor, a nitride insulating film or an oxide insulating film may be provided over the nitride insulating film having a blocking effect against oxygen, hydrogen, water, alkali metal, alkaline earth metal, and the like, as appropriate.

The conductive film 316b is formed over the insulating film 314. The conductive film 316b can function as an electrode of the capacitor.

The conductive film 316b can be formed using a conductive material having a light-transmitting property. As the conductive material having a light-transmitting property, indium oxide including tungsten oxide, indium zinc oxide including tungsten oxide, indium oxide including titanium oxide, indium tin oxide including titanium oxide, ITO, indium zinc oxide, indium tin oxide to which silicon oxide is added, or the like can be used.

For the organic insulating film 317, an organic resin such as an acrylic resin, polyimide, or an epoxy resin can be used. The thickness of the organic insulating film 317 is 500 to 5000 nm, preferably 1000 to 3000 nm. In the case where the thickness of the organic insulating film 317 is larger than or equal to the above thickness, a depressed portion of the conductive film 316b can be filled with the organic insulating film 317; thus, unevenness of a region on which an alignment film 320 is formed can be reduced.

By forming the organic insulating film 317 using an organic resin, at least the depressed portion of the conductive film 316b functioning as a pixel electrode can be filled with the organic insulating film 317, so that components of the light-emitting element 394 can be formed on a flat surface. Thus, in the light-emitting element 394, short-circuit between the electrodes, or the like can be reduced and yield can be improved.

The conductive films 319 and 319a are formed over the organic insulating film 317. The conductive film 319 functions as a pixel electrode. The conductive film 319a electrically connects the conductive film 304b to the conductive film 310c through the opening foamed in the gate insulating film 51, the inorganic insulating film 53, and the organic insulating film 317. That is, the conductive film 319a functions as a connection electrode that connects the conductive film 304b to the conductive film 310c.

The organic insulating film 317 is not limited the above description. For example, the organic insulating film 317 can function as a color filter or a black matrix. For example, in the case where the organic insulating film 317 functions as a color filter, the organic insulating film 317 colored in accordance with red pixels, blue pixels, and green pixels, for example, may be formed.

The conductive films 319 and 319a can be formed using a light-transmitting conductive material as in the conductive film 316b. Note that in the case where the conductive film 319 is used as the anode of the light-emitting element 394, the conductive film 319 may be formed using a light-transmitting film of indium tin oxide or the like whose work function is higher than that of the light-emitting layer 392.

To form a connection structure in which the conductive film 304a is in direct contact with the conductive film 310c, it is necessary to perform patterning for forming an opening in the insulating films 305 and 306 and to four a mask before the conductive film 310c is formed. However, the photomask is not needed to obtain the connection structure in FIG. 17. When the conductive film 304a is connected to the conductive film 310c with the conductive film 319a as illustrated in FIG. 6, it is not necessary to form a connection portion where the conductive film 304a is in direct contact with the conductive film 310c. Thus, the number of photomasks can be reduced by one. That is, the number of steps for forming a display device can be reduced.

The insulating layer 391 having a function of separating the light-emitting elements 394 in adjacent pixels, that is, the insulating layer 391 functioning as a partition is formed over the organic insulating film 317 and the conductive film 319. The insulating layer 391 has insulating properties and can be formed using an organic insulating film or an inorganic insulating film, for example. As the organic insulating film, for example, a polyimide-based resin, a polyamide-based resin, an acrylic-based resin, a siloxane-based resin, an epoxy-based resin, a phenol-based resin, or the like can be used. As the inorganic insulating material, silicon oxide, silicon oxynitride, or the like can be used. In particular, a photosensitive organic resin material is preferably used because the insulating layer 391 is easily formed.

The light-emitting layer 392 is formed over the conductive film 319 and the insulating layer 391. The light-emitting layer 392 includes at least a light-emitting layer containing a light-emitting substance. In addition to the light-emitting layer, a functional layer such as a hole-injection layer, a hole-transport layer, an electron-transport layer, an electron-injection layer, or a charge generation layer may be formed. In the light-emitting layer 392, electrons and holes are injected from a pair of electrodes (here, the conductive films 319 and 393), and current flows. Then, the electrons and holes are recombined, so that the light-emitting substance is excited. When the light-emitting substance returns to a ground state from the excited state, light is emitted.

The conductive film 393 is formed over the light-emitting layer 392. In the case where the conductive film 393 is used as the cathode of the light-emitting element 394, the conductive film 393 is preferably formed using a material that has a low work function and can inject electrons into the light-emitting element 394. As well as a single layer of a metal having a low work function, a stack in which a metal material such as aluminum, a conductive oxide material such as indium tin oxide, or a semiconductor material is formed over a several-nanometer-thick buffer layer formed using an alkali metal or an alkaline earth metal having a low work function may be used as the conductive film 393. As the buffer layer, an oxide of an alkaline earth metal, a halide, a magnesium-silver alloy, or the like can also be used. Note that light emitted from the light-emitting layer 392 can be red (R), green (G), or blue (B). Alternatively, a light-emitting element that emits light of white, yellow, or another color can be used.

Note that in the case where light emitted from the light-emitting layer 392 is white, a colored film (not illustrated) may be formed over the substrate 302. The colored film functions as a color filter. A light-blocking film adjacent to the colored film can be formed over the substrate 302. The light-blocking film functions as a black matrix. Alternatively, a color conversion layer may be formed instead of the colored film, or the colored film is not necessarily formed in the case where the display device displays white and black images.

The colored film transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film has a function of blocking light in a specific wavelength range, and can be a metal film or an organic insulating film including a black pigment or the like.

In a space between a substrate 342 and the substrate 302, a drying agent may be provided to inhibit deterioration of the light-emitting element 394 due to moisture. Alternatively, the space may be filled with a liquid crystal layer, a resin, or the like.

Figure 42:
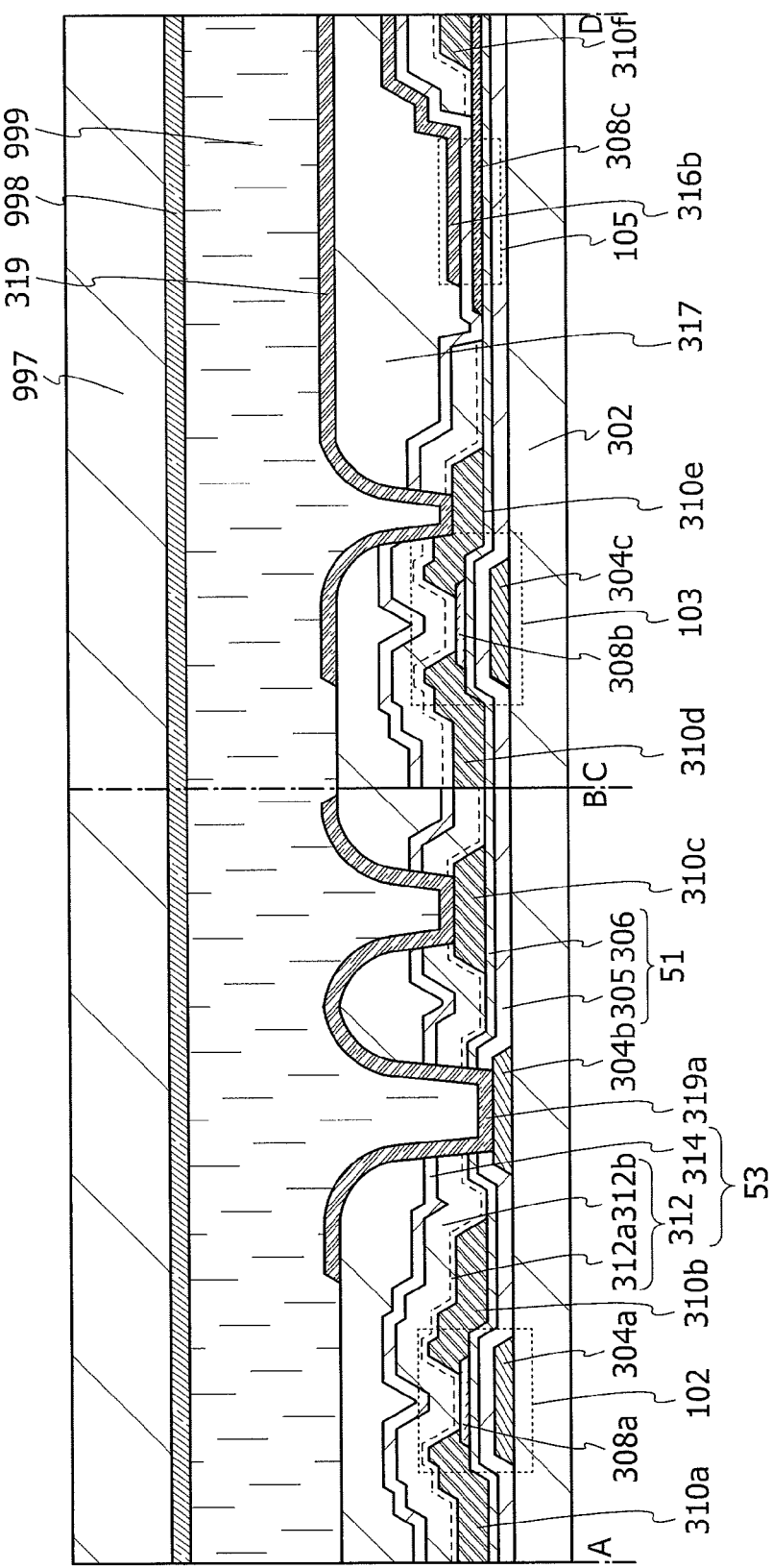
FIG. 42 is a cross-sectional view illustrating one embodiment of a semiconductor device.

FIG. 42 is a cross-sectional view in the case of the pixel 301 illustrated in FIG. 2B including the liquid crystal element 31. In FIG. 42, a counter substrate 997 is provided in addition to the element substrate described in this embodiment. The counter substrate 997 is provided with a counter electrode 998. Note that a space between the element substrate and the counter substrate is filled with a liquid crystal 999, and the liquid crystal between the counter electrode and the pixel electrode forms a liquid crystal element.

A formation method of the element portion over the substrate 302 in the display device in FIG. 6 is described with reference to FIGS. 7A to 7C, FIGS. 8A to 8C, FIGS. 9A and 9B, and FIGS. 10A to 10C, FIGS. 11A to 11C, and FIGS. 12A and 12B. Here, the element portion provided over the substrate 302 refers to a region sandwiched between the substrate 302 and the conductive film 393.

Films of the transistor (e.g., an insulating film, a semiconductor film, an oxide semiconductor film, a metal oxide film, and a conductive film) can be formed by sputtering, chemical vapor deposition (CVD), vacuum vapor deposition, or pulsed laser deposition (PLD). Alternatively, the films of the transistor can be faulted by a coating method or a printing method. Although sputtering and plasma-enhanced chemical vapor deposition (PECVD) are typical examples of the deposition method, thermal CVD may be used. As thermal CVD, metal organic chemical vapor deposition (MOCVD) or atomic layer deposition (ALD) may be used, for example.

Deposition by thermal CVD is performed in such a manner that pressure in a chamber is set to atmospheric pressure or reduced pressure, and a source gas and an oxidizer are supplied to the chamber at the same time and react with each other in the vicinity of the substrate or over the substrate. In this manner, thermal CVD does not generate plasma and thus has an advantage that no defect due to plasma damage is caused.

Deposition by ALD is performed in such a manner that pressure in a chamber is set to atmospheric pressure or reduced pressure, source gases for reaction are sequentially introduced into the chamber, and then the sequence of gas introduction is repeated. For example, two or more kinds of source gases are sequentially supplied to the chamber by switching valves (also referred to as high-speed valves). In such a case, a first source gas is introduced, an inert gas (e.g., argon or nitrogen) or the like is introduced at the same time as or after introduction of the first gas so that the source gases are not mixed, and then a second source gas is introduced. Note that in the case where the first source gas and the inert gas are introduced at the same time, the inert gas serves as a carrier gas, and the inert gas may be introduced at the same time as introduction of the second source gas. Alternatively, the first source gas may be exhausted by vacuum evacuation instead of introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of gas introduction is repeated more than once until desired thickness is obtained, so that a thin film with excellent step coverage can be formed. The thickness of the thin film can be adjusted by the number of repetition times of the sequence of gas introduction; therefore, ALD makes it possible to adjust thickness accurately and thus is suitable for manufacturing a scaled transistor.

First, the substrate 302 is prepared. Here, a glass substrate is used as the substrate 302.

Then, a conductive film is formed over the substrate 302 and processed into desired regions, so that the conductive films 304a, 304b, and 304c are formed. The conductive films 304a, 304b, and 304c can be formed in such a manner that a mask is formed in the desired regions by first patterning and regions that are not covered with the mask are etched (see FIG. 7A).

The conductive films 304a, 304b, and 304c can be typically formed by sputtering, vacuum vapor deposition, PLD, thermal CVD, or the like.

Alternatively, a tungsten film can be formed as the conductive films 304a, 304b, and 304c with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at the same time, so that a tungsten film is formed. Note that an $SiH_4$ gas may be used instead of a $B_2H_6$ gas.

Next, the insulating film 305 is formed over the substrate 302 and the conductive films 304a, 304b, and 304c, and then the insulating film 306 is formed over the insulating film 305 (see FIG. 5).

The insulating films 305 and 306 are formed by sputtering, vacuum vapor deposition, PLD, thermal CVD, or the like. Note that it is preferable that the insulating films 305 and 306 be formed in succession in a vacuum because entry of impurities is inhibited.

When a silicon oxide film or a silicon oxynitride film is faulted as each of the insulating films 305 and 306, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case where a gallium oxide film is formed as each of the insulating films 305 and 306, MOCVD can be used.

In the case where a hafnium oxide film is formed as each of the insulating films 305 and 306 by thermal CVD such as MOCVD or ALD, two kinds of gases, i.e., ozone ($O_3$) as an oxidizer and a source gas that is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed as each of the insulating films 305 and 306 by thermal CVD such as MOCVD or ALD, two kinds of gases, e.g., $H_2O$ as an oxidizer and a source gas that is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris (2,2,6,6-tetramethyl-3,5-heptanedionate).

In the case where a silicon oxide film is formed as each of the insulating films 305 and 306 by thermal CVD such as MOCVD or ALD, hexachlorodisilane is adsorbed on a deposition surface, chlorine contained in adsorbate is removed, and radicals of an oxidizing gas (e.g., $O_2$ or dinitrogen monoxide) are supplied to react with the adsorbate.

Next, the oxide semiconductor film 307 is formed over the insulating film 306 (see FIG. 7B).

The oxide semiconductor film 307 can be formed by sputtering, pulsed laser deposition, laser ablation, thermal CVD, or the like.

As a sputtering gas, a rare gas (typically argon), oxygen, or a mixed gas of a rare gas and oxygen is used as appropriate. In the case where the mixed gas of a rare gas and oxygen is used, the proportion of oxygen to a rare gas is preferably increased.

A target may be selected as appropriate in accordance with the composition of an oxide semiconductor film to be formed.

For example, in the case where the oxide semiconductor film is formed by sputtering at a substrate temperature of 150 to 750° C., preferably 150 to 450° C., more preferably 200 to 350° C., the oxide semiconductor film can be a CAAC-OS film.

For the deposition of the CAAC-OS film, the following conditions are preferably employed.

By inhibiting entry of impurities during the deposition, the crystal state can be prevented from being broken by the impurities. For example, the concentration of impurities (e.g., hydrogen, water, carbon dioxide, or nitrogen) that exist in a deposition chamber may be reduced. Furthermore, the concentration of impurities in a deposition gas may be reduced. Specifically, a deposition gas whose dew point is −80° C. or lower, preferably −100° C. or lower is used.

In the case where an oxide semiconductor film, e.g., an $InGaZnO_x$ (X>0) film is formed using a deposition apparatus employing ALD, an $In(CH_3)_3$ gas and an $O_3$ gas are sequentially introduced more than once to form an $InO_2$ layer, a $Ga(CH_3)_3$ gas and an $O_3$ gas are introduced at the same time to form a GaO layer, and then a $Zn(CH_3)_2$ gas and an $O_3$ gas are introduced at the same time to form a ZnO layer. Note that the order of these layers is not limited to this example. A mixed compound layer such as an $InGaO_2$ layer, an $InZnO_2$ layer, a GaZnO layer, a ZnInO layer, or a GaZnO layer may be formed by mixing of these gases. Although an $H_2O$ gas that is obtained by bubbling with an inert gas such as Ar may be used instead of an $O_3$ gas, it is preferable to use an $O_3$ gas that does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Next, the oxide semiconductor film 307 is processed into desired regions, so that the island-shaped oxide semiconductor films 308a, 308b, and 308d are formed. The oxide semiconductor films 308a, 308b, and 308d can be formed in such a manner that a mask is formed in the desired regions by second patterning and regions that are not covered with the mask are etched. Dry etching, wet etching, or a combination of dry etching and wet etching can be employed as etching (see FIG. 7C).

After that, hydrogen, water, and the like may be released from the oxide semiconductor films 308a, 308b, and 308d by heat treatment and hydrogen concentration and water concentration in the oxide semiconductor films 308a, 308b, and 308d may be reduced. As a result, highly purified oxide semiconductor films 308a, 308b, and 308d can be formed. The heat treatment is performed typically at a temperature of 250 to 650° C., preferably 300 to 500° C. The heat treatment is performed typically at a temperature of 300 to 400° C., preferably 320 to 370° C., so that warp or shrinkage of a large-area substrate can be reduced and yield can be improved.

An electric furnace, an RTA apparatus, or the like can be used for the heat treatment. With the use of an RTA apparatus, the heat treatment can be performed at a temperature of higher than or equal to the strain point of the substrate if the heating time is short. Thus, the heat treatment time can be shortened and warp of the substrate during the heat treatment can be reduced, which is particularly preferable in a large-area substrate.

The heat treatment may be performed under an atmosphere of nitrogen, oxygen, ultra-dry air (air in which water content is 20 ppm or less, preferably 1 ppm or less, more preferably 10 ppb or less), or a rare gas (e.g., argon or helium). The atmosphere of nitrogen, oxygen, ultra-dry air, or a rare gas preferably does not contain hydrogen, water, and the like. Furthermore, after heat treatment is performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the number of oxygen vacancies in the oxide semiconductor film can be reduced.

In the case where the deposition temperature of an insulating film 311a formed later is 280 to 400° C., hydrogen, water, and the like can be released from the oxide semiconductor films 308a, 308b, and 308d; thus, the heat treatment is not necessary.

Figure 8A:
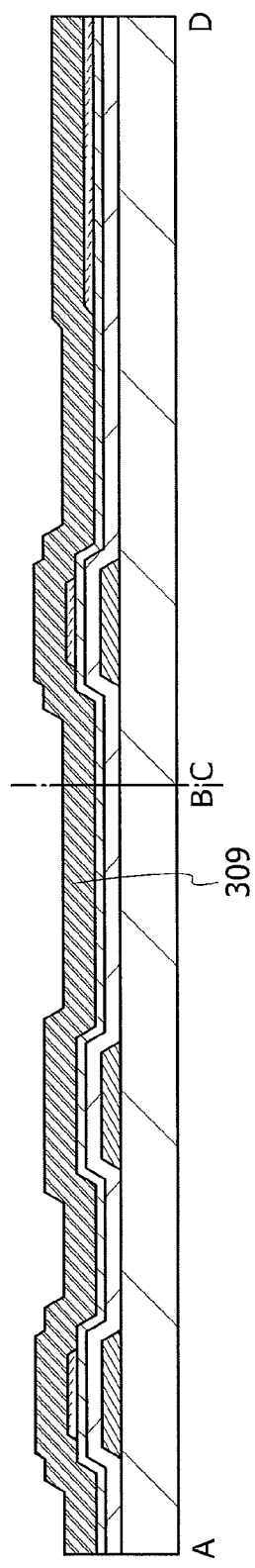
FIGS. 8A to 8C are cross-sectional views illustrating one embodiment of a method for manufacturing a semiconductor device.
Figure 8B:
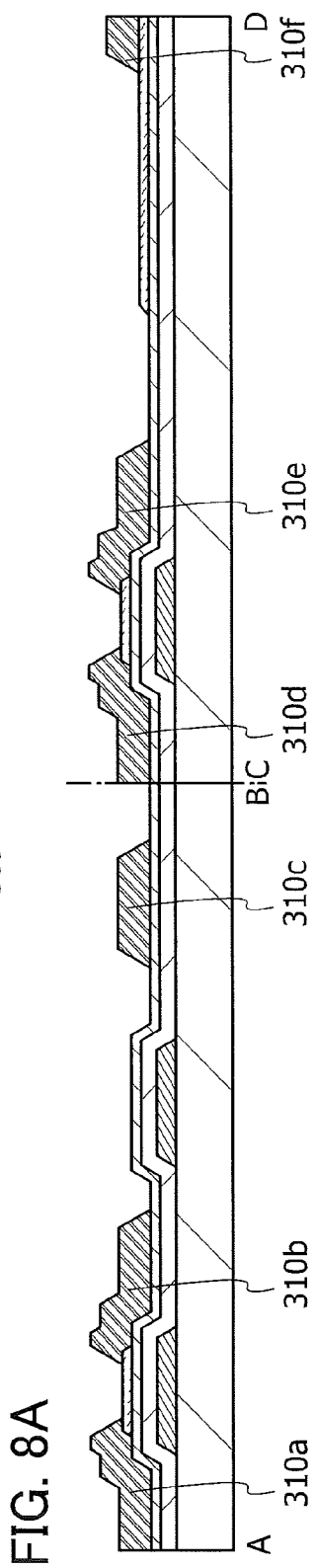

Next, the conductive film 309 is formed over the insulating film 306 and the oxide semiconductor films 308a, 308b, and 308d (see FIG. 8A).

The conductive film 309 can be formed by sputtering, vacuum vapor deposition, PLD, thermal CVD, or the like.

Then, the conductive film 309 is processed into desired regions, so that the conductive films 310a, 310b, 310c, 310d, 310e, and 310f are formed. Note that the conductive films 310a, 310b, 310c, 310d, 310e, and 310f can be formed in such a manner that a mask is formed in a desired region by third patterning and regions that are not covered with the mask are etched (see FIG. 8B).

Figure 8C:
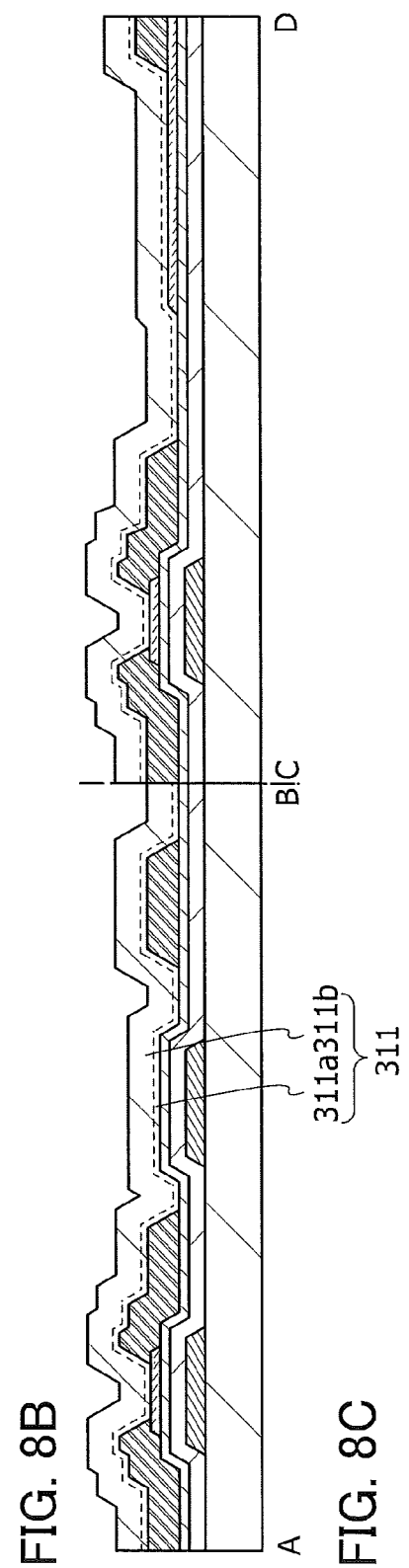

Next, an insulating film 311 in which insulating films 311a and 311b are stacked is formed to cover the insulating film 306, the oxide semiconductor films 308a, 308b, and 308d, and the conductive films 310a, 310b, 310c, 310d, 310e, and 310f (see FIG. 8C). The insulating film 311 can be formed by sputtering, CVD, vapor deposition, or the like.

Note that after the insulating film 311a is formed, the insulating film 311b is preferably formed in succession without exposure to the air. After the insulating film 311a is formed, the insulating film 311b is formed in succession by adjusting at least one of the flow rate of a source gas, pressure, high-frequency power, and substrate temperature without exposure to the air, so that the concentration of impurities attributed to an atmospheric component at an interface between the insulating films 311a and 311b can be lowered and oxygen in the insulating film 311b can be moved to the oxide semiconductor films 308a, 308b, and 308d. Accordingly, the number of oxygen vacancies in the oxide semiconductor films 308a, 308b, and 308d can be reduced.

An oxide insulating film containing nitrogen and having a small number of defects can be formed as the insulating film 311a by CVD under the conditions that the ratio of an oxidizing gas to a deposition gas is higher than 20 times and lower than 100 times, preferably higher than or equal to 40 times and lower than or equal to 80 times and pressure in a treatment chamber is lower than 100 Pa, preferably lower than or equal to 50 Pa.

A deposition gas containing silicon and an oxidizing gas are preferably used as the source gas of the insulating film 311a. Typical examples of the deposition gas containing silicon include silane, disilane, trisilane, and silane fluoride. Examples of the oxidizing gas include oxygen, ozone, dinitrogen monoxide, and nitrogen dioxide.

Under the above conditions, an oxide insulating film that passes oxygen can be formed as the insulating film 311a. With the insulating film 311a, damage to the oxide semiconductor films 308a, 308b, and 308d can be reduced in a step of forming the insulating film 311b formed later.

As the insulating film 311b, a silicon oxide film or a silicon oxynitride film is formed under the following conditions: a substrate placed in a vacuum-evacuated treatment chamber of a plasma-enhanced CVD apparatus is held at a temperature of 180 to 280° C., preferably 200 to 240° C., a source gas is introduced into the treatment chamber, pressure in the treatment chamber is 100 to 250 Pa, preferably 100 to 200 Pa, and a high-frequency power of 0.17 to 0.5 W/cm$^2$, preferably 0.25 to 0.35 W/cm$^2$ is supplied to an electrode provided in the treatment chamber.

A deposition gas containing silicon and an oxidizing gas are preferably used as the source gas of the insulating film 311b. Typical examples of the deposition gas containing silicon include silane, disilane, trisilane, and silane fluoride. Examples of the oxidizing gas include oxygen, ozone, dinitrogen monoxide, and nitrogen dioxide.

As the deposition conditions of the insulating film 311b, high-frequency power is supplied, so that the decomposition efficiency of the source gas in plasma is increased, oxygen radicals are increased, and oxidation of the source gas is promoted; therefore, the oxygen content of the insulating film 311b becomes higher than in the stoichiometric composition. However, when the substrate temperature is the deposition temperature of the insulating film 311b, the bond between silicon and oxygen is weak; thus, part of oxygen is released by heating. Thus, it is possible to form an oxide insulating film which contains oxygen at higher proportion than the stoichiometric composition and from which part of oxygen is released by heating. Furthermore, the insulating film 311a is provided over the oxide semiconductor films 308a, 308b, and 308d. Accordingly, in the step of forming the insulating film 311b, the insulating film 311a serves as a protective film of the oxide semiconductor films 308a, 308b, and 308d. Consequently, the insulating film 311b can be formed using the high-frequency power having high power density while damage to the oxide semiconductor films 308a, 308b, and 308d is reduced.

Note that in the deposition conditions of the insulating film 311b, the flow rate of the deposition gas containing silicon relative to the oxidizing gas can be increased, so that the number of defects in the insulating film 311b can be reduced. Typically, it is possible to form an oxide insulating film in which the number of defects is small, i.e., the spin density of a signal that appears at g=2.001 due to a dangling bond of silicon, be lower than $6 \times 10^{17}$ spins/cm$^3$, preferably lower than or equal to $3 \times 10^{17}$ spins/cm$^3$, more preferably lower than or equal to $1.5 \times 10^{17}$ spins/cm$^3$ by ESR measurement. As a result, the reliability of the transistor can be increased.

Next, heat treatment is performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C. The heat treatment is performed typically at a temperature of higher than or equal to 300° C. and lower than or equal to 400° C., preferably higher than or equal to 320° C. and lower than or equal to 370° C., so that warp or shrinkage of a large-area substrate can be reduced and yield can be improved.

An electric furnace, an RTA apparatus, or the like can be used for the heat treatment. With the use of an RTA apparatus, the heat treatment can be performed at a temperature of higher than or equal to the strain point of the substrate if the heating time is short. Thus, the heat treatment time can be shortened.

The heat treatment may be performed under an atmosphere of nitrogen, oxygen, ultra-dry air (air in which water content is 20 ppm or less, preferably 1 ppm or less, more preferably 10 ppb or less), or a rare gas (e.g., argon or helium). The atmosphere of nitrogen, oxygen, ultra-thy air, or a rare gas preferably does not contain hydrogen, water, and the like.

By the heat treatment, part of oxygen contained in the insulating film 311b can be moved to the oxide semiconductor films 308a, 308b, and 308d to reduce the oxygen vacancies in the oxide semiconductor films 308a, 308b, and 308d. Consequently, the number of oxygen vacancies in the oxide semiconductor films 308a, 308b; and 308d can be further reduced.

In the case where water, hydrogen, or the like is contained in the insulating films 311a and 311b, when the insulating film 313 having a function of blocking water, hydrogen, and the like is formed later and heat treatment is performed, water, hydrogen, or the like contained in the insulating films 311a and 311b is moved to the oxide semiconductor films 308a, 308b, and 308d, so that defects are generated in the oxide semiconductor films 308a, 308b, and 308d. However, by the heating, water, hydrogen, or the like contained in the insulating films 311a and 311b can be released; thus, variations in electrical characteristics of the transistor can be reduced, and changes in the threshold voltage can be inhibited.

Note that when the insulating film 311b is formed over the insulating film 311a while being heated, oxygen can be moved to the oxide semiconductor films 308a, 308b, and 308d to compensate the oxygen vacancies in the oxide semiconductor films 308a, 308b, and 308d; thus, the heat treatment is not necessarily performed.

When the conductive films 310a, 310b, 310d, 310e, and 310f are formed, the oxide semiconductor films 308a, 308b, and 308d are damaged by etching of the conductive film, so that oxygen vacancies are generated on back channel sides (sides of the oxide semiconductor films 308a and 308b that are opposite to sides facing the conductive films 304a and 304c functioning as gate electrodes) of the oxide semiconductor films 308a and 308b. However, with the use of the oxide insulating film containing oxygen at higher proportion than the stoichiometric composition as the insulating film 311b, the oxygen vacancies generated on the back channel side can be repaired by heat treatment. This reduces defects contained in the oxide semiconductor films 308a and 308b to improve the reliability of the transistor.

Note that the heat treatment may be performed after formation of an opening 362 to be formed later.

Next, the insulating films 311a and 311b are processed into desired regions, so that the insulating film 312 in which the insulating films 312a and 312b are stacked, and the opening 362 are formed. The insulating film 312 and the opening 362 can be formed in such a manner that a mask is formed in the desired regions by fourth patterning and regions that are not covered with the mask are etched (see FIG. 9A).

The opening 362 is formed to expose the surface of the oxide semiconductor film 308d. The opening 362 can be formed by dry etching, for example. The insulating film 311 is preferably etched by dry etching. In that case, the oxide semiconductor film 308d is exposed to plasma in the etching treatment; thus, oxygen vacancies in the oxide semiconductor film 308d can be increased. Note that the method for forming the opening 362 is not limited to dry etching, and wet etching or a combination of dry etching and wet etching may be employed.

Next, the insulating film 314 is formed over the insulating film 312 and the oxide semiconductor film 308d (see FIG. 9B).

The insulating film 314 is preferably formed using a material that prevents diffusion of impurities from the outside, such as oxygen, hydrogen, water, alkali metal, and alkaline earth metal, into the oxide semiconductor film, more preferably formed using the material including hydrogen, and typically an inorganic insulating material containing nitrogen, such as a nitride insulating film, can be used. The insulating film 314 can be formed by CVD or sputtering, for example.

When the insulating film 314 is faulted by plasma-enhanced CVD or sputtering, the oxide semiconductor film is exposed to plasma and oxygen vacancies are generated in the oxide semiconductor film. The insulating film 314 is formed using a material that prevents diffusion of impurities from the outside, such as water, alkali metal, and alkaline earth metal, into the oxide semiconductor film, and the material further includes hydrogen. Thus, when hydrogen in the insulating film 314 is diffused into the oxide semiconductor film 308d, hydrogen is bonded to oxygen and electrons serving as carriers are generated in the oxide semiconductor film 308d. Alternatively, when hydrogen enters the oxygen vacancies in the oxide semiconductor film, electrons serving as carriers are generated. As a result, the conductivity of the oxide semiconductor film 308d is increased, so that the oxide semiconductor film 308d becomes the metal oxide film 308c.

The silicon nitride film is preferably formed at high temperature to have an improved blocking property; for example, the silicon nitride film is preferably formed at a substrate temperature of 100 to 400° C., more preferably 300 to 400° C. When the silicon nitride film is formed at high temperature, a phenomenon in which oxygen is released from the oxide semiconductor used for the oxide semiconductor films 308a and 308b and carrier concentration is increased is caused in some cases; therefore, the upper limit of the temperature is temperature at which the phenomenon is not caused.

Figure 10A:
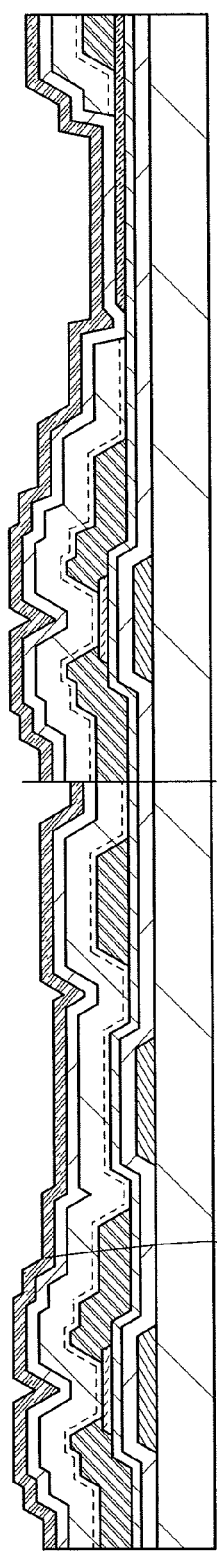
FIGS. 10A to 10C are cross-sectional views illustrating one embodiment of a method for manufacturing a semiconductor device.
Figure 10B:
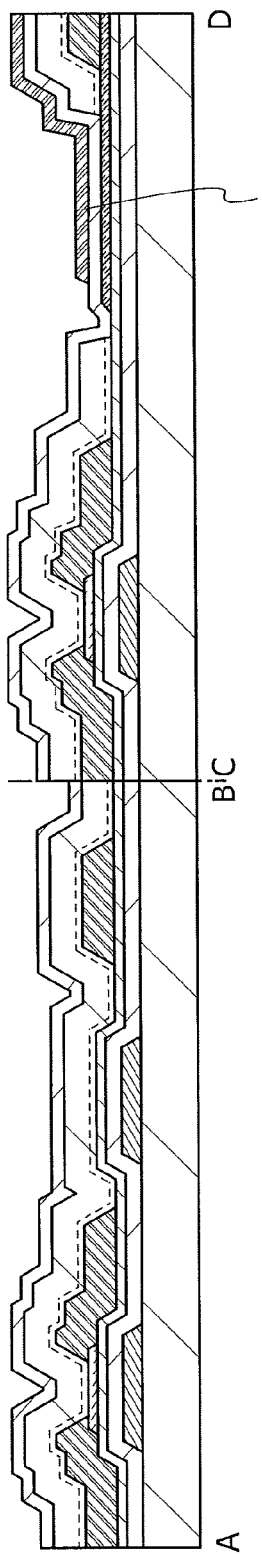

Then, a conductive film 315 is formed over the insulating film 314 (see FIG. 10A).

The conductive film 315 can be formed by sputtering, for example.

Then, the conductive film 315 is processed into desired regions, so that the conductive film 316b is formed. The conductive film 316b are formed in such a manner that a mask is formed in the desired regions by fifth patterning and regions that are not covered with the mask are etched (see FIG. 10B).

Figure 10C:
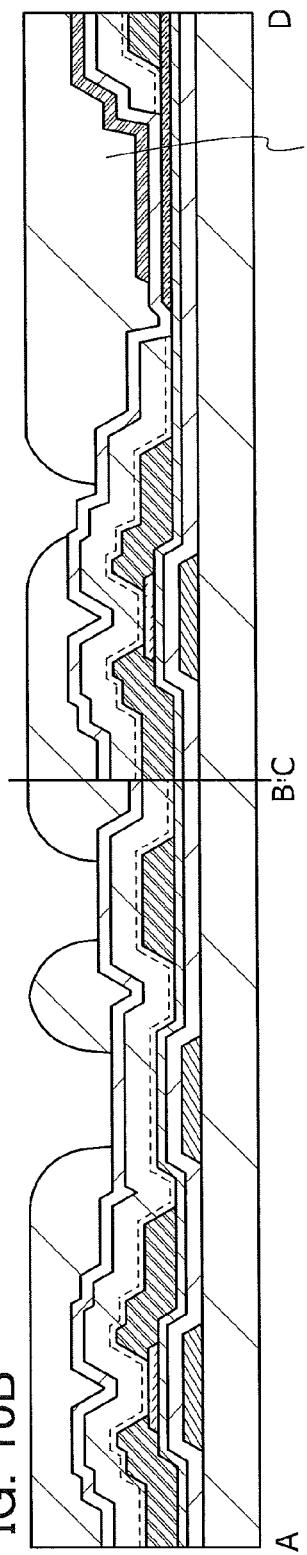

Next, the organic insulating film 317 is formed to cover the insulating film 314 and the conductive film 316b (see FIG. 10C). The organic insulating film 317 functioning as a planarization film has an opening that partly exposes the insulating film 313 and the conductive film 316b.

The organic insulating film 317 is formed in such a manner that a photosensitive composition is applied onto the insulating film 313 and the conductive film 316b by a coating method such as spin coating or dip coating, is exposed to light and developed by a photolithography process using a sixth photomask, and is then subjected to heat treatment. Note that in the case where a non-photosensitive composition is applied onto the insulating film 313 and the conductive film 316b, a resist is applied onto the non-photosensitive composition, the resist is processed by a photolithography process using the sixth photomask to form a mask, and then the non-photosensitive composition is etched using the mask, so that the organic insulating film 317 can be formed.

When the organic insulating film 317 is formed by a wet method such as an inkjet method or a printing method, the number of photomasks can be reduced.

Next, the insulating films 305, 306, 312, and 314 are partly etched using the organic insulating film 317 as a mask, so that an opening 364a that exposes the conductive film 304b, an opening 364b that exposes the conductive film 310c, and an opening 364c that exposes the conductive an 310e are formed (see FIG. 11A).

Then, a conductive film 318 is formed (see FIG. 11B).

The conductive film 318 can be formed by sputtering, for example.

Then, the conductive film 318 is processed into desired regions, so that the conductive films 319 and 319a are formed. The conductive films 319 and 319a can be foamed in such a manner that a mask is formed in the desired regions by seventh patterning and regions that are not covered with the mask are etched (see FIG. 11C).

Next, an insulating film 390 is processed into desired regions to form the insulating layer 391. The insulating layer 391 can be formed in such a manner that a mask is formed in the desired regions by eighth patterning and regions that are not covered with the mask are etched (see FIG. 12A).

The insulating layer 391 functioning as a partition is preferably formed so that its sidewall has a tapered shape or a tilted surface with a continuous curvature. The sidewall of the insulating layer 391 having the above shape enables favorable coverage with the light-emitting layer 392 and the conductive film 393 formed later.

Figure 12A:
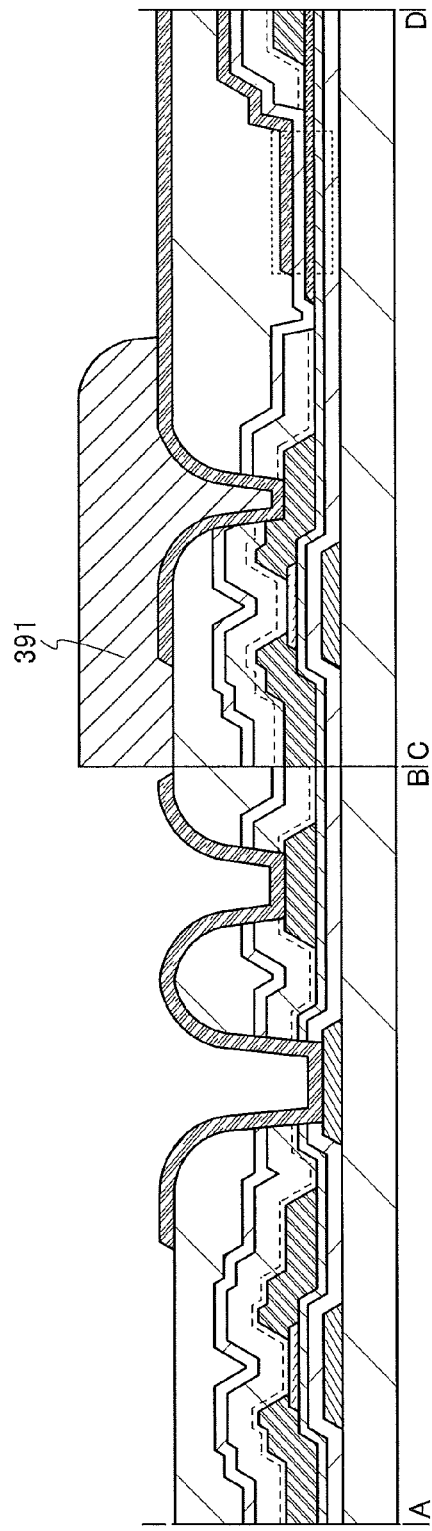
FIGS. 12A and 12B are cross-sectional views illustrating one embodiment of a method for manufacturing a semiconductor device.
Figure 12B:
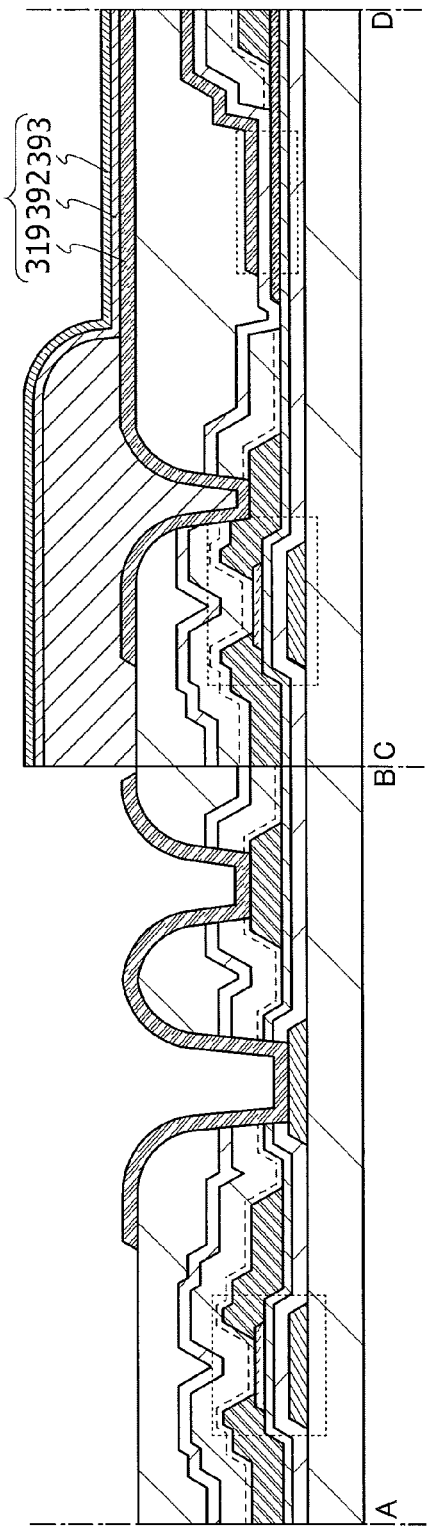

Then, the light-emitting layer 392 and the conductive film. 393 are formed (see FIG. 12B). By stacking the light-emitting layer 392 and the conductive film 393 over the conductive film 319 functioning as the first electrode, the light-emitting element 394 can be formed.

Through the above process, a display device including the pixel portion and the driver circuit portion in. FIG. 5 and FIG. 6 that include transistors can be formed over the substrate 302. In the manufacturing process described in this embodiment, the transistors and the capacitor can be formed at the same time by the first to eighth patterning, that is, with the eight masks.

In this embodiment, the conductivity of the oxide semiconductor film 308d is increased by diffusing hydrogen contained in the insulating film 314 into the oxide semiconductor film 308d; however, the conductivity of the oxide semiconductor film 308d may be increased by covering the oxide semiconductor films 308a and 308b with a mask and adding impurities, typically, hydrogen, boron, phosphorus, tin, antimony, a rare gas element, alkali metal, alkaline earth metal, or the like to the oxide semiconductor film 308d. Hydrogen, boron, phosphorus, tin, antimony, a rare gas element, or the like is added to the oxide semiconductor film 308d by ion doping, ion implantation, or the like. To add alkali metal, alkaline earth metal, or the like to the oxide semiconductor film 308d, a solution that contains the impurity is added to the oxide semiconductor film 308d, for example.

Note that the structures, methods, and the like described in this embodiment can be combined with any of the structures, methods, and the like described in the other embodiments as appropriate.

Embodiment 3

In this embodiment, a display device that includes transistors different from those in Embodiment 2 is described with reference to FIG. 13, FIG. 14, FIG. 15, FIG. 16, FIG. 17, FIG. 18, and FIG. 19.

Figure 13:
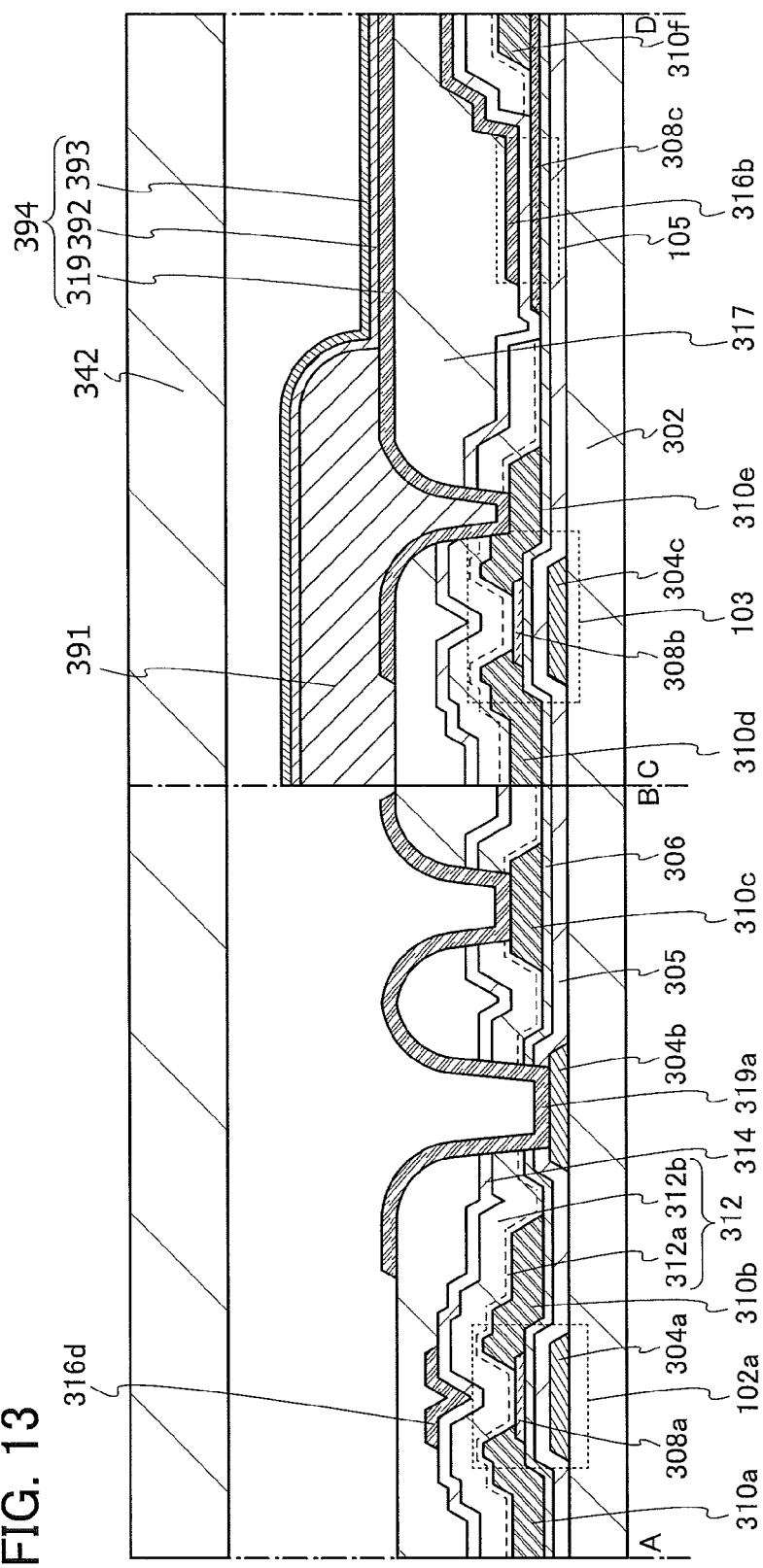
FIG. 13 is a cross-sectional view illustrating one embodiment of a semiconductor device.

The display device in FIG. 13 includes a dual-gate transistor 102a in a driver circuit portion in the left part (A-B).

The dual-gate transistor 102a provided in the driver circuit portion includes the conductive film 304a functioning as a gate electrode over the substrate 302, the insulating films 305 and 306 collectively functioning as a gate insulating film, the oxide semiconductor film 308a formed over the insulating film 306, and the conductive films 310a and 310b that function as a source electrode and a drain electrode and are in contact with the oxide semiconductor film 308a. In addition, the insulating films 312 and 314 are formed over the oxide semiconductor film 308a and the conductive films 310a and 310b, and a conductive film 316d functioning as a gate electrode is formed over the insulating film 314. The conductive film 316d functioning as a gate electrode is connected to the conductive film 304a functioning as a gate electrode through an opening (not illustrated) formed in a gate insulating film and an inorganic insulating film. In other words, the conductive film 304a and a conductive film 316d have the same potential.

Thus, by applying voltages having the same potential to each gate electrode of the dual-gate transistor 102a, variations in initial characteristics can be reduced, and deterioration of the dual-gate transistor 102a after a −GBT stress test and a change in the rising voltage of on-state current at different drain voltages can be inhibited. In addition, a region where carriers flow in the oxide semiconductor film 308a becomes larger in a film thickness direction, so that the amount of carrier movement is increased. As a result, the on-state current of the dual-gate transistor 102a is increased, and field-effect mobility is increased. Typically, the field-effect mobility is greater than or equal to 20 $cm^2/V \cdot s$.

Defects are formed at an end portion of an oxide semiconductor film processed by etching or the like because of damage due to the processing, and the end portion of the oxide semiconductor film is polluted by attachment of impurities, or the like. Thus, when stress such as an electric field is applied, the end portion of the oxide semiconductor film is easily activated to be n-type (have low resistance). Therefore, an end portion of the oxide semiconductor film 308a overlapping the conductive film 304a functioning as a gate electrode easily becomes n-type. When the end portion that becomes n-type is provided between the conductive films 310a and 310b functioning as a source electrode and a drain electrode, the region that becomes n-type functions as a carrier path, resulting in a parasitic channel. However, when the conductive film 316d functioning as a gate electrode is provided in a channel width direction, formation of a parasitic channel on a side surface of the oxide semiconductor film 308a and its vicinity is inhibited because of an electric field of the conductive film 316d functioning as a gate electrode. As a result, a transistor that has excellent electrical characteristics such as a sharp increase in drain current at the threshold voltage is obtained.

The conductive film 316d functioning as a gate electrode can be formed using a material similar to that of the conductive film 316b in Embodiment 2.

<Modification Example>1

Figure 14:
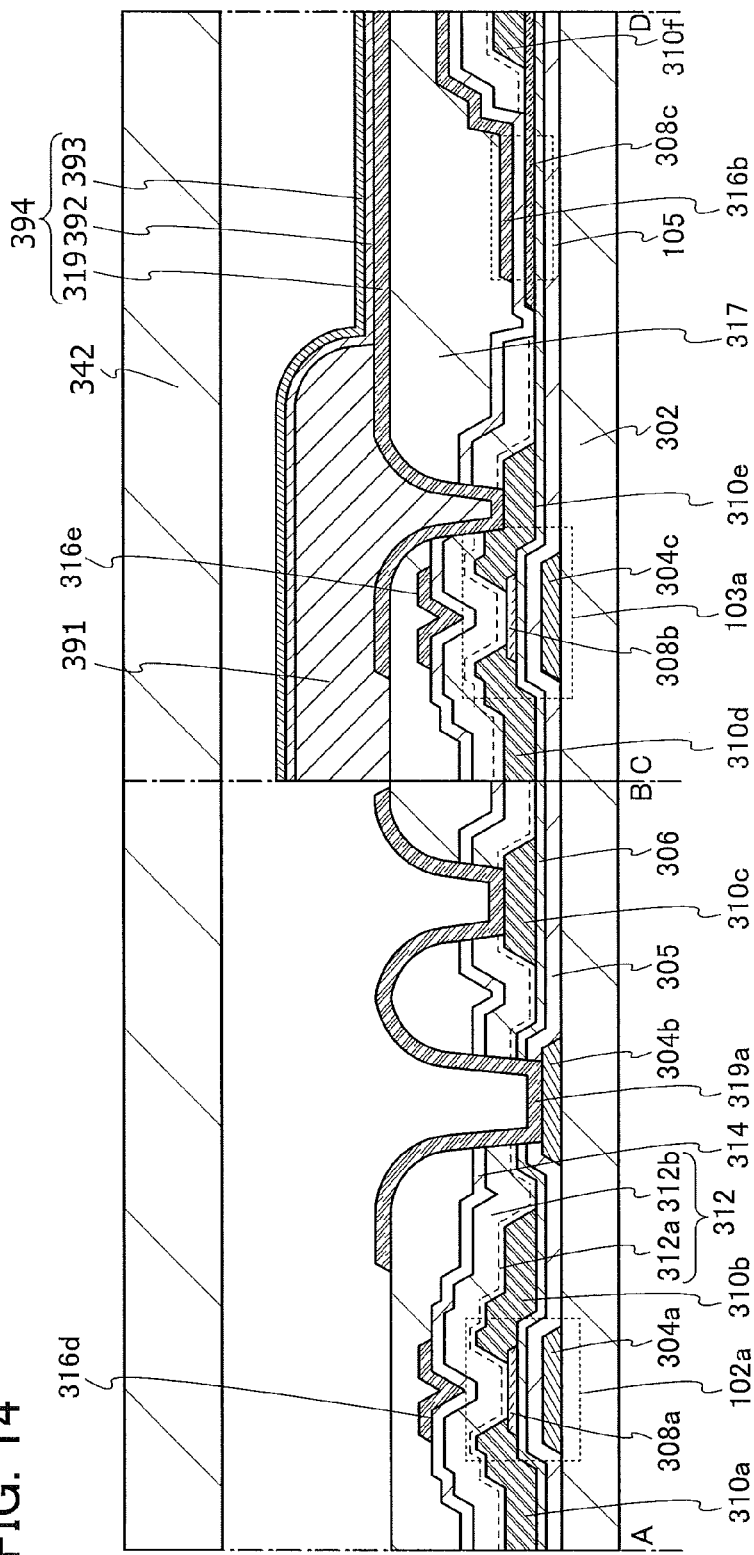
FIG. 14 is a cross-sectional view illustrating one embodiment of a semiconductor device.

The display device in FIG. 13 of this embodiment includes a dual-gate transistor as the transistor in the driver circuit portion. However, as illustrated in FIG. 14, the dual-gate transistor 102a may be formed in the driver circuit in the left part (A-B) and a dual-gate transistor 103a may be formed in a pixel portion in the right part (C-D).

The transistor 103a includes the conductive film 304c functioning as a gate electrode over the substrate 302, the insulating films 305 and 306 collectively functioning as the gate insulating film 51, the oxide semiconductor film 308b formed over the insulating film 306, and the conductive films 310d and 310e that function as a source electrode and a drain electrode and are in contact with the oxide semiconductor film 308b. In addition, the insulating films 312 and 314 are formed over the oxide semiconductor film 308b and the conductive films 310d and 310e, and a conductive film 316e functioning as a gate electrode is formed over the insulating film 314. The conductive film 316e functioning as a gate electrode is connected to the conductive film 304c functioning as a gate electrode through an opening (not illustrated) formed in the insulating films 305, 306, 312, and 314. In other words, the conductive films 304c and 316e have the same potential.

By providing dual-gate transistors having high reliability, high on-state current, and high field-effect mobility in the driver circuit portion and the pixel portion, a display device with high display quality can be formed.

<Modification Example>2

Figure 15:
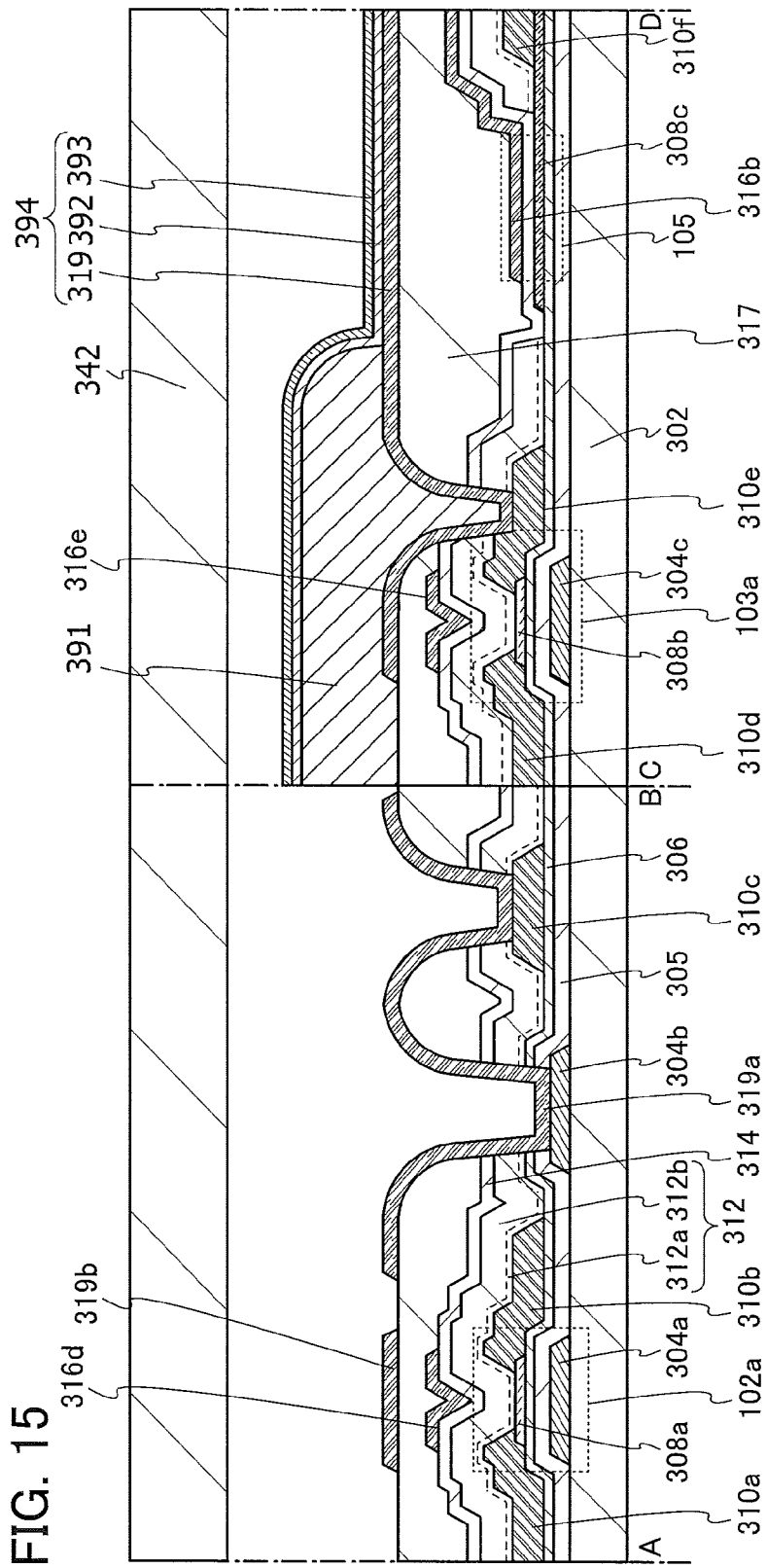
FIG. 15 is a cross-sectional view illustrating one embodiment of a semiconductor device.

In the display device described in Embodiment 2 or 3, as illustrated in FIG. 15, a conductive film 319b formed at the same time as the conductive film 319 may be provided in a region overlapping the dual-gate transistor 102a provided in the driver circuit portion and over the organic insulating film 317. The conductive film 319b can have a given potential such as a common potential or a ground potential. The conductive film 319b overlapping the dual-gate transistor 102a can block an electric field generated from voltage applied to the conductive film 316d functioning as the gate electrode of the dual-gate transistor 102a.

<Modification Example>3

Figure 16:
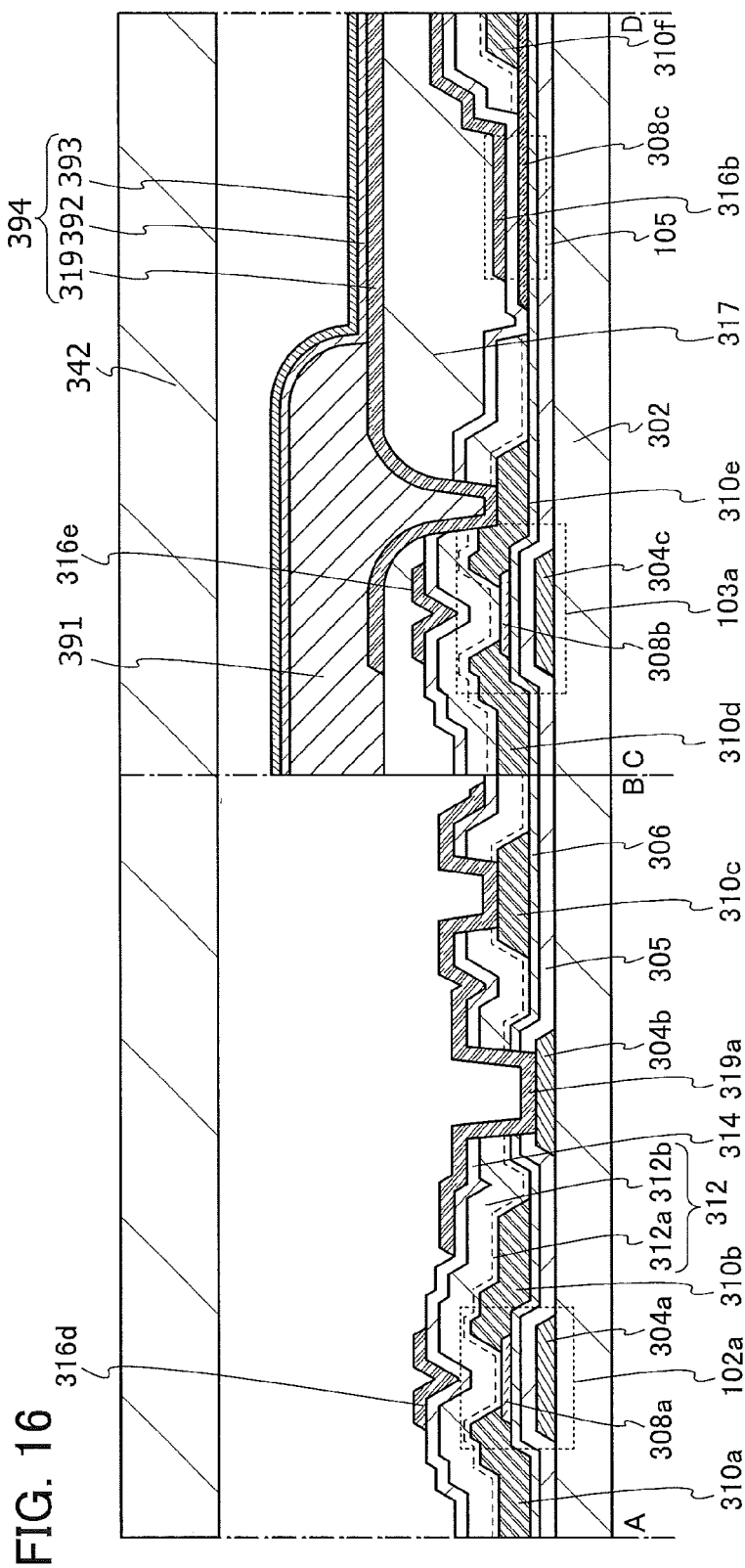
FIG. 16 is a cross-sectional view illustrating one embodiment of a semiconductor device.

Although Embodiment 2 or 3 describes the display device including the organic insulating film 317 in the driver circuit portion and the pixel portion, an organic insulating film 317a may be provided only in the pixel portion, as illustrated in FIG. 16.

Note that in the display device in FIG. 16, after the insulating film 314 is formed as illustrated in FIG. 9B, a mask is formed by patterning, and the insulating films 305, 306, 312, and 314 are etched using the mask to form an opening. Next, after the conductive film 315 in FIG. 10A is formed, the conductive film 316b in FIG. 10B and the conductive film 319a that connects the conductive film 304b to the conductive film 310c are formed at the same time. After that, the organic insulating film 317 and the conductive film 319 are formed.

Figure 17:
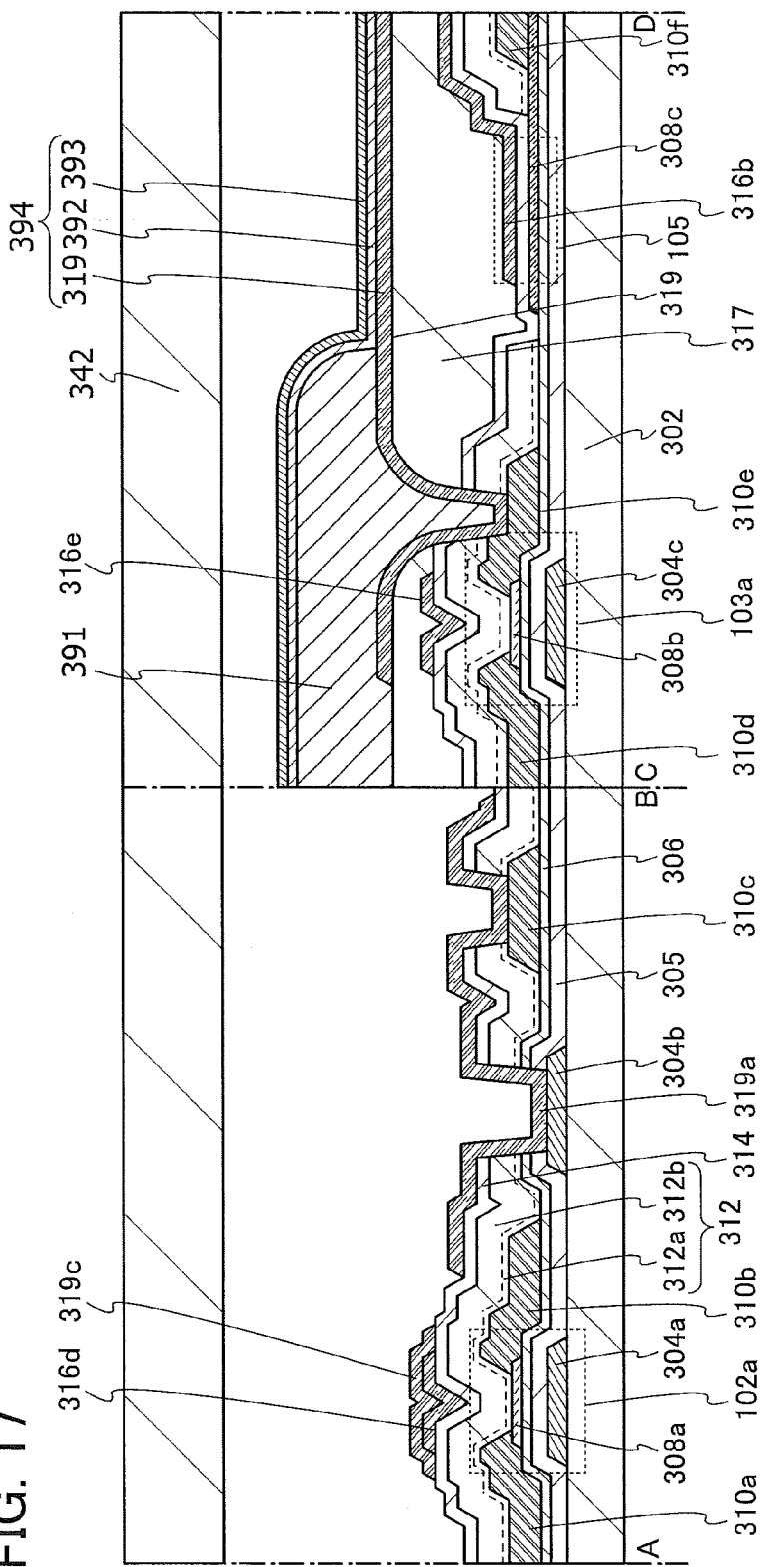
FIG. 17 is a cross-sectional view illustrating one embodiment of a semiconductor device.

Note that as illustrated in FIG. 17, when the organic insulating film 317 is not provided in the driver circuit portion, a conductive film 319c faulted at the same time as the conductive film 319 may be provided over the conductive film 316d functioning as the gate electrode of the dual-gate transistor 102b.

Figure 18:
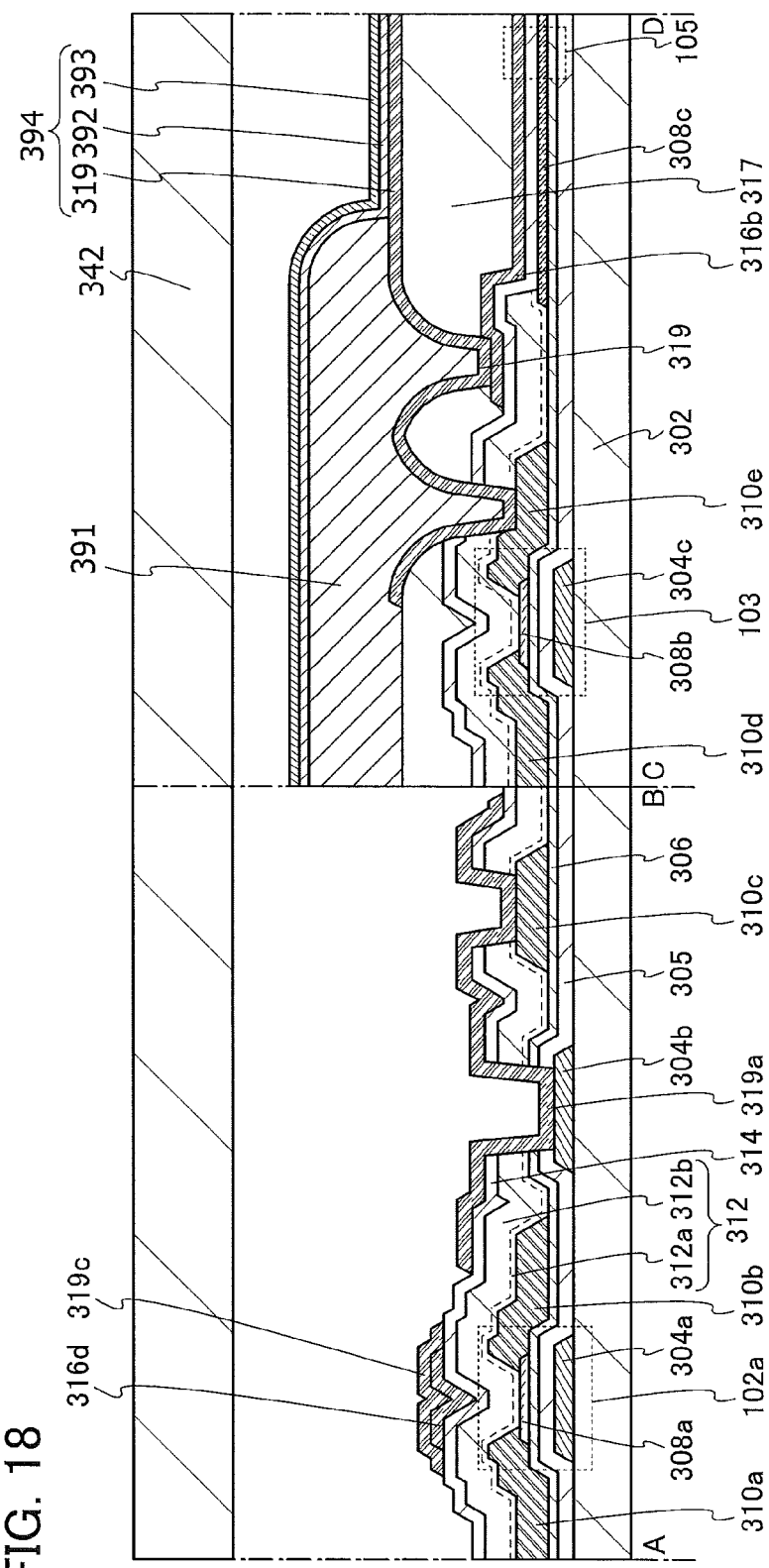
FIG. 18 is a cross-sectional view illustrating one embodiment of a semiconductor device.

In addition to the structure in FIG. 17, as illustrated in FIG. 1B of Embodiment 1, a structure in FIG. 18 in which the conductive film 310e of the transistor 103 and the conductive film 316b are connected to each other using the conductive film 319 may be employed.

Figure 19:
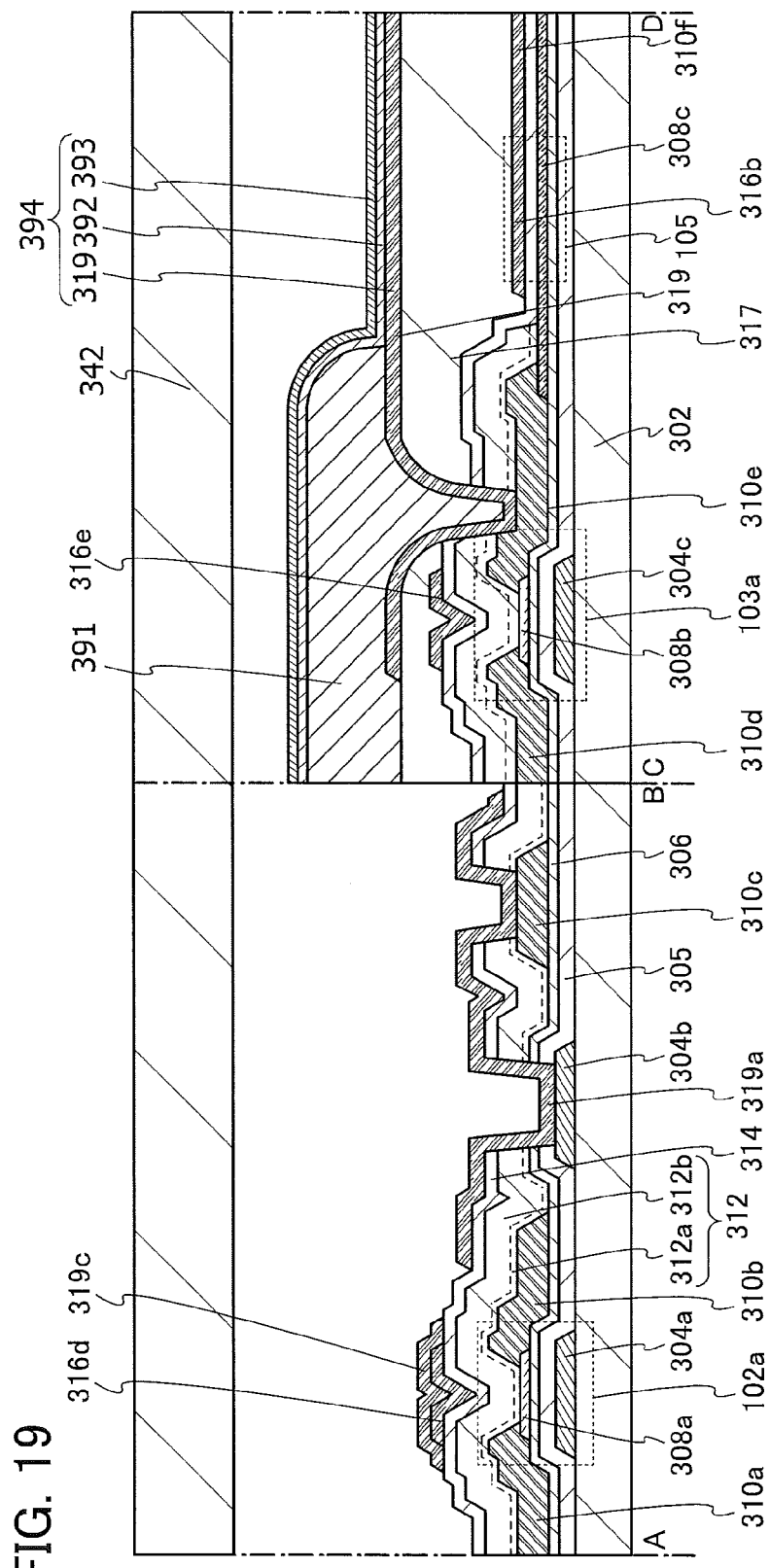
FIG. 19 is a cross-sectional view illustrating one embodiment of a semiconductor device.

In addition to the structure in FIG. 17, as illustrated in FIG. 1C of Embodiment 1, a structure in FIG. 19 in which the conductive film 310e of the transistor 103 and the metal oxide film 308c are in direct contact with each other may be employed.

Note that the structures, methods, and the like described in this embodiment can be combined with any of the structures, methods, and the like described in the other embodiments as appropriate.

Embodiment 4

In the transistors 102, 102a, 102b, 102c, 103, 103a, and 103b described in Embodiments 2 and 3, the oxide semiconductor film can have a layered structure as needed. Here, description is made using the transistor 103.

Figure 28:
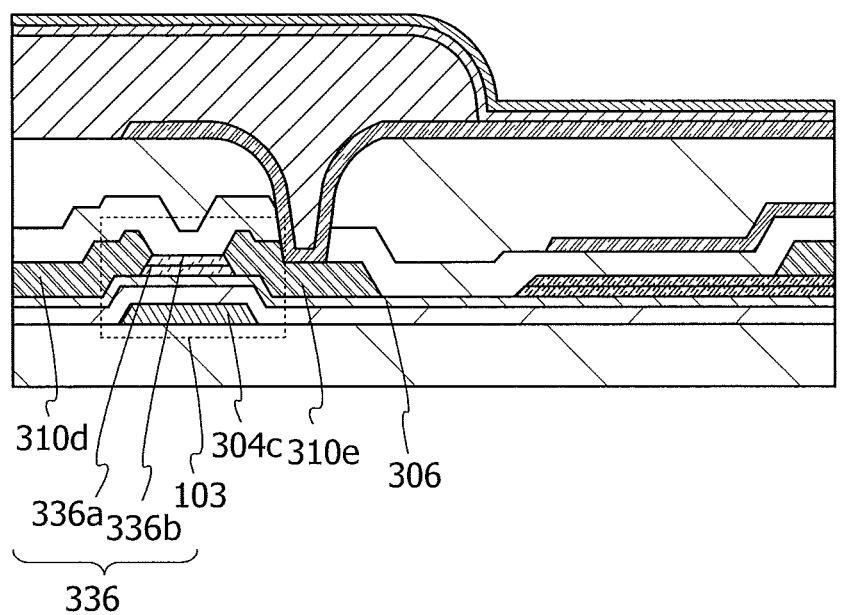
FIG. 28 is a cross-sectional view illustrating one embodiment of a semiconductor device.

In the transistor in FIG. 28, a multilayer film 336 including an oxide semiconductor film is formed between the insulating film 306 and the conductive films 310d and 310e.

The multilayer film 336 includes oxide semiconductor films 336a and 336b. That is, the multilayer film 336 has a two-layer structure. Furthermore, part of the oxide semiconductor film 336a functions as a channel region. The insulating film 312a is in contact with the multilayer film 336, and the oxide semiconductor film 336b is in contact with the insulating film 312a. That is, the oxide semiconductor film 336b is provided between the oxide semiconductor film 336a and the insulating film 312a.

The oxide semiconductor film 336b contains one or more elements that form the oxide semiconductor film 336a. Since the oxide semiconductor film 336b contains one or more elements that form the oxide semiconductor film 336a, interface scattering is unlikely to occur at an interface between the oxide semiconductor films 336a and 336b. Thus, the transistor can have high field-effect mobility because the movement of carriers is not hindered at the interface.

The oxide semiconductor film 336b typically contains an In—Ga oxide, an In—Zn oxide, or an In-M-Zn oxide (M represents Al, Ti, Ga, Y, Zr, La, Ce, Nd, or Hf). The energy at the conduction band bottom of the oxide semiconductor film 336b is closer to a vacuum level than that of the oxide semiconductor film 336a is, and typically, the difference between the energy at the conduction band bottom of the oxide semiconductor film 336b and the energy at the conduction band bottom of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide semiconductor film 336b and the electron affinity of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide semiconductor film 336b preferably contains In because carrier mobility (electron mobility) is increased.

When the oxide semiconductor film 336b contains a larger amount of Al, Ti, Ga, Y, Zr, La, Ce, Nd, Sn, or Hf in an atomic ratio than the amount of In in an atomic ratio, any of the following effects may be obtained:
(1) the energy gap of the oxide semiconductor film 336b is widened;
(2) the electron affinity of the oxide semiconductor film 336b is decreased;
(3) an impurity from the outside is blocked;
(4) the insulating property of the oxide semiconductor film 336b increases as compared to the oxide semiconductor film 336a; and
(5) oxygen vacancies are less likely to be generated in the oxide semiconductor film 336b containing a larger amount of Al, Ti, Ga, Y, Zr, La, Ce, Nd, Sn, or Hf in an atomic ratio than the amount of In in an atomic ratio because Al, Ti, Ga, Y, Zr, La, Ce, Nd, Sn, or Hf is a metal element that is strongly bonded to oxygen.

In the case where the oxide semiconductor film 336b is an In-M-Zn oxide film, when summation of In and M is assumed to be 100 atomic %, the proportions of In and M, not taking Zn and O into consideration, are less than 50 atomic % and greater than or equal to 50 atomic %, respectively, preferably less than 25 atomic % and greater than or equal to 75 atomic %, respectively.

Furthermore, in the case where each of the oxide semiconductor films 336a and 336b is an In-M-Zn oxide film, the proportion of M atoms in the oxide semiconductor film 336b is higher than that in the oxide semiconductor film 336a. Typically, the proportion of M in the oxide semiconductor film 336b is 1.5 or more times, preferably twice or more, more preferably three or more times that in the oxide semiconductor film 336a.

Furthermore, in the case where each of the oxide semiconductor films 336a and 336b is an In-M-Zn oxide film, when In:M:Zn=[atomic ratio] is satisfied in the oxide semiconductor film 336b and In:M:Zn=$x_2$:$y_2$:$z_2$ [atomic ratio] is satisfied in the oxide semiconductor film 336a, $y_1/x_1$ is larger than $y_2/x_2$. It is preferable that $y_1/x_1$ be 1.5 or more times as large as $y_2/x_2$. It is further preferable that $y_1/x_1$ be twice or more as large as $y_2/x_2$. It is still preferable that $y_1/x_1$ be three or more times as large as $y_2/x_2$. In that case, it is preferable that in the oxide semiconductor film 336b, $y_2$ be larger than or equal to $x_2$ because a transistor including the oxide semiconductor film can have stable electrical characteristics. However, when $y_2$ is three or more times as large as $x_2$, the field-effect mobility of the transistor including the oxide semiconductor film is decreased. Thus, it is preferable that $y_2$ be less than three times as large as $x_2$.

For example, for the oxide semiconductor film 336a, an In—Ga—Zn oxide with an atomic ratio of In:Ga:Zn=1:1:1, 1:1:1.2, or 3:1:2 can be used. For the oxide semiconductor film 336b, an In—Ga—Zn oxide with an atomic ratio of In:Ga:Zn=1:3:n (n is an integer of 2 or more and 8 or less), 1:6:m (m is an integer of 2 or more and 10 or less), or 1:9:6 can be used. Note that the atomic ratio of each of the oxide semiconductor films 336a and 336b varies within a range of ±20% of the above atomic ratio as an error. In the oxide semiconductor film 336a, the proportion of Zn is preferably higher than or equal to the proportion of Ga because a CAAC-OS is easily formed.

The oxide semiconductor film 336b also functions as a film that relieves damage to the oxide semiconductor film 336a at the time of forming the insulating film 312b later.

The thickness of the oxide semiconductor film 336b is 3 to 100 nm, preferably 3 to 50 nm.

The oxide semiconductor film 336b may have a non-single-crystal structure, for example, like the oxide semiconductor film 336a. The non-single crystal structure includes a c-axis aligned crystalline oxide semiconductor (CAAC-OS) described later, a polycrystalline structure, a microcrystalline structure described later, or an amorphous structure, for example.

Note that each of the oxide semiconductor films 336a and 336b may be a mixed film including two or more of the following: a region having an amorphous structure, a region having a microcrystalline structure, a region having a polycrystalline structure, a CAAC-OS region, and a region having a single-crystal structure. Furthermore, the mixed film has a layered structure of two or more of a region having an amorphous structure, a region having a microcrystalline structure, a region having a polycrystalline structure, a CAAC-OS region, and a region having a single-crystal structure in some cases.

Here, the oxide semiconductor film 336b is provided between the oxide semiconductor film 336a and the insulating film 312a. Thus, if trap states are formed between the oxide semiconductor film 336b and the insulating film 312a owing to impurities and defects, electrons flowing through the oxide semiconductor film 336a are less likely to be captured by the trap states because there is a distance between the trap states and the oxide semiconductor film 336a. Accordingly, the on-state current and field-effect mobility of the transistor can be increased. When the electrons are captured by the trap states, the electrons become negative fixed charge. As a result, the threshold voltage of the transistor fluctuates. However, by the distance between the oxide semiconductor film 336a and the trap states, capture of the electrons by the trap states can be reduced, so that a fluctuation of the threshold voltage can be reduced.

In addition, impurities from the outside can be blocked by the oxide semiconductor film 336b, so that the amount of impurities that move from the outside to the oxide semiconductor film 336a can be reduced. Furthermore, an oxygen vacancy is less likely to be formed in the oxide semiconductor film 336b. Consequently, the impurity concentration and the number of oxygen vacancies in the oxide semiconductor film 336a can be reduced.

Note that the oxide semiconductor films 336a and 336b are not formed by simply stacking films, but are formed to have a continuous junction (here, in particular, a structure in which the energy at the conduction band bottom is changed continuously between the films). In other words, a layered structure in which no impurity that forms a defect state such as a trap center or a recombination center exits at an interface between the films is provided. If an impurity exists between the oxide semiconductor films 336a and 336b that are stacked, continuity of the energy band is damaged, and the carrier is captured or recombined at the interface and then disappears.

To form such a continuous junction, the films need to be stacked successively without being exposed to the air by using a multi-chamber deposition apparatus (sputtering apparatus) provided with a load lock chamber. Each chamber in the sputtering apparatus is preferably evacuated to be a high vacuum state (to the degree of approximately $5 \times 10^{-7}$ to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined to prevent a backflow of a gas, especially a gas containing carbon or hydrogen from an exhaust system to the inside of the chamber.

In FIG. 28, the multilayer film 336 has a two-layer structure of the oxide semiconductor films 336a and 336b; however the multilayer film 336 may have a three-layer structure in which a film similar to the oxide semiconductor film 336b is further provided between the insulating film 306 and the oxide semiconductor film 336a. In that case, the thickness of the oxide semiconductor film provided between the insulating film 306 and the oxide semiconductor film 336a is preferably less than that of the oxide semiconductor film 336a. When the oxide semiconductor film has a thickness of 1 to 5 nm, preferably 1 to 3 nm, the amount of change in the threshold voltage of the transistor can be reduced.

Note that the structures, methods, and the like described in this embodiment can be combined with any of the structures, methods, and the like described in the other embodiments as appropriate.

Embodiment 5

In this embodiment, one embodiment that can be applied to an oxide semiconductor film in the transistor included in the display device described in the above embodiment is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a poly-crystalline oxide semiconductor); an oxide semiconductor having a microcrystalline structure (hereinafter referred to as a microcrystalline oxide semiconductor); and an oxide semiconductor having an amorphous structure (hereinafter referred to as an amorphous oxide semiconductor). Alternatively, the oxide semiconductor film may be a CAAC-OS film. Alternatively, the oxide semiconductor film may include an amorphous oxide semiconductor and an oxide semiconductor having a crystal grain. The CAAC-OS and the microcrystalline oxide semiconductor are described below as typical examples.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

FIG. 20A is a cross-sectional TEM image of a CAAC-OS film. FIG. 20B is a cross-sectional TEM image obtained by enlarging the image of FIG. 20A. In FIG. 20B, atomic order is highlighted for easy understanding.

FIG. 20C shows Fourier transform images of regions each surrounded by a circle (diameter is approximately 4 nm) between A and O and between O and A' in FIG. 20A. C-axis alignment can be observed in each region in FIG. 20C. The c-axis direction between A and O is different from that between O and A', which indicates that a grain in the region between A and O is different from that between O and A'. In addition, between A and O, the angle of the c-axis continuously and gradually changes, for example, 14.3°, 16.6°, and 26.4°. Similarly, between O and A', the angle of the c-axis continuously changes, for example, −18.3°, −17.6°, and −15.9°.

Note that in an electron diffraction pattern of the CAAC-OS film, spots (bright spots) indicating alignment are observed. For example, when electron diffraction with an electron beam having a diameter of 1 to 30 nm (such electron diffraction is also referred to as nanobeam electron diffraction) is performed on the top surface of the CAAC-OS film, spots are observed (see FIG. 21A).

From the results of the cross-sectional TEM image and the planar TEM image, alignment is found in the crystal parts in the CAAC-OS film.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 nm$^2$, larger than or equal to 5 µm$^2$, or larger than or equal to 1000 µm$^2$ is observed in some cases in the planar TEM image.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

In addition, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

In a TEM image, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a TEM image, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases (see FIG. 21B).

The nc-OS film is an oxide semiconductor film that has high regularity than an amorphous oxide semiconductor film. Thus, the nc-OS film has a lower density of defect states than the amorphous oxide semiconductor film Note that there is no regularity of crystal orientation between different crystal parts in the nc-OS film; thus, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 21A:
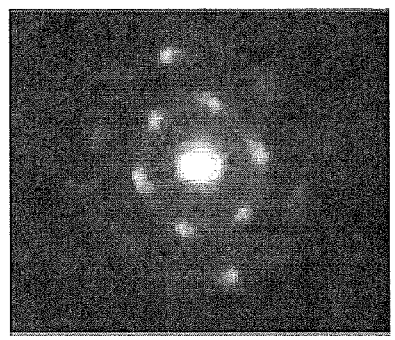
FIGS. 21A and 21B show nanobeam electron diffraction patterns of oxide semiconductor films.
Figure 21B:
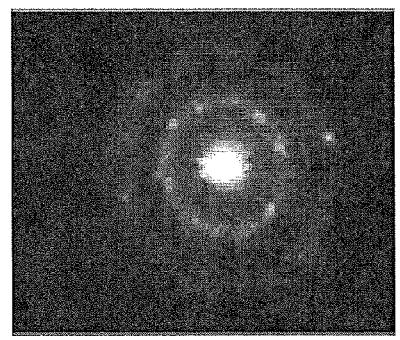
Figure 21C:
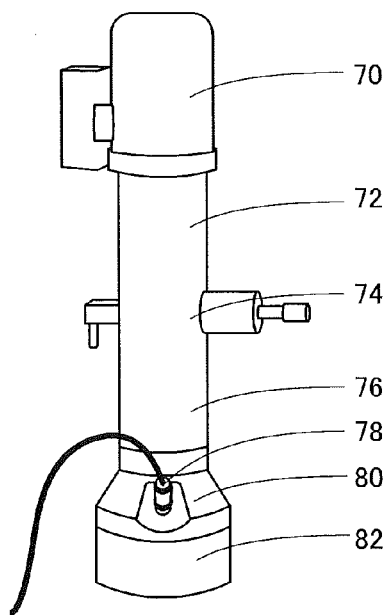
FIGS. 21C and 21D illustrate an example of a transmission electron diffraction measurement apparatus.

FIG. 21C illustrates a transmission electron diffraction measurement apparatus. The transmission electron diffraction measurement apparatus includes an electron gun chamber 70, an optical system 72 below the electron gun chamber 70, a sample chamber 74 below the optical system 72, an optical system 76 below the sample chamber 74, an observation chamber 80 below the optical system 76, a camera 78 provided for the observation chamber 80, and a film chamber 82 below the observation chamber 80. The camera 78 is provided to face toward the inside of the observation chamber 80. Note that the film chamber 82 is not necessarily provided.

Figure 21D:
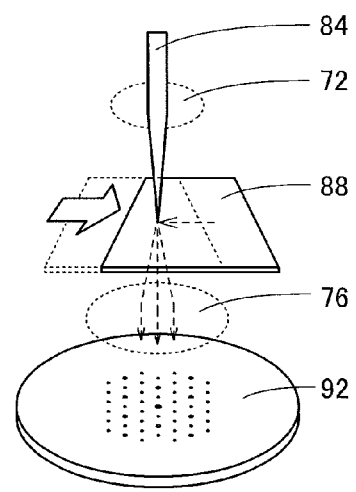

FIG. 21D illustrates the internal structure of the transmission electron diffraction measurement apparatus in FIG. 21C. In the transmission electron diffraction measurement apparatus, a substance 88 that is positioned in the sample chamber 74 is irradiated with electrons emitted from an electron gun installed in the electron gun chamber 70 through the optical system 72. Electrons passing through the substance 88 enter a fluorescent plate 92 provided in the observation chamber 80 through the optical system 76. On the fluorescent plate 92, a pattern corresponding to the intensity of the incident electron appears, which enables measurement of a transmission electron diffraction pattern.

The camera 78 is installed to face the fluorescent plate 92 and can take a picture of a pattern appearing in the fluorescent plate 92. An angle formed by a straight line that passes through the center of a lens of the camera 78 and the center of the fluorescent plate 92 and an upper surface of the fluorescent plate 92 is, for example, 15 to 80°, 30 to 75°, or 45 to 70°. As the angle is reduced, distortion of the transmission electron diffraction pattern taken by the camera 78 becomes larger. Note that if the angle is obtained in advance, distortion of an obtained transmission electron diffraction pattern can be corrected. The camera 78 may be set in the film chamber 82 in some cases. For example, the camera 78 may be set in the film chamber 82 to be opposite to the incident direction of electrons 84. In that case, a transmission electron diffraction pattern with less distortion can be taken from a rear surface of the fluorescent plate 92.

A holder for fixing the substance 88 that is a sample is provided in the sample chamber 74. The holder transmits electrons passing through the substance 88. The holder may have, for example, a function of moving the substance 88 along the x-axis, the y-axis, the z-axis, or the like. The movement function of the holder may have an accuracy of moving the substance in the range of, for example, 1 to 10 nm, 5 to 50 nm, 10 to 100 nm, 50 to 500 nm, and 100 nm to 1 μm. The range is preferably optimized depending on the structure of the substance 88.

Then, a method for measuring a transmission electron diffraction pattern of a substance by the transmission electron diffraction measurement apparatus is described.

For example, changes in the structure of a substance can be observed by changing (scanning) the irradiation position of the electrons 84 that are a nanobeam in the substance, as illustrated in FIG. 21D. At this time, when the substance 88 is a CAAC-OS film, a diffraction pattern as shown in FIG. 21A is observed. When the substance 88 is an nc-OS film, a diffraction pattern shown in FIG. 21B is observed.

Even when the substance 88 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, more preferably higher than or equal to 90%, still preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained immediately after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/s and the obtained diffraction patterns were converted into still images every 0.5 seconds. Note that as an electron beam, a nanobeam with a probe diameter of 1 nm was used. The above measurement was also performed on six samples. The proportion of CAAC was calculated using the average value of the six samples.

Figure 22A:
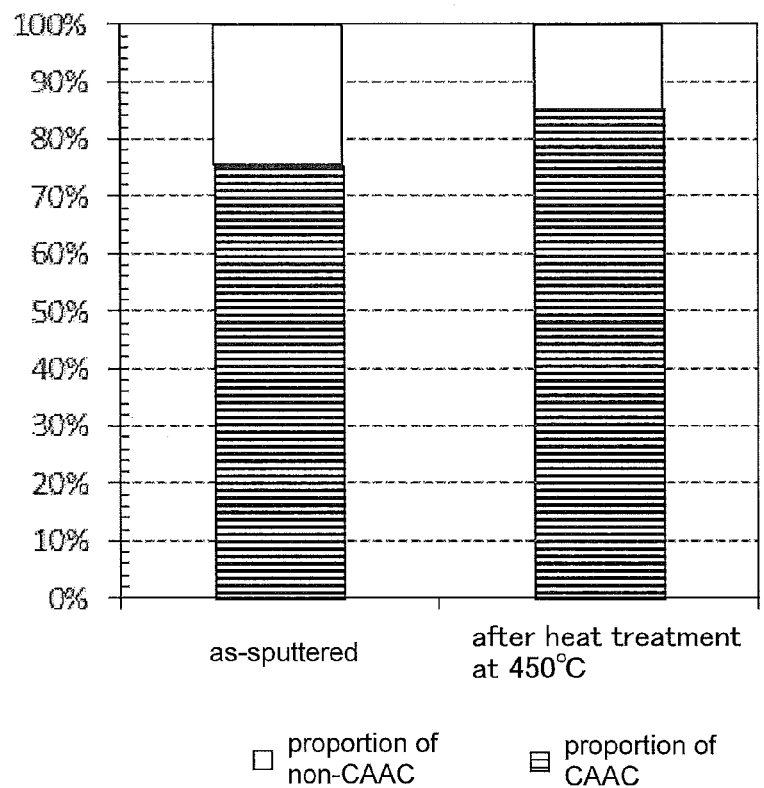
FIG. 22A shows an example of structural analysis by transmission electron diffraction measurement.

FIG. 22A shows the proportion of CAAC in each sample. The proportion of CAAC of the CAAC-OS film obtained immediately after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained immediately after the deposition. That is, heat treatment at high temperature (e.g., higher than or equal to 400° C.) reduces the proportion of non-CAAC (increases the proportion of CAAC). The above results also indicate that even when the temperature of the heat treatment is lower than 500° C., the CAAC-OS film can have a high proportion of CAAC.

Here, most of diffraction patterns different from that of a CAAC-OS film were similar to that of an nc-OS film. Furthermore, an amorphous oxide semiconductor film was not able to be observed in a measurement region. Thus, the results suggest that a region having a structure similar to that of an nc-OS film is rearranged by the heat treatment owing to the influence of the structure of an adjacent region, so that the region becomes CAAC.

Figure 22B:
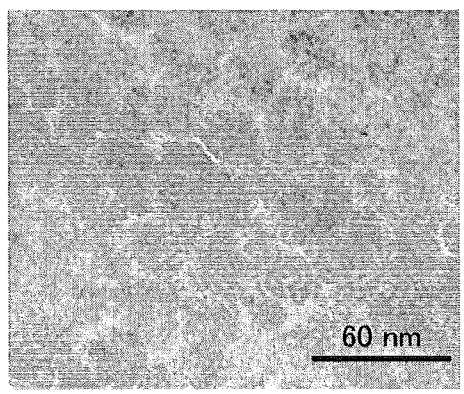
FIGS. 22B and 22C show planar TEM images.
Figure 22C:
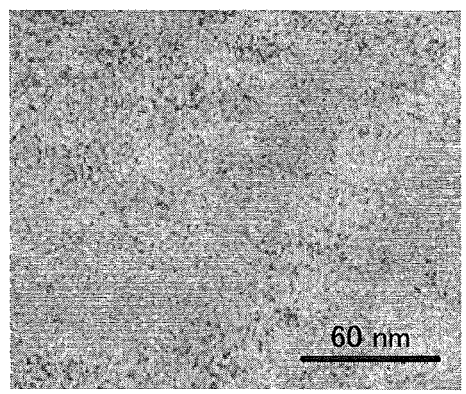

FIGS. 22B and 22C are planar TEM images of the CAAC-OS film obtained immediately after the deposition and the CAAC-OS film subjected to the heat treatment at 450° C., respectively. Comparison between FIGS. 22B and 22C shows that the CAAC-OS film subjected to the heat treatment at 450° C. has more even film quality. That is, heat treatment at high temperature improves the film quality of the CAAC-OS film.

With such a measurement method, the structure of an oxide semiconductor film having a plurality of structures can be analyzed in some cases.

<Deposition Model>

Examples of deposition models of a CAAC-OS film and an nc-OS film are described below.

Figure 46A:
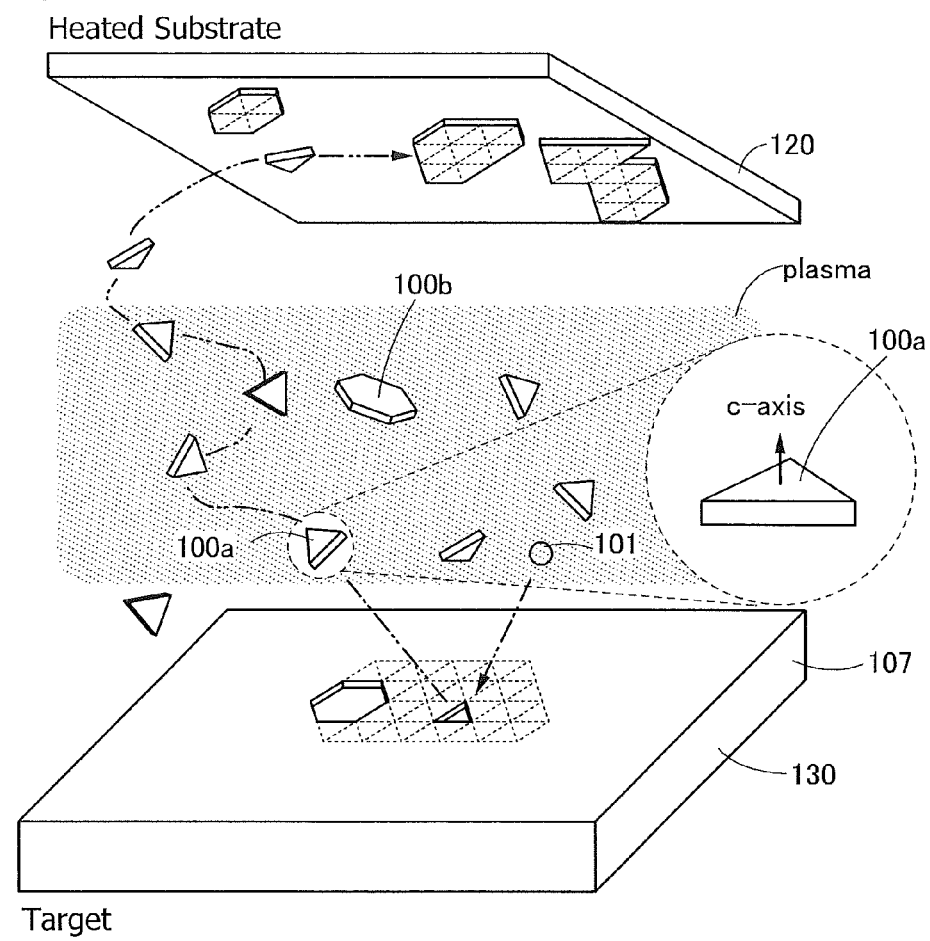
FIG. 46A schematically illustrates a CAAC-OS deposition model.

FIG. 46A is a schematic view of the inside of a deposition chamber where a CAAC-OS film is deposited by sputtering.

A target 130 is attached to a backing plate. Under the target 130 and the backing plate, a plurality of magnets are placed. The plurality of magnets generate a magnetic field over the target 130. Sputtering in which disposition speed is increased by utilizing a magnetic field of magnets is referred to as magnetron sputtering.

The target 130 has a polycrystalline structure in which a cleavage plane exists in at least one crystal grain. Note that the details of the cleavage plane are described later.

A substrate 120 is placed to face the target 130, and distance d (also referred to as target-substrate distance (T-S distance)) is 0.01 to 1 m, preferably 0.02 to 0.5 m. The deposition chamber is mostly filled with a deposition gas (e.g., an oxygen gas, an argon gas, or a mixed gas containing oxygen at 50 vol % or higher) and controlled to 0.01 to 100 Pa, preferably 0.1 to 10 Pa. Here, discharge starts by application of voltage at a certain value or higher to the target 130, and plasma is observed. Note that the magnetic field over the target 130 forms a high-density plasma region. In the high-density plasma region, the deposition gas is ionized, so that an ion 101 is generated. Examples of the ion 101 include an oxygen cation (O+) and an argon cation (Ar+).

The ion 101 is accelerated toward the target 130 side by an electric field, and collides with the target 130 eventually. At this time, a pellet 100*a* and a pellet 100*b* that are flat-plate-like (pellet-like) sputtered particles are separated and sputtered from the cleavage plane. Note that structures of the pellet 100*a* and the pellet 100*b* may be distorted by the impact of collision of the ion 101.

The pellet 100*a* is a flat-plate-like (pellet-like) sputtered particle having a triangle plane, e.g., a regular triangle plane. The pellet 100*b* is a flat-plate-like (pellet-like) sputtered particle having a hexagon plane, e.g., a regular hexagon plane. Note that flat-plate-like (pellet-like) sputtered particles such as the pellet 100*a* and the pellet 100*b* are collectively called pellets 100. The shape of a flat plane of the pellet 100 is not limited to a triangle or a hexagon. For example, the flat plane may have a shape formed by combining two to six triangles. For example, a square (rhombus) is formed by combining two triangles (regular triangles) in some cases.

The thickness of the pellet 100 is determined depending on the kind of the deposition gas and the like. Although the reasons are described later, the thicknesses of the pellets 100 are preferably uniform. In addition, the sputtered particle preferably has a pellet shape with small thickness as compared to a dice shape with large thickness.

Figure 48:
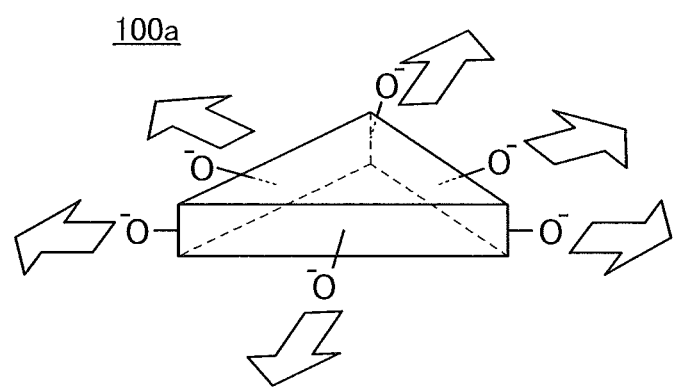
FIG. 48 illustrates a pellet.

The pellet 100 receives charge when passing through the plasma, so that side surfaces of the pellet 100 are negatively or positively charged in some cases. The pellet 100 includes oxygen atoms on its side surfaces, and the oxygen atoms might be negatively charged. For example, the case in which the pellet 100*a* includes, on side surfaces, oxygen atoms that are negatively charged is illustrated in FIG. 48. When the side surfaces are charged in the same polarity as in this view, charges repel each other; thus, the pellet 100*a* can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged.

Figure 49:
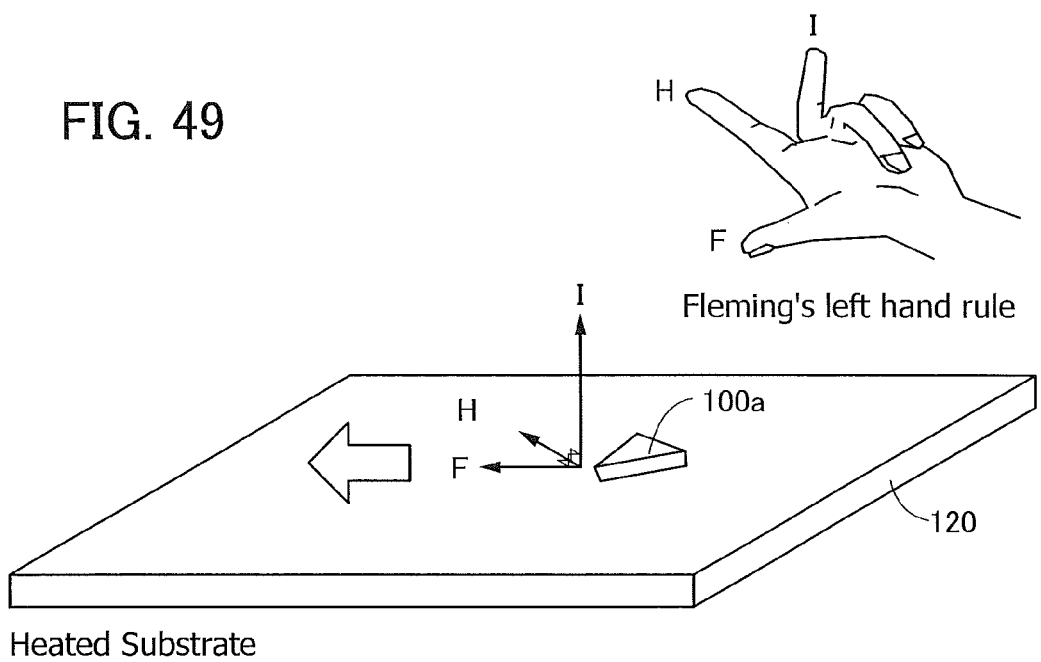
FIG. 49 illustrates force applied to a pellet on a formation surface.

As illustrated in FIG. 46A, the pellet 100 flies like a kite in plasma and flutters up to the substrate 120, for example. Since the pellets 100 are charged, when the pellet 100 gets close to a region where another pellet 100 has already been deposited, repulsion is generated. Here, above the substrate 120, a magnetic field is generated in a direction parallel to a top surface of the substrate 120. A potential difference is given between the substrate 120 and the target 130, so that current flows from the substrate 120 toward the target 130. Thus, the pellet 100 is given force (Lorentz force) on the top surface of the substrate 120 by the action of the magnetic field and the current (see FIG. 49). This is explainable with Fleming's left-hand rule. In order to increase force applied to the pellet 100, it is preferable to provide, on the top surface, a region where the magnetic field in a direction parallel to the top surface of the substrate 120 is 10 G or higher, preferably 20 G or higher, more preferably 30 G or higher, still preferably 50 G or higher. Alternatively, it is preferable to provide, on the top surface, a region where the magnetic field in a direction parallel to the top surface of the substrate is 1.5 times or more, preferably twice or more, further preferably 3 times or more, still further preferably 5 times or more that in a direction perpendicular to the top surface of the substrate 120.

Figure 50A:
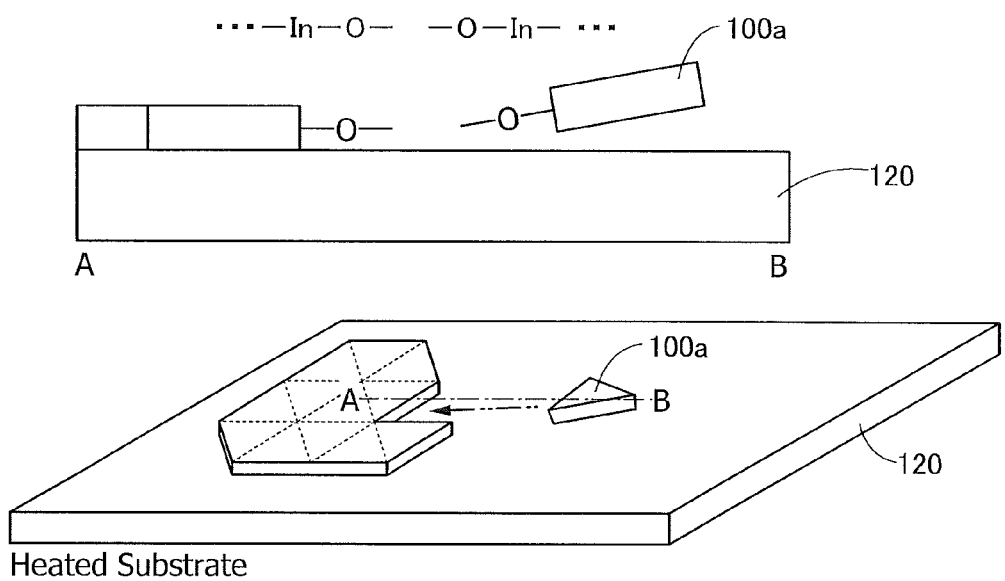
FIGS. 50A and 50B illustrate movement of a pellet on a formation surface.
Figure 50B:
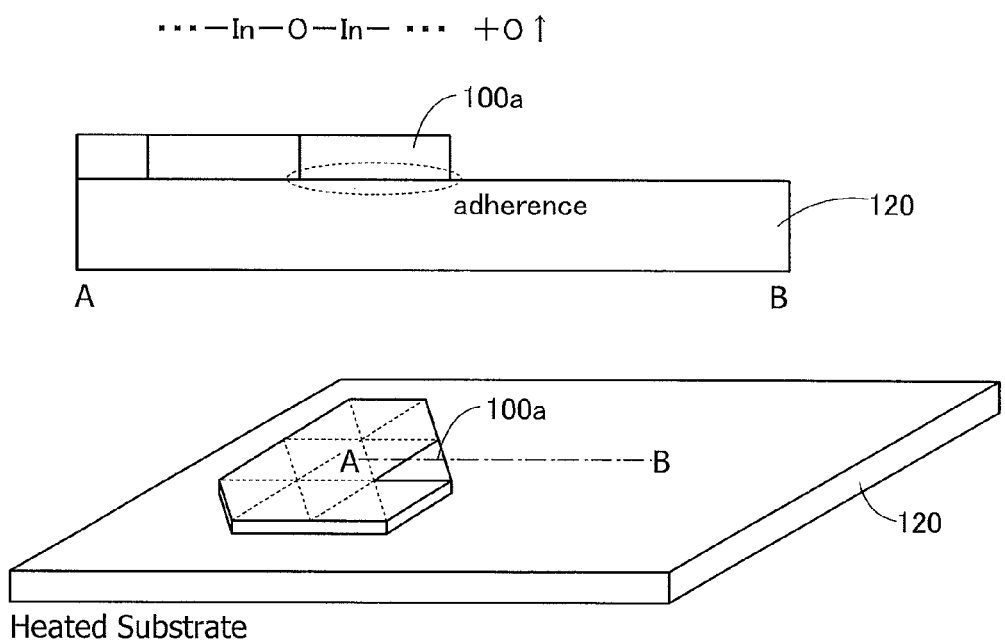

Furthermore, the substrate 120 is heated, and resistance such as friction between the pellet 100 and the substrate 120 is low. As a result, as illustrated in FIG. 50A, the pellet 100 glides on the top surface of the substrate 120. The glide of the pellet 100 is caused in a state where the flat plane faces the substrate 120. Then, as illustrated in FIG. 50B, when the pellet 100 reaches the side surface of another pellet 100 that has been already deposited, the side surfaces of the pellets 100 are bonded. At this time, the oxygen atom on the side surface of the pellet 100 is released. With the released oxygen atom, oxygen vacancies in a CAAC-OS are filled in some cases; thus, the CAAC-OS has low density of defect states.

Furthermore, the pellet 100 is heated on the substrate 5120, so that atoms are rearranged and the structure distortion caused by the collision of the ion 101 can be reduced. The pellet 100 whose distortion is reduced is substantially single crystal. Even when the pellets 100 are heated after being bonded, expansion and contraction of the pellet 100 itself hardly occur, which is caused by turning the pellet 100 substantially single crystal. Thus, formation of defects such as a grain boundary due to expansion of a space between the pellets 100 can be prevented, so that generation of crevasses can be prevented. Furthermore, the space is filled with elastic metal atoms and the like, and the elastic metal atoms have a function, like a highway, of jointing side surfaces of the pellets 100 that are not aligned with each other.

As shown in such a model, the pellets 100 are considered to be deposited on the substrate 120. Thus, a CAAC-OS can be deposited even when a formation surface does not have a crystal structure, which is different from deposition by epitaxial growth. For example, even when a top surface (formation surface) of the substrate 120 has an amorphous structure, a CAAC-OS can be deposited.

Figure 46B:
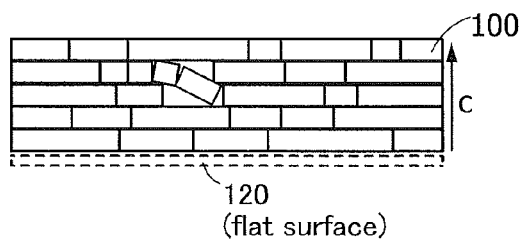
FIGS. 46B and 46C are cross-sectional views of pellets and a CAAC-OS.

It is also found that in formation of the CAAC-OS, the pellets 100 are arranged in accordance with a surface shape of the substrate 120 that is the formation surface even when the formation surface has unevenness besides a flat surface. For example, in the case where the top surface of the substrate 120 is flat at the atomic level, the pellets 100 are arranged so that flat planes parallel to the a-b plane face downwards; thus, a layer with uniform thickness, flatness, and high crystallinity is formed. By stacking n layers (n is a natural number), the CAAC-OS can be obtained (see FIG. 46B).

Figure 46C:
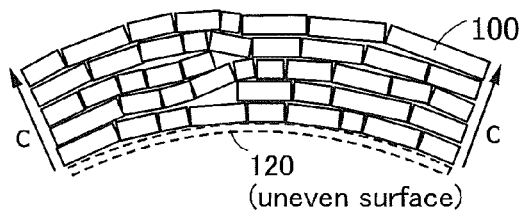

In the case where the top surface of the substrate 120 has unevenness, a CAAC-OS where n layers (n is a natural number) in each of which the pellets 100 are arranged along a convex surface are stacked is formed. Since the substrate 120 has unevenness, a gap is easily generated between the pellets 100 in the CAAC-OS in some cases. Note that owing to intermolecular force, the pellets 100 are arranged so that a gap between the pellets is as small as possible even over the unevenness surface. Therefore, even when the formation surface has unevenness, a CAAC-OS with high crystallinity can be formed (see FIG. 46C).

As a result, laser crystallization is not needed for formation of a CAAC-OS, and a uniform film can be formed even over a large-area glass substrate or the like.

Since the CAAC-OS is deposited in accordance with such a model, the sputtered particle preferably has a pellet shape with small thickness. Note that in the case where the sputtered particles have a dice shape with large thickness, planes of the particles facing the substrate 120 vary; thus, the thickness and the orientation of the crystals cannot be uniform in some cases.

According to the deposition model, a CAAC-OS with high crystallinity can be formed even on a formation surface with an amorphous structure.

Furthermore, formation of a CAAC-OS can be described with a deposition model including a zinc oxide particle besides the pellet 100.

The zinc oxide particle reaches the substrate 120 before the pellet 100 does because the zinc oxide particle is smaller than the pellet 200 in mass. On the top surface of the substrate 120, crystal growth of the zinc oxide particle preferentially occurs in a horizontal direction, so that a thin zinc oxide layer is formed. The zinc oxide layer has c-axis alignment. Note that c-axes of crystals in the zinc oxide layer are aligned in a direction parallel to a normal vector of the substrate 120. The zinc oxide layer serves as a seed layer that makes a CAAC-OS grow and thus has a function of increasing crystallinity of the CAAC-OS. The thickness of the zinc oxide layer is 0.1 to 5 nm, mostly 1 to 3 nm. Since the zinc oxide layer is sufficiently thin, a grain boundary is hardly observed.

Thus, in order to deposit a CAAC-OS with high crystallinity, a target containing zinc at higher proportion than the stoichiometric composition is preferably used.

Figure 47:
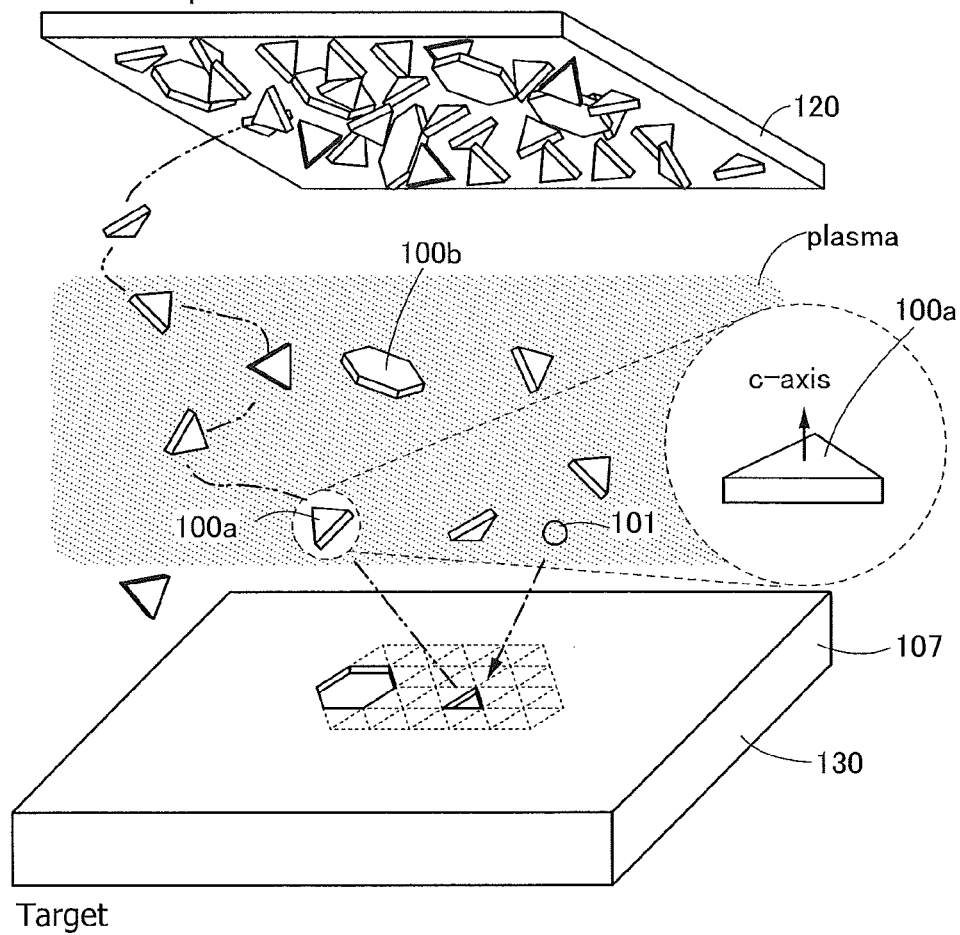
FIG. 47 schematically illustrates a deposition model of an nc-OS and a pellet.

An nc-OS can be understood with a deposition model illustrated in FIG. 47. Note that a difference between FIG. 47 and FIG. 46A lies only in whether the substrate 120 is heated.

Thus, the substrate 120 is not heated, and resistance such as friction between the pellet 100 and the substrate 120 is high. As a result, the pellets 100 cannot glide on the top surface of the substrate 120 and are stacked randomly, so that an nc-OS can be obtained.

<Cleavage Plane>

A cleavage plane that has been mentioned in the deposition model of the CAAC-OS is described below.

Figure 51A:
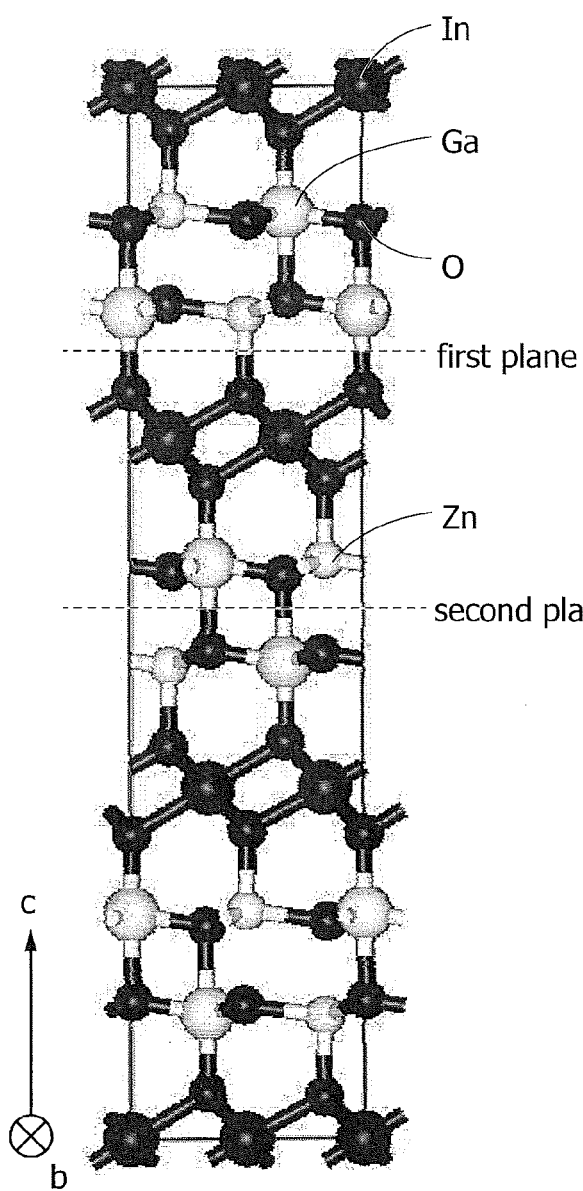
FIGS. 51A and 51B show an $InGaZnO_4$ crystal.
Figure 51B:
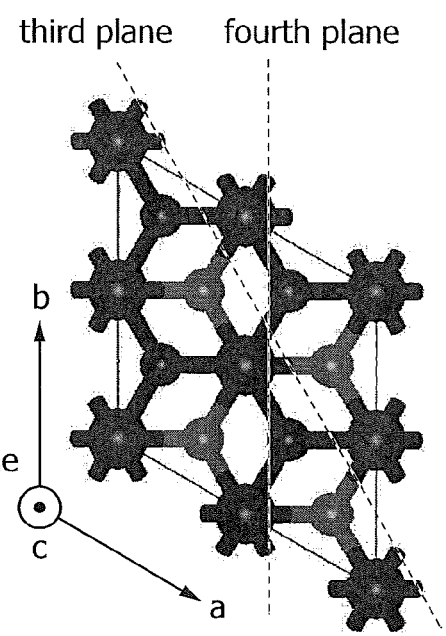

First, a cleavage plane of the target is described with reference to FIGS. 51A and 51B. FIGS. 51A and 51B show the crystal structure of InGaZnO$_4$. Note that FIG. 51A shows the structure of the case where an InGaZnO$_4$ crystal is observed from a direction parallel to the b-axis when the c-axis is in an upward direction. Furthermore, FIG. 51B shows the structure of the case where the InGaZnO$_4$ crystal is observed from a direction parallel to the c-axis.

Energy needed for cleavage at each crystal plane of the InGaZnO$_4$ crystal is calculated by the first principles calculation. Note that a pseudo potential and a density functional theory program (CASTEP) using the plane wave basis are used for the calculation. An ultrasoft type pseudo potential is used as the pseudo potential. Furthermore, GGA/PBE is used as the functional. Cut-off energy is 400 eV.

Energy of a structure in an initial state is obtained after structural optimization including a cell size is performed. Furthermore, energy of a structure after the cleavage at each plane is obtained after structural optimization of atomic order is performed in a state where the cell size is fixed.

On the basis of the structure of the InGaZnO$_4$ crystal in FIGS. 51A and 51B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 51A). The second plane is a crystal plane between a Ga—Zn—O layer and a Ga—Zn—O layer and is parallel to the (001) plane (or the a-b plane) (see FIG. 51A). The third plane is a crystal plane parallel to the (110) plane (see FIG. 51B). The fourth plane is a crystal plane parallel to the (100) plane (or the b-c plane) (see FIG. 51B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy that serves as a measure of easiness of cleavage at each plane is calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane is 2.60 J/m$^2$, that of the second plane is 0.68 J/m$^2$, that of the third plane is 2.18 J/m$^2$, and that of the fourth plane is 2.12 J/m$^2$ (see Table 1).

TABLE 1

|  | Cleavage energy [J/m$^2$] |
| --- | --- |
| First plane | 2.60 |
| Second plane | 0.68 |
| Third plane | 2.18 |
| Fourth plane | 2.12 |

From the calculations, in the structure of the InGaZnO$_4$ crystal in FIGS. 51A and 51B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between the Ga—Zn—O layer and the Ga—Zn—O layer, the InGaZnO$_4$ crystals in FIG. 51A can be separated at a plane equivalent to two second planes. Thus, in the case where an ion or the like is made to collide with a target, a wafer-like unit (we call this a pellet) that is cleaved at a plane with the lowest cleavage energy is thought to be blasted off as the minimum unit. In that case, a pellet of InGaZnO$_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and crystal plane parallel to the (001) plane (or the a-b plane)), which suggests that most of the flat planes of the pellets have triangle shapes or hexagonal shapes.

Figure 52A:
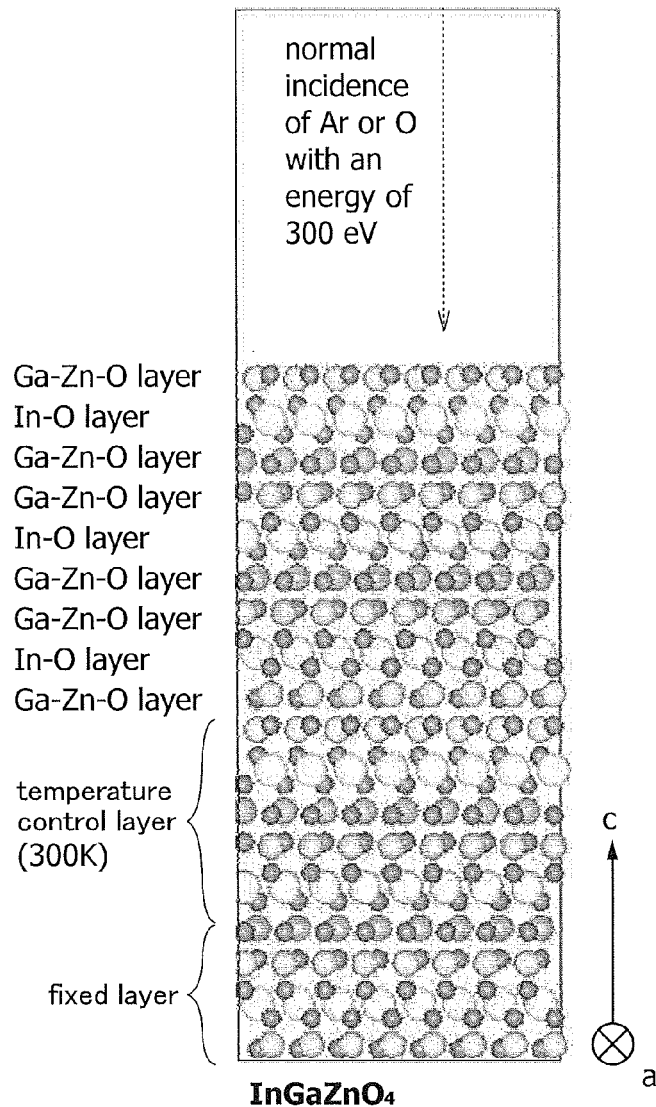
Figure 52B:
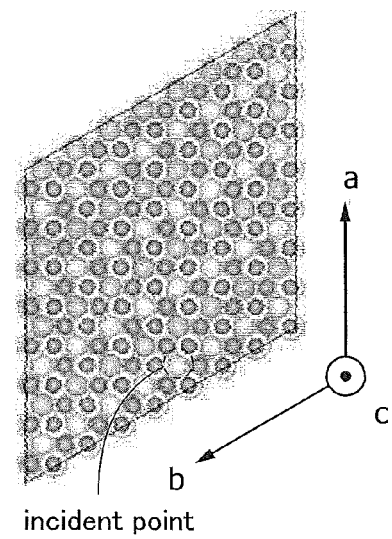

Next, through classical molecular dynamics calculation, on the assumption of an InGaZnO$_4$ crystal having a homologous structure as a target, a cleavage plane is examined in the case where the target is sputtered using argon (Ar) or oxygen (O). FIG. 52A shows a cross-sectional structure of an InGaZnO$_4$ crystal (2688 atoms) used for the calculation, and FIG. 52B shows a top structure thereof. Note that a fixed layer in FIG. 52A prevents the positions of the atoms from moving. A temperature control layer in FIG. 52A is a layer whose temperature is constantly set to fixed temperature (300 K).

For the classical molecular dynamics calculation, Materials Explorer 5.0 manufactured by Fujitsu Limited is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

Figure 53A:
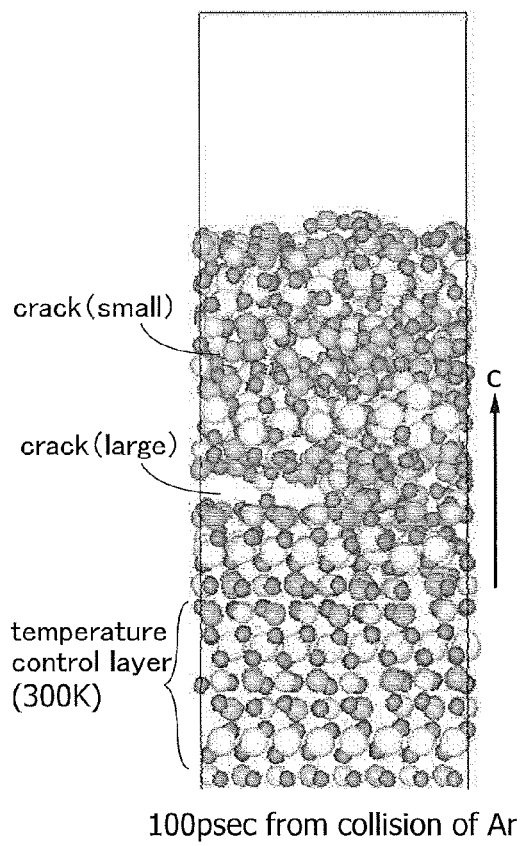
Figure 53B:
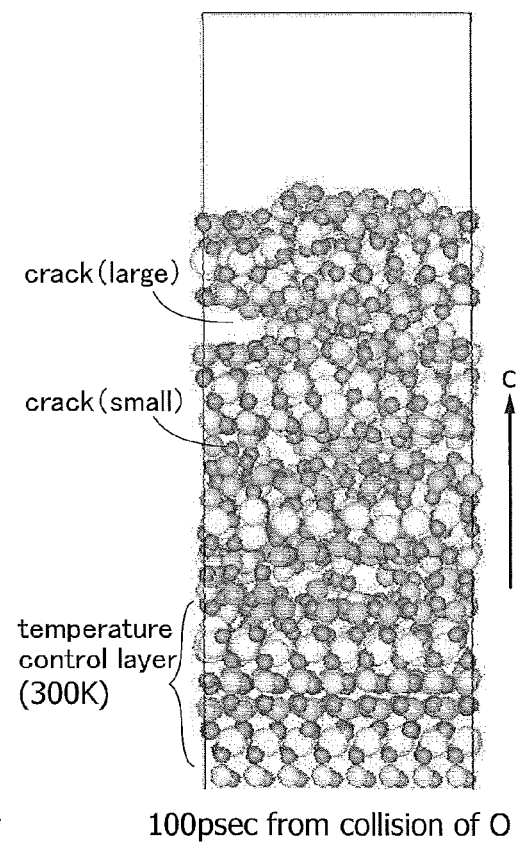

FIG. 53A shows atomic order when 99.9 picoseconds have passed after argon enters the cell including the InGaZnO$_4$ crystal in FIGS. 52A and 52B. FIG. 53B shows atomic order when 99.9 picoseconds have passed after oxygen enters the cell. Note that in FIGS. 53A and 53B, part of the fixed layer in FIG. 52A is omitted.

According to FIG. 53A, in a period from entry of argon into the cell to when 99.9 picoseconds have passed, a crack is formed from the cleavage plane corresponding to the second plane in FIG. 51A. Thus, in the case where argon collides with the InGaZnO$_4$ crystal and the uppermost surface is the second plane (the zero-th), a large crack is found to be formed in the second plane (the second).

On the other hand, according to FIG. 53B, in a period from entry of oxygen into the cell to when 99.9 picoseconds have passed, a crack is found to be formed from the cleavage plane corresponding to the second plane in FIG. 51A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, a difference in size of the pellet depending on atoms that are made to collide is studied.

FIG. 54A shows trajectories of the atoms from 0 picosecond to 0.3 picoseconds after argon enters the cell including the InGaZnO$_4$ crystal in FIGS. 52A and 52B. Accordingly, FIG. 54A corresponds to a period from FIGS. 52A and 52B to FIG. 53A.

According to FIG. 54A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that argon which collides with gallium is sputtered to the outside. Accordingly, in the case where argon collides with the target including the InGaZnO$_4$ crystal, a crack is thought to be formed in the second plane (the second) in FIG. 52A.

FIG. 54B shows trajectories of the atoms from 0 picosecond to 0.3 picoseconds after oxygen enters the cell including the InGaZnO$_4$ crystal in FIGS. 52A and 52B. Accordingly, FIG. 54B corresponds to a period from FIGS. 52A and 52B to FIG. 53A.

On the other hand, according to FIG. 54B, when oxygen collides with gallium (Ga) of the first layer (Ga—Zn—O layer), gallium collides with zinc (Zn) of the third layer (Ga—Zn—O layer) and then, zinc does not reach the fifth layer (In—O layer). Note that oxygen which collides with gallium is sputtered to the outside. Accordingly, in the case where oxygen collides with the target including the InGaZnO$_4$ crystal, a crack is thought to be formed in the second plane (the first) in FIG. 52A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by Formula (1) and Formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

$$E = \frac{1}{2}m_A v_A^2 + \frac{1}{2}m_A v_{Ga}^2 \quad (1)$$

$$m_A v_A + m_{Ga} v_{Ga} = m'_A v'_A + m'_{Ga} v'_{Ga} \quad (2)$$

On the assumption that collision of argon or oxygen is elastic collision, the relationship among $v_A$, $v'_A$, $v_{Ga}$, and $v'_{Ga}$ can be represented by Formula (3).

$$v'_A - v'_{Ga} = -(v_A - v_{Ga}) \quad (3)$$

From Formulae (1), (2), and (3), on the assumption that $v_{Ga}$ is 0, the speed of gallium $v'_{Ga}$ after collision of argon or oxygen can be represented by Formula (4).

$$v'_{Ga} = \frac{\sqrt{m_A}}{m_A + m_{Ga}} \cdot 2\sqrt{2E} \quad (4)$$

In Formula (4), mass of argon or oxygen is substituted into $m_A$, and the speeds after collision of the atoms are compared. In the case where argon and oxygen have the same energy before collision, the speed of gallium when argon collides with gallium was found to be 1.24 times the speed of gallium when oxygen collides with gallium. Thus, the energy of gallium when argon collides with gallium is higher than the energy of gallium when oxygen collides with gallium by the square of the speed.

The speed (energy) of gallium after collision when argon collides with gallium is found to be higher than the speed (energy) of gallium after collision when oxygen collides with gallium. Accordingly, a crack is considered to be formed at a deeper position in the case where argon collides with gallium than in the case where oxygen collides with gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size that is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model in FIG. 46A where sputtered pellets are deposited to form a CAAC-OS is a reasonable model.

The CAAC-OS deposited in this manner has density substantially equal to that of a single crystal OS. For example, the density of the single crystal OS having a homologous structure of InGaZnO$_4$ is 6.36 g/cm$^3$, and the density of the CAAC-OS having substantially the same atomic ratio is approximately 6.3 g/cm$^3$.

Figure 55A:
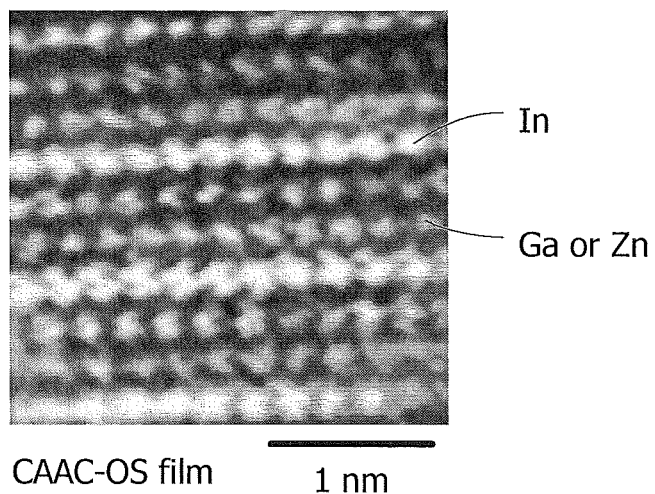
FIGS. 55A and 55B are cross-sectional HAADF-STEM images of a CAAC-OS and a target.
Figure 55B:
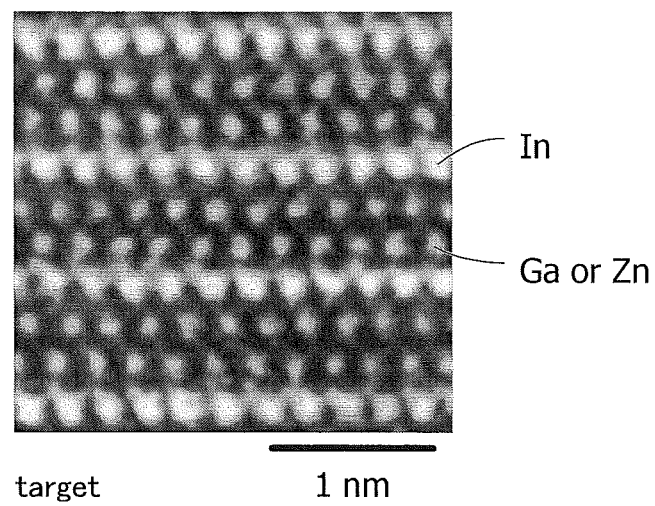

FIGS. 55A and 55B show atomic order of cross sections of an In—Ga—Zn oxide (see FIG. 55A) that is a CAAC-OS deposited by sputtering and a target thereof (see FIG. 55B). For observation of atomic order, a high-angle annular dark field scanning transmission electron microscopy (HAADF-STEM) is used. In the case of observation by HAADF-STEM, the intensity of an image of each atom is proportional to the square of its atomic number. Thus, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 55A and FIG. 55B are compared, it is found that the CAAC-OS and the target each have a homologous structure and atomic order in the CAAC-OS correspond to that in the target. Thus, as illustrated in the deposition model in FIG. 46A, the crystal structure of the target is transferred, so that a CAAC-OS is deposited.

Note that the structures, methods, and the like described in this embodiment can be combined with any of the structures, methods, and the like described in the other embodiments as appropriate.

Embodiment 6

In the transistor including an oxide semiconductor film, current in an off state (off-state current) can be made low, as described in Embodiment 2. Accordingly, an electric signal such as an image signal can be held for a longer period and a writing interval can be set longer.

With the use of a transistor with low off-state current, a display device in this embodiment can display images by at least two driving methods (modes). A first driving mode is a conventional driving method of a display device, in which data is rewritten sequentially every frame. A second driving mode is a driving method in which data rewriting is stopped after data writing is executed, i.e., a driving mode with a reduced refresh rate.

Moving images are displayed in the first driving mode. A still image can be displayed without change in image data every frame; thus, it is not necessary to rewrite data every frame. When the display device is driven in the second driving mode in displaying still images, power consumption can be reduced with fewer screen flickers.

The amount of charge accumulated in a capacitor in a pixel used in the display device in this embodiment is large. Thus, it is possible to hold the potential of a pixel electrode for a longer time and to apply a driving mode with a reduced refresh rate. In addition, a change in voltage held in the pixel can be inhibited for a long time even when the display device is used in the driving mode with a reduced refresh rate. This makes it possible to prevent screen flickers from being perceived by a user more effectively. Thus, power consumption can be reduced and display quality can be improved.

An effect of reducing the refresh rate is described here.

Eye strain is divided into two categories: nerve strain and muscle strain. The nerve strain is caused by prolonged looking at light emitted from a display device or blinking images. This is because brightness stimulates and fatigues the retina and nerve of the eye and the brain. The muscle strain is caused by overuse of a ciliary muscle that works for adjusting the focus.

Figure 23A:
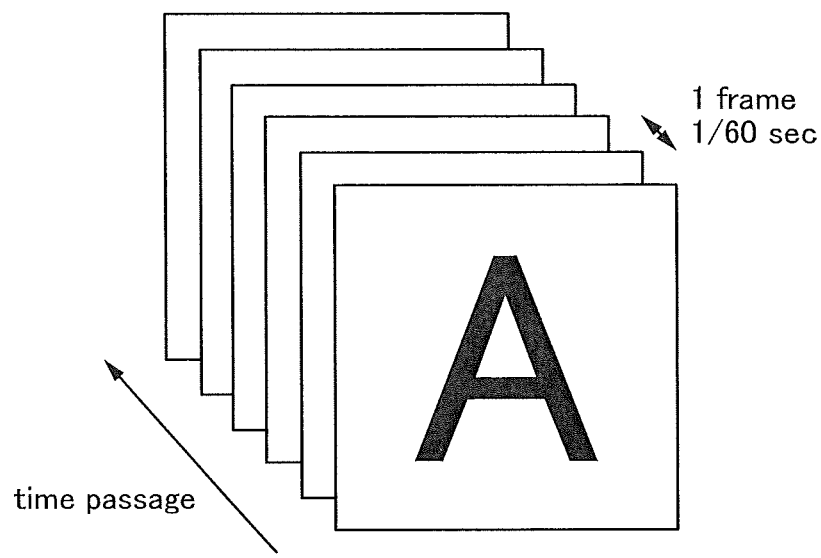
FIGS. 23A and 23B are conceptual diagrams illustrating examples of a method for driving a display device.

FIG. 23A is a schematic diagram showing display on a conventional display device. As illustrated in FIG. 23A, for the display of the conventional liquid crystal display device, image rewriting is performed 60 times every second. Prolonged looking at such a screen might stimulate the retina and nerve of the eye and the brain of a user and lead to eye strain.

In one embodiment of the present invention, a transistor with extremely low off-state current (e.g., a transistor including an oxide semiconductor) is used in a pixel portion of a display device. In addition, the capacitor included in the pixel of the display device can have large area. With these components, leakage of charge accumulated in the capacitor can be inhibited and a change in the potential can be made gradual; thus, the luminance of the display device can be suppressed even at lower frame frequency.

Figure 23B:
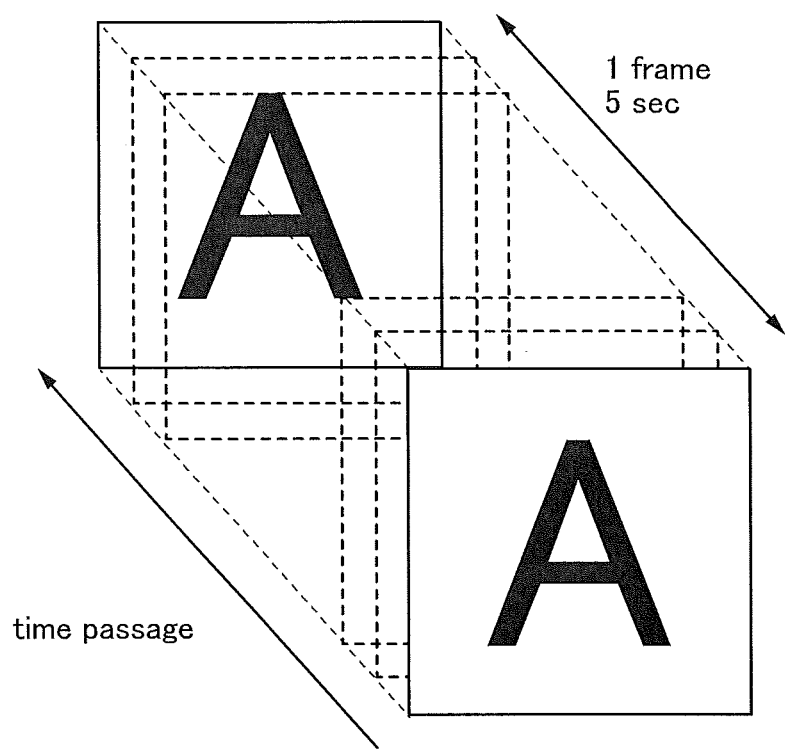

In other words, as shown in FIG. 23B, an image can be rewritten once every five seconds, for example. This enables the user to see the same image as long as possible, so that flickers on the screen recognized by the user are reduced. Consequently, stimuli to the retina and nerve of the eye and the brain of the user are relieved, resulting in less nerve strain.

According to one embodiment of the present invention, an eye-friendly display device can be provided.

Note that the structures, methods, and the like described in this embodiment can be combined with any of the structures, methods, and the like described in the other embodiments as appropriate.

Embodiment 7

In this embodiment, pixel structure examples in a display device according to one embodiment of the present invention in displaying color images are described with reference to drawings. Note that in this embodiment, a pixel capable of displaying color images is referred to as a pixel pix_color, and a pixel included in the pixel pix_color is referred to as a subpixel sub_pix. The subpixel sub_pix in this embodiment corresponds to the pixel pix described in Embodiment 2.

FIGS. 24A to 24D illustrate structure examples of the pixel pix_color capable of displaying color images.

Figure 24A:
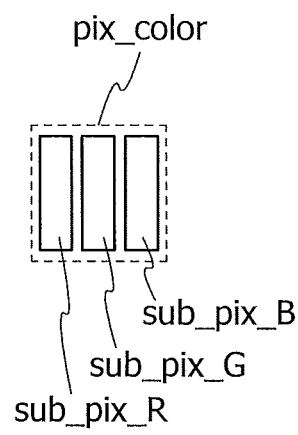
FIGS. 24A to 24D are block diagrams illustrating structure examples of pixels.

FIG. 24A illustrates a structure example of the pixel pix_color displaying color images by three primary colors of red (R), green (G), and blue (B). The subpixels sub_pix may have a structure in which materials exhibiting respective colors are used for light-emitting elements, a structure in which white light is emitted and converted into colors of R, G, and B by a color filter, or a structure in which conversion into colors of R, G, and B is performed by a color conversion layer. As illustrated in FIG. 24A, in the pixel pix_color, a subpixel sub_pix_R emitting red light, a subpixel sub_pix_G emitting green light, and a subpixel sub_pix_B emitting blue light may be arranged in stripes.

Figure 24B:
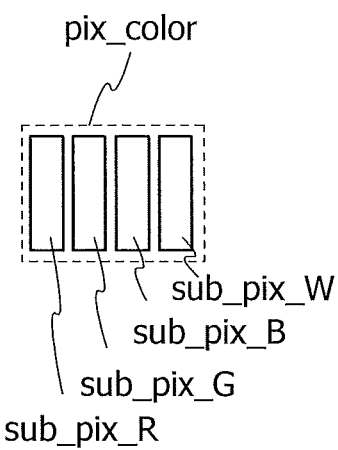

FIG. 24B illustrates a structure example of the pixel pix_color displaying color images by white (W) in addition to three primary colors of red (R), green (G), and blue (B). The subpixels sub_pix may have a structure in which materials exhibiting respective colors are used for light-emitting elements, a structure in which white light is emitted and converted into colors of R, G, and B by a color filter, or a structure in which conversion into colors of R, G, B, and W is performed by a color conversion layer. As illustrated in FIG. 24B, in the pixel pix_color, the subpixel sub_pix_R emitting red light, the subpixel sub_pix_G emitting green light, the subpixel sub_pix_B emitting blue light, and a subpixel sub_pix_W emitting white light may be arranged in stripes. Since the subpixel sub_pix_W emitting white light does not require a color filter, power consumption can be reduced.

Figure 24C:
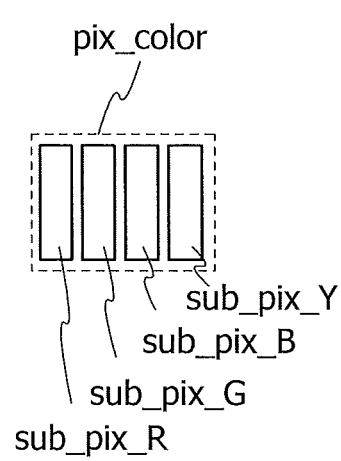

FIG. 24C illustrates a structure example of the pixel pix_color displaying color images by yellow (Y) in addition to three primary colors of red (R), green (G), and blue (B). The subpixels sub_pix may have a structure in which materials exhibiting respective colors are used for light-emitting elements, a structure in which white light is emitted and converted into colors of R, G, B, and Y by a color filter, or a structure in which conversion into colors of R, G, B, and Y is performed by a color conversion layer. As illustrated in FIG. 24C, in the pixel pix_color, the subpixel sub_pix_R emitting red light, the subpixel sub_pix_G emitting green light, the subpixel sub_pix_B emitting blue light, and a subpixel sub_pix_Y emitting yellow light may be arranged in stripes. When the subpixel sub_pix_Y emitting yellow light and the subpixel sub_pix_B emitting blue light emit light at the same time (yellow and blue are complementary colors), white is obtained; thus, the subpixel sub_pix_R emitting red light, the subpixel sub_pix_G emitting green light, and the subpixel sub_pix_B emitting blue light do not need to emit light at the same time. The power consumption of a structure in which white is obtained by the subpixels sub_pix emitting lights of two colors can be lower than the power consumption of a structure in which white is obtained by the subpixels sub_pix emitting lights of three colors.

Figure 24D:
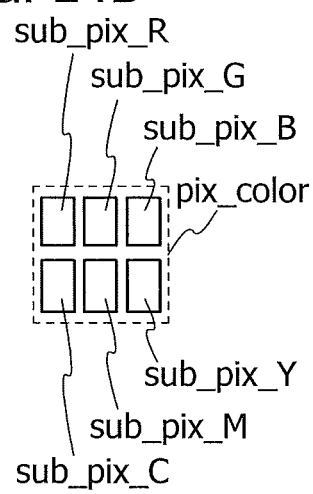

FIG. 24D illustrates a structure example of the pixel pix_color displaying color images by yellow (Y), magenta (M), and cyan (C) in addition to three primary colors of red (R), green (G), and blue (B). The subpixels sub_pix may have a structure in which materials exhibiting respective colors are used for light-emitting elements, a structure in which white light is emitted and converted into colors of R, G, B, Y, M, and C by a color filter, or a structure in which conversion into colors of R, G, B, Y, M, and C is performed by a color conversion layer. As illustrated in FIG. 24D, in the pixel pix_color, the subpixel sub_pix_R emitting red light, the subpixel sub_pix_G emitting green light, the subpixel sub_pix_B emitting blue light, the subpixel sub_pix_Y emitting yellow light, a subpixel sub_pix_M emitting magenta light, and a subpixel sub_pix_C emitting cyan light may be arranged in stripes. This structure can improve color saturation.

Although FIGS. 24A to 24D illustrate the subpixels sub_pix corresponding to respective colors are rectangles, the structures thereof are not limited thereto. The pixel pix_color may be constituted by a combination of the subpixels sub_pix whose shapes are triangles, ellipses, squares, and the like.

Note that the structures, methods, and the like described in this embodiment can be combined with any of the structures, methods, and the like described in the other embodiments as appropriate.

Embodiment 8

In this embodiment, structural examples of electronic devices each including a display device according to one embodiment of the present invention are described. In addition, in this embodiment, a display module including a display device according to one embodiment of the present invention is described with reference to FIG. 25.

Figure 25:
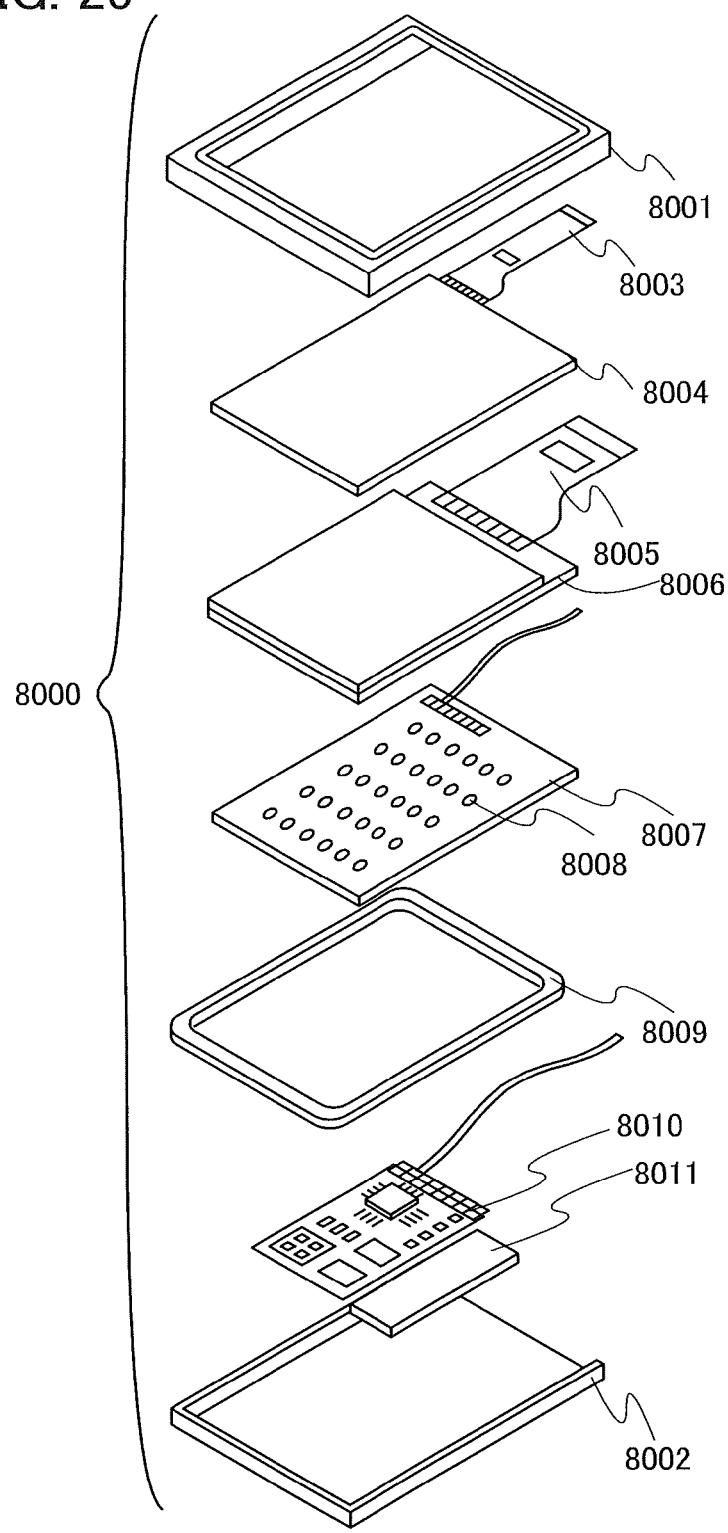
FIG. 25 illustrates a display module.

In a display module 8000 in FIG. 25, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The display device according to one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap the display panel 8006. A counter substrate (sealing substrate) of the display panel 8006 can have a touch panel function. An optical sensor may be provided in each pixel of the display panel 8006 to form an optical touch panel. An electrode for a touch sensor may be provided in each pixel of the display panel 8006 to form a capacitive touch panel.

The backlight unit 8007 includes a light source 8008. The light source 8008 may be provided at an end portion of the backlight unit 8007 and a light diffusion plate may be used.

The frame 8009 protects the display panel 8006 and functions as an electromagnetic shield for blocking electromagnetic waves generated by the operation of the printed board 8010. The frame 8009 may function as a radiator plate.

The printed board 8010 includes a power supply circuit and a signal processing circuit for outputting video signals and clock signals. As a power source for supplying power to the power supply circuit, an external commercial power source or a separate power source using the battery 8011 may be used. The battery 8011 can be omitted when a commercial power source is used.

The display module 8000 may be additionally provided with a member such as a polarizing plate, a retardation plate, or a prism sheet.

FIGS. 26A to 26H and FIGS. 27A to 27D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, smell, or infrared ray), a microphone 5008, and the like.

Figure 26A:
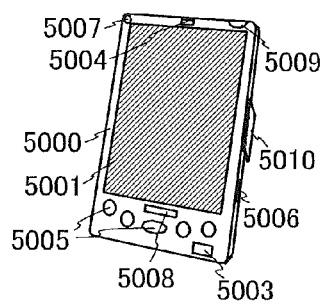
FIGS. 26A to 26H are each an external view of an electronic device according to one embodiment.
Figure 26B:
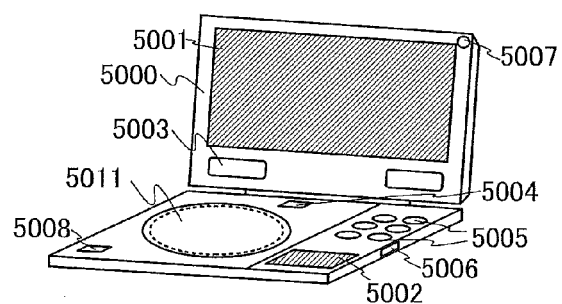
Figure 26C:
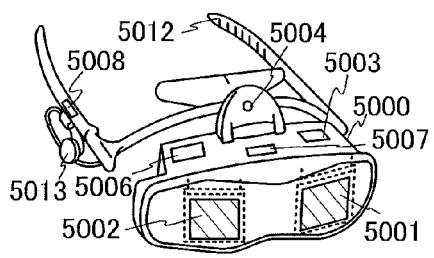
Figure 26D:
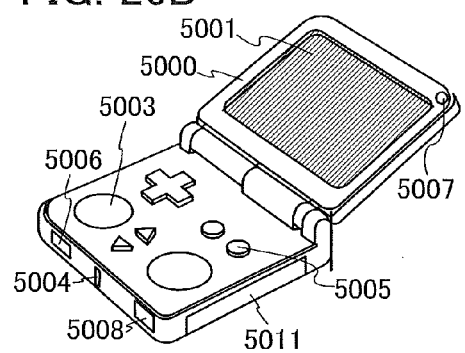
Figure 26E:
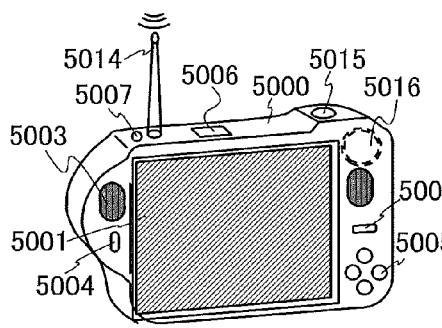
Figure 26F:
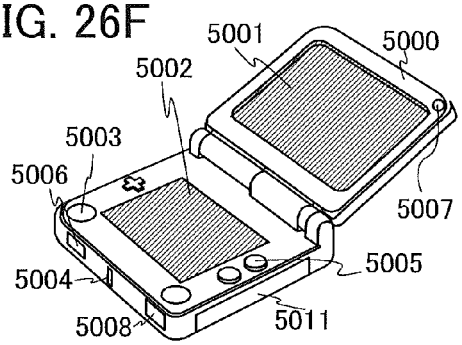
Figure 26G:
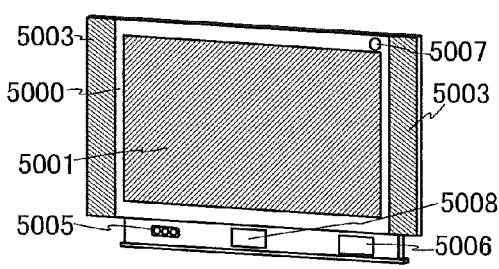
Figure 26H:
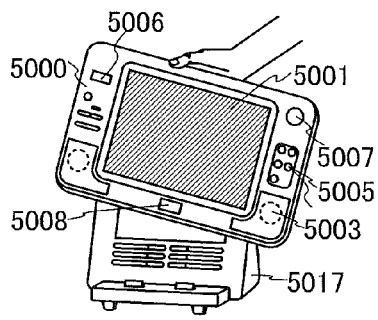
Figure 27A:
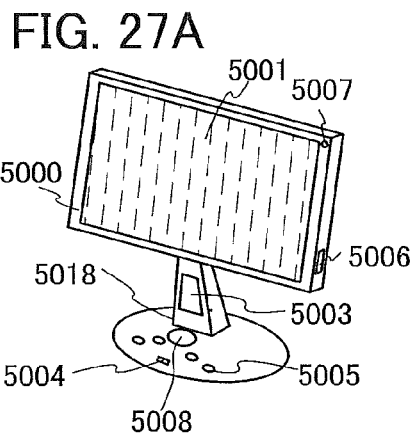
FIGS. 27A to 27H are each an external view of an electronic device according to one embodiment.
Figure 27B:
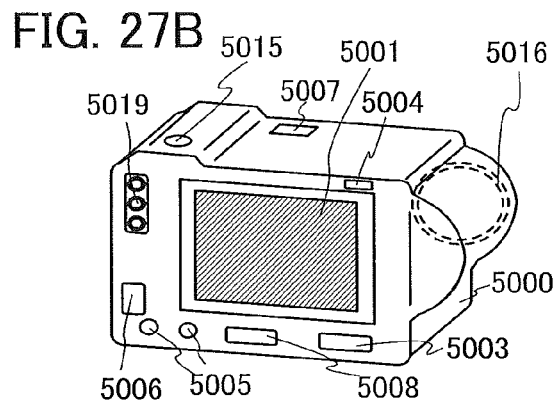
Figure 27C:
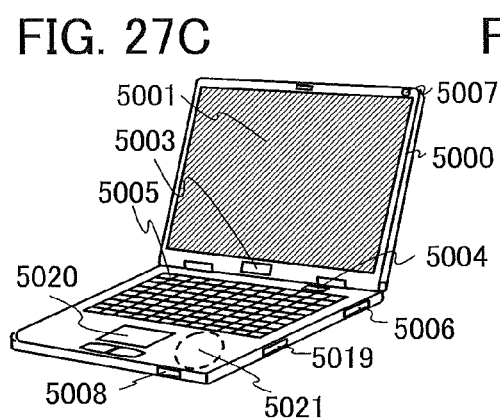
Figure 27D:
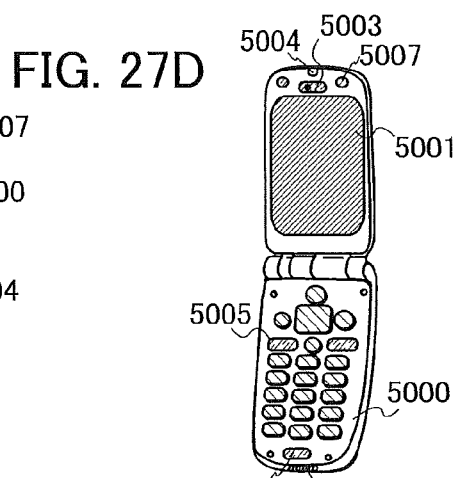

FIG. 26A illustrates a portable computer, which can include a switch 5009, an infrared port 5010, and the like in addition to the above objects. FIG. 26B illustrates a portable image reproducing device provided with a memory medium (e.g., a DVD reproducing device), which can include a second display portion 5002, a memory medium read portion 5011, and the like in addition to the above objects. FIG. 26C illustrates a goggle-type display, which can include the second display portion 5002, a support 5012, an earphone 5013, and the like in addition to the above objects. FIG. 26D illustrates a portable game machine, which can include the memory medium read portion 5011 and the like in addition to the above objects. FIG. 26E illustrates a digital camera with a television reception function, which can include an antenna 5014, a shutter button 5015, an image reception portion 5016, and the like in addition to the above objects. FIG. 26F illustrates a portable game machine, which can include the second display portion 5002, the memory medium read portion 5011, and the like in addition to the above objects. FIG. 26G illustrates a television receiver, which can include a tuner, an image processing portion, and the like in addition to the above objects. FIG. 26H illustrates a portable television receiver, which can include a charger 5017 capable of transmitting and receiving signals and the like in addition to the above objects. FIG. 27A illustrates a display, which can include a support base 5018 and the like in addition to the above objects. FIG. 27B illustrates a camera, which can include an external connection port 5019, a shutter button 5015, an image reception portion 5016, and the like in addition to the above objects. FIG. 27C illustrates a computer, which can include a pointing device 5020, the external connection port 5019, a reader/writer 5021, and the like in addition to the above objects. FIG. 27D illustrates a mobile phone, which can include a transmitter, a receiver, a tuner of 1 seg partial reception service for mobile phones and mobile terminals, and the like in addition to the above objects.

The electronic devices in FIGS. 26A to 26H and FIGS. 27A to 27D can have a variety of functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. In addition, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions that can be provided for the electronic devices in FIGS. 26A to 26H and FIGS. 27A to 27D are not limited thereto, and the electronic devices can have a variety of functions.

The electronic devices in this embodiment each include a display portion for displaying some kind of information.

Next, application examples of the display device are described.

Figure 27E:
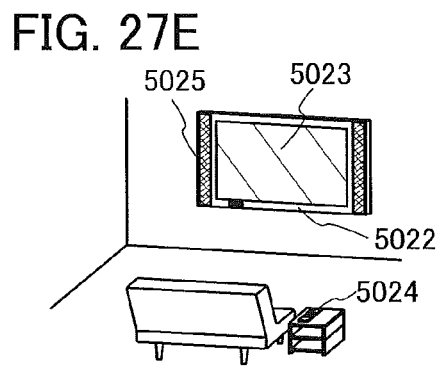

FIG. 27E illustrates an example in which a display device is incorporated in a building structure. FIG. 27E illustrates a housing 5022, a display portion 5023, a remote control 5024 that is an operation portion, a speaker 5025, and the like. The display device is incorporated in the building structure as a wall-hanging type and can be provided without requiring a large space.

Figure 27F:
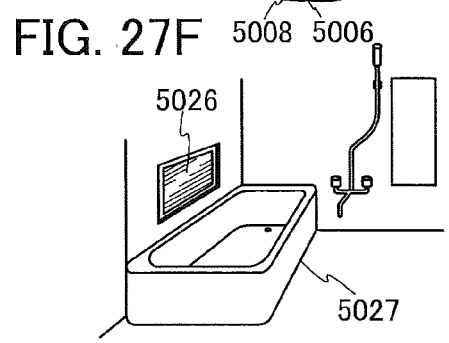

FIG. 27F illustrates another example in which a display device is incorporated in a building structure. A display module 5026 is incorporated in a prefabricated bath unit 5027, so that a bather can view the display module 5026.

Note that although this embodiment describes the wall and the prefabricated bath unit as examples of the building structures, this embodiment is not limited thereto. The display devices can be provided in a variety of building structures.

Next, examples in which display devices are incorporated in moving objects are described.

Figure 27G:
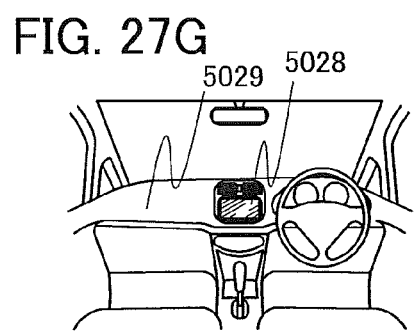

FIG. 27G illustrates an example in which a display device is incorporated in a car. A display module 5028 is incorporated in a car body 5029 of the car and can display information related to the operation of the car or information input from the inside or outside of the car on demand. Note that the display module 5028 may have a navigation function.

Figure 27H:
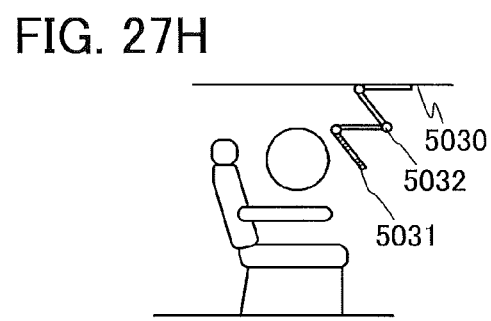

FIG. 27H illustrates an example in which a display device is incorporated in a passenger airplane. FIG. 27H illustrates a usage pattern when a display module 5031 is provided for a ceiling 5030 above a seat of the passenger airplane. The display module 5031 is incorporated in the ceiling 5030 through a hinge portion 5032, and a passenger can view the display module 5031 by stretching of the hinge portion 5032. The display module 5031 has a function of displaying information by the operation of the passenger.

Note that although bodies of a car and an airplane are illustrated as examples of moving objects in this embodiment, this embodiment is not limited thereto. The display devices can be provided for a variety of objects such as two-wheeled vehicles, four-wheeled vehicles (including cars, buses, and the like), trains (including monorails, railroads, and the like), and vessels.

Note that in this specification and the like, in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (e.g., transistors or capacitors) (M is an integer, where M<N) are taken out from a circuit diagram in which N circuit elements (e.g., transistors or capacitors) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N) are taken out from a flow chart in which N elements (N is an integer) are provided, and one embodiment of the invention can be constituted.

Note that in this specification and the like, in a diagram or a text described in one embodiment, in the case where at least one specific example is described, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted.

Note that in this specification and the like, content described in at least a diagram (or may be part of the diagram) is disclosed as one embodiment of the invention, and one embodiment of the invention can be constituted. Thus, when certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted.

This application is based on Japanese Patent Application serial No. 2013-222621 filed with Japan Patent Office on Oct. 25, 2013 and Japanese Patent Application serial No. 2014-038157 filed with Japan Patent Office on Feb. 28, 2014, the entire contents of which are hereby incorporated by reference.

What is claimed is:

1. A display device comprising:
a transistor including an oxide semiconductor film and a gate electrode;
a capacitor including a first electrode and a second electrode;
an inorganic insulating film over the transistor;
an organic insulating film over the inorganic insulating film; and
a light-emitting element over the organic insulating film,
wherein the inorganic insulating film is between the first electrode and the second electrode,
wherein the inorganic insulating film includes an oxide insulating film in contact with the oxide semiconductor film and a nitride insulating film in contact with the oxide insulating film,
wherein the first electrode is a metal oxide film,
wherein the second electrode is a first light-transmitting conductive film, and
wherein a pixel electrode of the light-emitting element is a second light-transmitting conductive film and is electrically connected to the transistor through an opening formed in the inorganic insulating film and the organic insulating film.

2. The display device according to claim 1, wherein the metal oxide film is in contact with the nitride insulating film and includes the same metal element as the oxide semiconductor film.

3. The display device according to claim 1, wherein the oxide semiconductor film is in the same layer as the metal oxide film.

4. The display device according to claim 1,
wherein the oxide semiconductor film and the metal oxide film include an In—Ga oxide, an In—Zn oxide, or an In-M-Zn oxide, and
wherein M is Al, Ga, Y, Zr, Sn, La, Ce, Nd, or Hf.

5. A display device comprising:
a transistor including an oxide semiconductor film and a gate electrode;
a capacitor including a first electrode, a second electrode, and a conductive film comprising the same material of the gate electrode;
an inorganic insulating film over the transistor;
an organic insulating film over the inorganic insulating film; and
a light-emitting element over the organic insulating film,
wherein the first electrode is a metal oxide film and is electrically connected to the transistor,
wherein the second electrode is a first light-transmitting conductive film,
wherein a pixel electrode of the light-emitting element is a second light-transmitting conductive film and is electrically connected to the transistor through an opening formed in the inorganic insulating film and the organic insulating film, and
wherein the first electrode and the conductive film overlap with each other.

6. The display device according to claim 5, wherein the inorganic insulating film includes an oxide insulating film in contact with the oxide semiconductor film and a nitride insulating film in contact with the oxide insulating film.

7. The display device according to claim 6, wherein the metal oxide film is in contact with the nitride insulating film and includes the same metal element as the oxide semiconductor film.

8. The display device according to claim 5, wherein the oxide semiconductor film is in the same layer as the metal oxide film.

9. The display device according to claim 5,
wherein the oxide semiconductor film and the metal oxide film include an In—Ga oxide, an In—Zn oxide, or an In-M-Zn oxide, and
wherein M is Al, Ga, Y, Zr, Sn, La, Ce, Nd, or Hf.

10. The display device according to claim 5,
wherein the first electrode, the second electrode, and the conductive film have light-transmitting properties.

* * * * *

UNITED STATES PATENT AND TRADEMARK OFFICE
CERTIFICATE OF CORRECTION

PATENT NO.        : 9,583,516 B2
APPLICATION NO.   : 14/521793
DATED             : February 28, 2017
INVENTOR(S)       : Shunpei Yamazaki and Hiroyuki Miyake It is certified that error appears in the above-identified patent and that said Letters Patent is hereby corrected as shown below:

In the Specification

Column 7, Line 7; Change "found" to --formed--.

Column 9, Line 52; Change "foaming" to --forming--.

Column 10, Line 5; Change "<Modification Example>1" to --<Modification Example 1>--.

Column 10, Line 15; Change "<Modification Example>2" to --<Modification Example 2>--.

Column 10, Line 25; Change "<Modification Example>3" to --<Modification Example 3>--.

Column 10, Line 54; Change "<Modification Example>4" to --<Modification Example 4>--.

Column 10, Line 64; Change "<Modification Example>5" to --<Modification Example 5>--.

Column 11, Line 9; Change "<Modification Example>6" to --<Modification Example 6>--.

Column 11, Line 16; Change "fouled" to --formed--.

Column 11, Line 32; Change "<Modification Example>7" to --<Modification Example 7>--.

Column 12, Line 1; Change "<Modification Example>8" to --<Modification Example 8>--.

Column 12, Line 25; Change "<Modification Example>9" to --<Modification Example 9>--.

Column 21, Line 10; Change "foiled" to --formed--.

Signed and Sealed this
Fourth Day of July, 2017

Joseph Matal
*Performing the Functions and Duties of the*
*Under Secretary of Commerce for Intellectual Property and*
*Director of the United States Patent and Trademark Office*

Column 28, Line 49; Change "foamed" to --formed--.

Column 29, Line 4; Change "four" to --form--.

Column 30, Line 40; Change "faulted" to --formed--.

Column 31, Line 49; Change "faulted" to --formed--.

Column 32, Line 55; Change "GaZnO layer," to --GaInO layer,--.

Column 35, Line 32; Change "ultra-thy" to --ultra-dry--.

Column 35, Line 40; Change "308*b*; and" to --308*b*, and--.

Column 36, Line 40; Change "faulted" to --formed--.

Column 37, Line 37; Change "conductive an" to --conductive film--.

Column 37, Line 44; Change "foamed" to --formed--.

Column 37, Line 60; Change "film. 393" to --film 393--.

Column 37, Line 65; Change "in. FIG. 5" to --in FIG. 5--.

Column 39, Line 22; Change "<Modification Example>1" to --<Modification Example 1>--.

Column 39, Line 50; Change "<Modification Example>2" to --<Modification Example 2>--.

Column 39, Line 62; Change "<Modification Example>3" to --<Modification Example 3>--.

Column 40, Line 13; Change "faulted" to --formed--.

Column 41, Line 47; Change "In:M:Zn=[atomic ratio]" to --In:M:Zn=$x_1$:$y_1$:$z_1$[atomic ratio]--.

Column 46, Line 60; Change "film Note" to --film. Note--.

Column 54, Line 32 to 34; Change "$E=½m_A v^2{}_A + ½m_A v^2{}_{Ga}$" to --$E=½m_A v_A^2 + ½m_A v_{Ga}^2$--.